(12) United States Patent
Cho et al.

(45) Date of Patent: Jul. 8, 2025
(10) Patent No.: US 12,356,812 B2

(54) DISPLAY DEVICE

(71) Applicant: Samsung Display Co., LTD., Yongin-si (KR)

(72) Inventors: Seung-Hwan Cho, Yongin-si (KR); Wonsuk Choi, Seoul (KR); Jiryun Park, Cheonan-si (KR); Seokje Seong, Seongnam-si (KR); Seungwoo Sung, Cheonan-si (KR); Hyeonwoo Shin, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 653 days.

(21) Appl. No.: 17/504,428

(22) Filed: Oct. 18, 2021

(65) Prior Publication Data
US 2022/0190094 A1    Jun. 16, 2022

(30) Foreign Application Priority Data

Dec. 15, 2020    (KR) .................. 10-2020-0175880

(51) Int. Cl.
*H10K 59/131*    (2023.01)
*H10D 30/67*    (2025.01)
(Continued)

(52) U.S. Cl.
CPC ....... *H10K 59/131* (2023.02); *H10D 30/6755* (2025.01); *H10D 86/441* (2025.01); *H10D 86/60* (2025.01)

(58) Field of Classification Search
CPC ... H10K 59/1213; H10K 59/131–1315; H10K 59/805–80524; H01L 29/7869;
(Continued)

(56) References Cited

U.S. PATENT DOCUMENTS 9,768,310 B2    9/2017    Ahn et al.
10,847,593 B2    11/2020    Kim et al.
(Continued)

FOREIGN PATENT DOCUMENTS

KR    20150101408 A    *    9/2015
KR    20150101410         9/2015
(Continued)

*Primary Examiner* — Bryan R Junge
*Assistant Examiner* — Mario Andres Autore, Jr.
(74) *Attorney, Agent, or Firm* — KILE PARK REED & HOUTTEMAN PLLC

(57) ABSTRACT

A display device includes a first active pattern disposed on a substrate and including a first material, a second active pattern including a second material that is different from the first material of the first active pattern, a voltage line disposed under the second active pattern, a horizontal transmission line disposed on the second active pattern, and extending in a first direction and a connection pattern spaced apart from the horizontal transmission line, disposed on a same layer as the horizontal transmission line, and making electrical contact with the second active pattern and the voltage line. The horizontal transmission line and the voltage line may be spaced apart from each other and the second active pattern and the voltage line may make contact with each other through the connection pattern. Accordingly, a contact resistance value may be reduced, and a distribution of contact resistance values may resultantly be reduced.

20 Claims, 52 Drawing Sheets

(51) Int. Cl.
  *H10D 86/40* (2025.01)
  *H10D 86/60* (2025.01)
(58) Field of Classification Search
  CPC ........ H01L 29/04; H01L 27/124–1248; H10D 86/441; H10D 86/60
  See application file for complete search history.

(56) References Cited

U.S. PATENT DOCUMENTS

| | | | | |
|---|---|---|---|---|
| 2002/0140646 | A1* | 10/2002 | Sato | H10K 50/841 345/82 |
| 2010/0072468 | A1* | 3/2010 | Yamazaki | H01L 27/124 257/E33.013 |
| 2011/0089417 | A1* | 4/2011 | Yamazaki | H01L 27/0688 257/43 |
| 2014/0299843 | A1* | 10/2014 | Kim | H10D 86/441 438/23 |
| 2015/0243722 | A1* | 8/2015 | Kwon | H01L 29/78675 257/40 |
| 2015/0372016 | A1* | 12/2015 | Cheng | H01L 27/124 257/72 |
| 2016/0247478 | A1* | 8/2016 | Ishige | G09G 3/3677 |
| 2018/0108720 | A1* | 4/2018 | Kim | H01L 27/124 |
| 2018/0197484 | A1* | 7/2018 | Moon | H10K 59/1315 |
| 2019/0172889 | A1* | 6/2019 | Kajiyama | H10K 50/805 |
| 2019/0305065 | A1* | 10/2019 | Kim | H10D 86/481 |
| 2021/0193688 | A1* | 6/2021 | Shin | H10K 59/80522 |
| 2021/0210513 | A1* | 7/2021 | Ikeda | G09G 3/20 |
| 2021/0391407 | A1* | 12/2021 | Yoon | G06F 1/1626 |
| 2022/0165832 | A1* | 5/2022 | Choi | H01L 27/0255 |

FOREIGN PATENT DOCUMENTS

| | | |
|---|---|---|
| KR | 20160062831 | 6/2016 |
| KR | 102126552 | 6/2020 |

* cited by examiner

FIG. 7
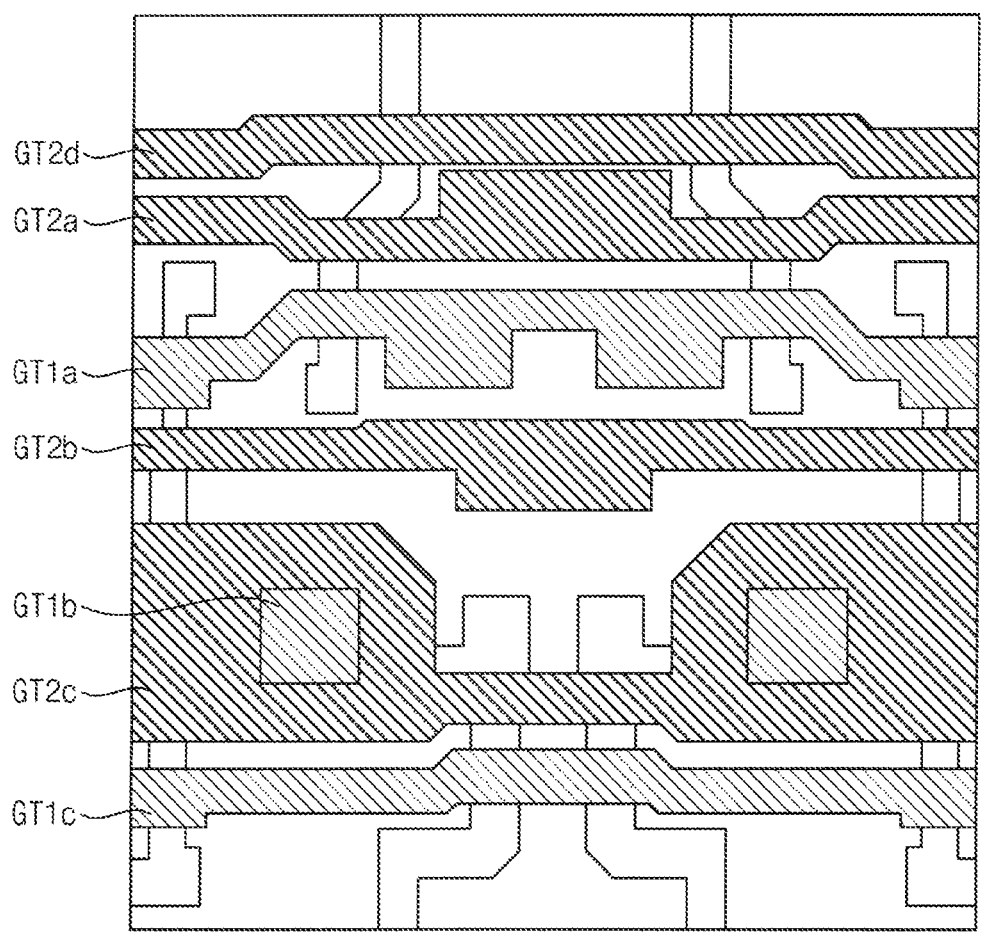
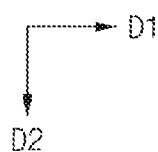

DISPLAY DEVICE

CROSS-REFERENCE TO RELATED APPLICATION

This application claims priority from and the benefit of Korean Patent Application No. 10-2020-0175880, filed on Dec. 15, 2020, which is hereby incorporated by reference for all purposes as if fully set forth herein.

BACKGROUND

Field

Embodiments of the invention relate generally to a display device.

Discussion of the Background

A display device may include a display panel and a panel driver (e.g., a data driver, a gate driver, etc.). A plurality of conductive patterns may be sequentially formed on the display panel, and the conductive patterns may make contact with each other through a contact. The panel driver may provide signals and/or voltages to the conductive patterns of the display panel. The conductive patterns may be patterned to have repetitive unit structures when viewed in a plan view, and the conductive patterns having one of the unit structures may be defined as a pixel structure. A contact resistance may occur between the conductive patterns making contact with each other through an inadvertent contact. As distribution of contact resistance values increases, distribution of electrical characteristics of pixel structures may resultingly increase. This may cause display quality of a display device to deteriorate.

The above information disclosed in this Background section is only for understanding of the background of the inventive concepts, and, therefore, it may contain information that does not constitute prior art.

SUMMARY

Devices constructed according to illustrative embodiments and implementations of the embodiments are capable of having a decreased contact resistance value distribution and thus a decreased electrical characteristic distribution.

Embodiments provide a display device with improved display quality by decreasing a distribution of contact resistance values of a plurality of contacts of the display device.

Additional features of the inventive concepts will be set forth in the description which follows, and in part will be apparent from the description, or may be learned by practice of the inventive concepts.

A display device according to an embodiment may include a first active pattern disposed on a substrate and including a first material, a second active pattern including a second material that is different from the first material of the first active pattern, a voltage line disposed under the second active pattern, a horizontal transmission line disposed on the second active pattern, and extending in a first direction, and a connection pattern spaced apart from the horizontal transmission line, disposed on a same layer as the horizontal transmission line, and making electrical contact with the second active pattern and the voltage line.

The connection pattern may make contact with the second active pattern through each of a first contact and a second contact, and make contact with the voltage line through a third contact, in which the third contact is disposed between the first contact and the second contact.

The voltage line may be configured to provide an initialization voltage to the second active pattern through the connection pattern.

The display device may further include a gate line configured to transmit a gate signal.

The connection pattern may be spaced apart from the horizontal transmission line and the gate line when viewed in a plan view, and disposed between the horizontal transmission line and the gate line.

The display device may further include a first conductive pattern disposed under the second active pattern, a second conductive pattern disposed under the second active pattern and disposed on the first conductive pattern and a third conductive pattern disposed on the second active pattern.

The third conductive pattern may include a gate electrode overlapping the second active pattern, the second conductive pattern may include the gate line, and the gate line may be electrically connected to the gate electrode, and extend in the first direction.

The second conductive pattern may include a gate electrode overlapping the second active pattern, the third conductive pattern may include the gate line, and the gate line may be electrically connected to the gate electrode, and extend in the first direction.

The first active pattern includes a silicon semiconductor, and the second active pattern may include an oxide semiconductor.

The display device may further include a data line disposed on the horizontal transmission line, extending in a second direction, and configured to provide a data voltage to the first active pattern and a vertical transmission line disposed on a same layer as the data line, extending in the second direction, and configured to provide a data voltage to the horizontal transmission line.

The second active pattern may further include a first extension part and a second extension part extending in the first direction, in which the first extension part and the second extension part overlap the voltage line and the horizontal transmission line, and the display device may further comprise a first conductive pattern disposed under the second active pattern, a second conductive pattern disposed under the second active pattern and disposed on the first conductive pattern and a third conductive pattern disposed on the second active pattern.

The third conductive pattern may include a gate electrode overlapping the second active pattern, the second conductive pattern may include a gate line configured to transmit a gate signal, and the gate line may be electrically connected to the gate electrode, and extend in the first direction.

The second conductive pattern may include a gate electrode overlapping the second active pattern, the third conductive pattern may include a gate line configured to transmit a gate signal, and the gate line may be electrically connected to the gate electrode, and extends in the first direction.

The first conductive pattern may include a gate electrode overlapping the second active pattern, the third conductive pattern may include a gate line configured to transmit a gate signal, and the gate line may be electrically connected to the gate electrode, and extend in the first direction.

A display device according to an embodiment may include a first active pattern disposed on a substrate and including a first material, a second active pattern including a second material that is different from the first material of the first active pattern, a voltage line disposed under the second active pattern, a connection pattern disposed on the second active pattern, and making electrical contact with the second active pattern and the voltage line; and a horizontal transmission line extending in a first direction, disposed on a same layer as the connection pattern, overlapping the second active pattern, and configured to transmit a data signal.

The connection pattern may make contact with the second active pattern through each of a first contact and a second contact, and make contact with the voltage line through a third contact, in which the third contact is disposed between the first contact and the second contact.

The voltage line may be configured to provide an initialization voltage to the second active pattern through the connection pattern.

The display device may further comprise a gate line configured to transmit a gate signal.

The connection pattern may be spaced apart from the horizontal transmission line and the gate line when viewed in a plan view, and the horizontal transmission line may be disposed between the connection pattern and the gate line.

The first active pattern may include a silicon semiconductor, and the second active pattern may include an oxide semiconductor.

According to embodiments, a display device may include a plurality of pixel structures, and each of the pixel structures may include a first active pattern, a second active pattern, a voltage line, a horizontal transmission line, and a connection pattern. The horizontal transmission line and the voltage line may be spaced apart from each other. An initialization voltage may be transmitted through the voltage line, the connection pattern, and the second active pattern. The second active pattern and the voltage line may make contact with each other through the connection pattern. Accordingly, a contact resistance value may be reduced, and a distribution of contact resistance values may resultantly be reduced.

The connection pattern may be located between the horizontal transmission line and a gate line configured to transmit a gate signal. Therefore, the connection pattern may prevent a coupling phenomenon that may occur between the horizontal transmission line and the gate line.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 5, 6, 7, 8, 9, 10, 11, 12, 13, 14, and 15 are layout diagrams for describing pixel structures included in a display device according to one embodiment.

DETAILED DESCRIPTION

Figure 1:
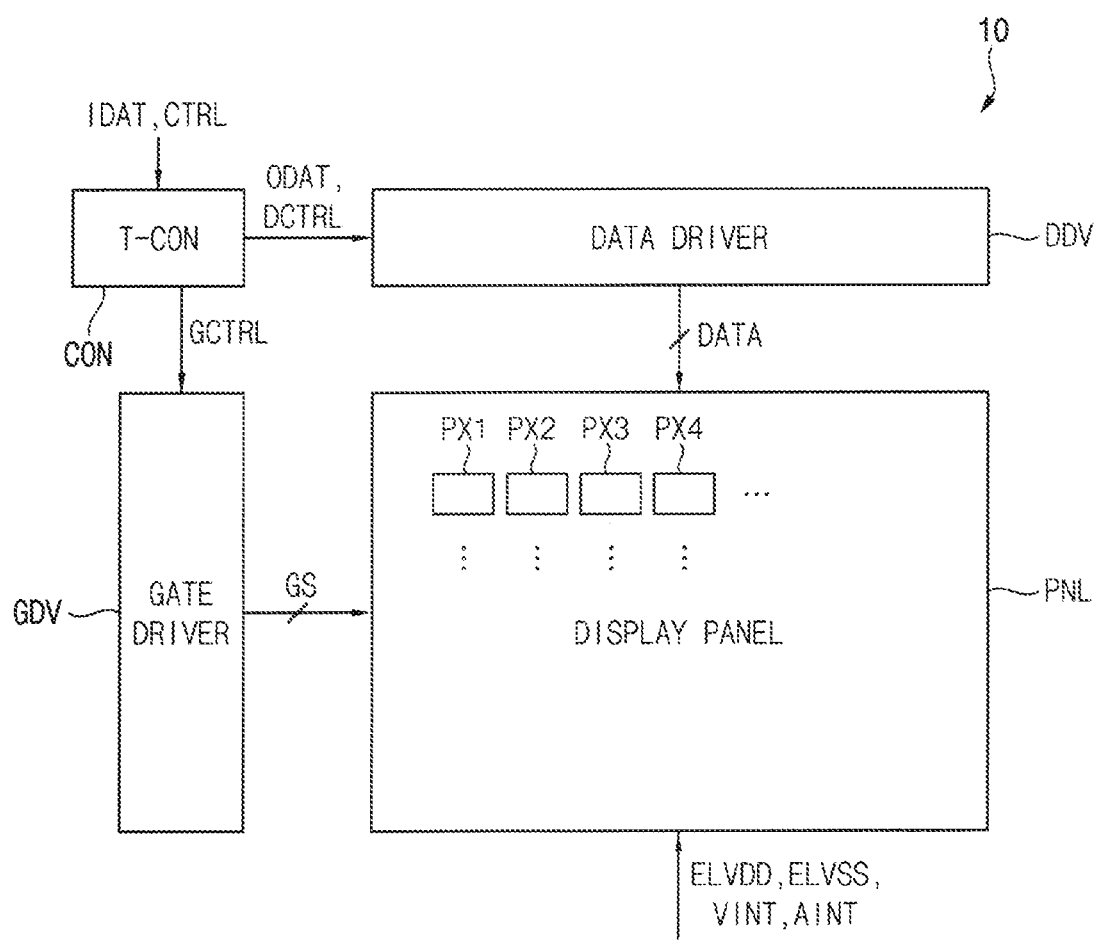
FIG. 1 is a block diagram showing a display device according to one embodiment constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
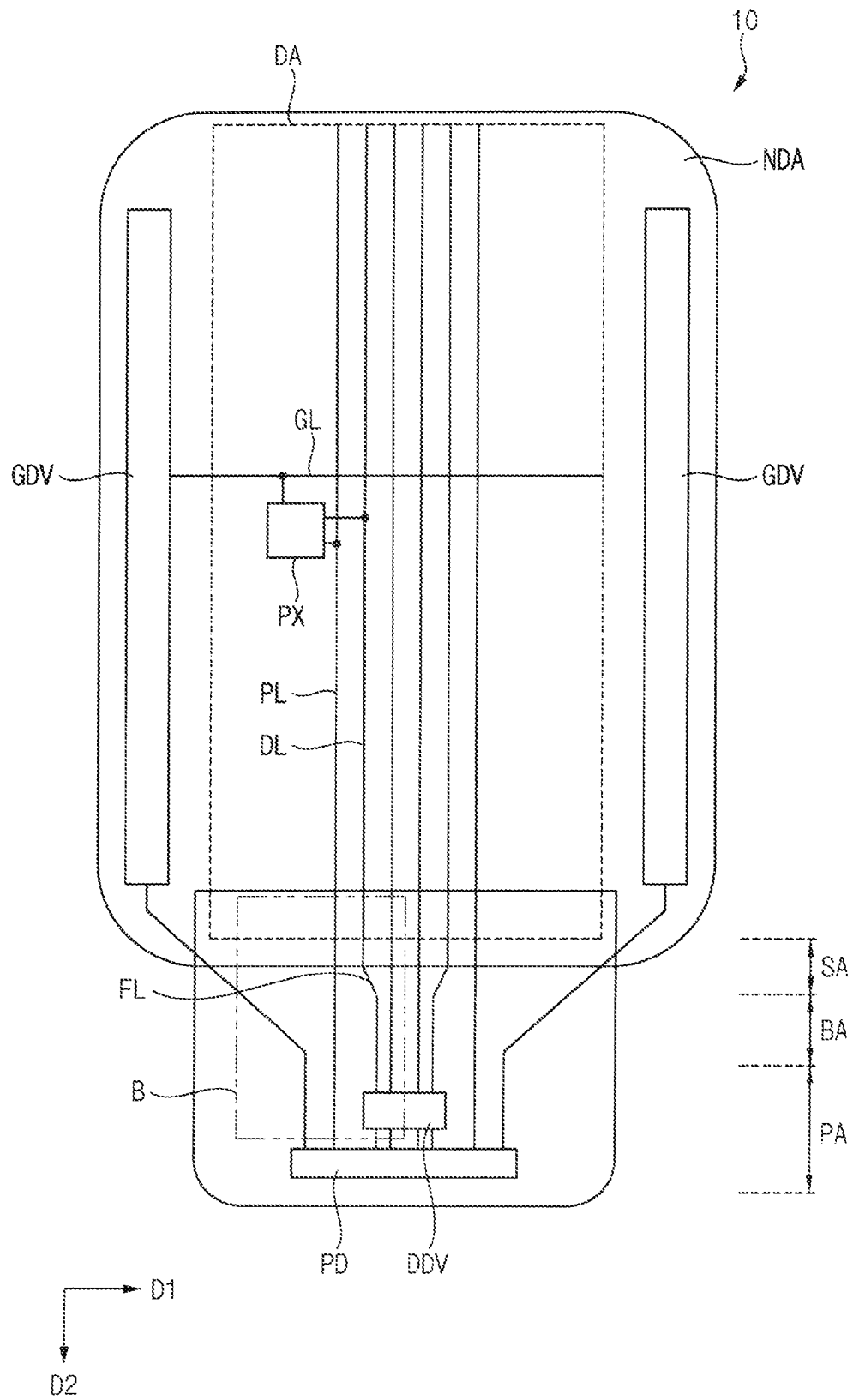
FIG. 2 is a plan view showing the display device of FIG. 1.
Figure 3:
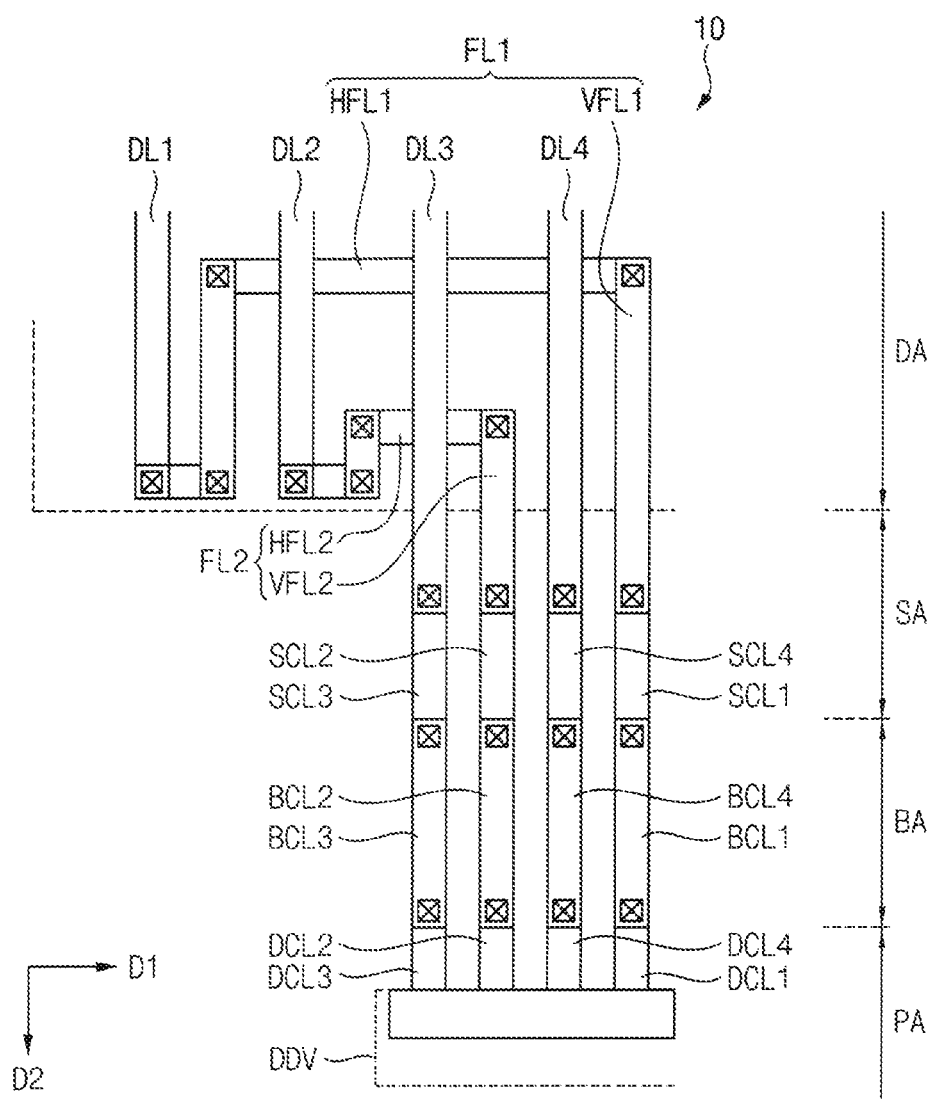
FIG. 3 is an enlarged view for describing data transmission lines included in the display device of FIG. 2.
Figure 4:
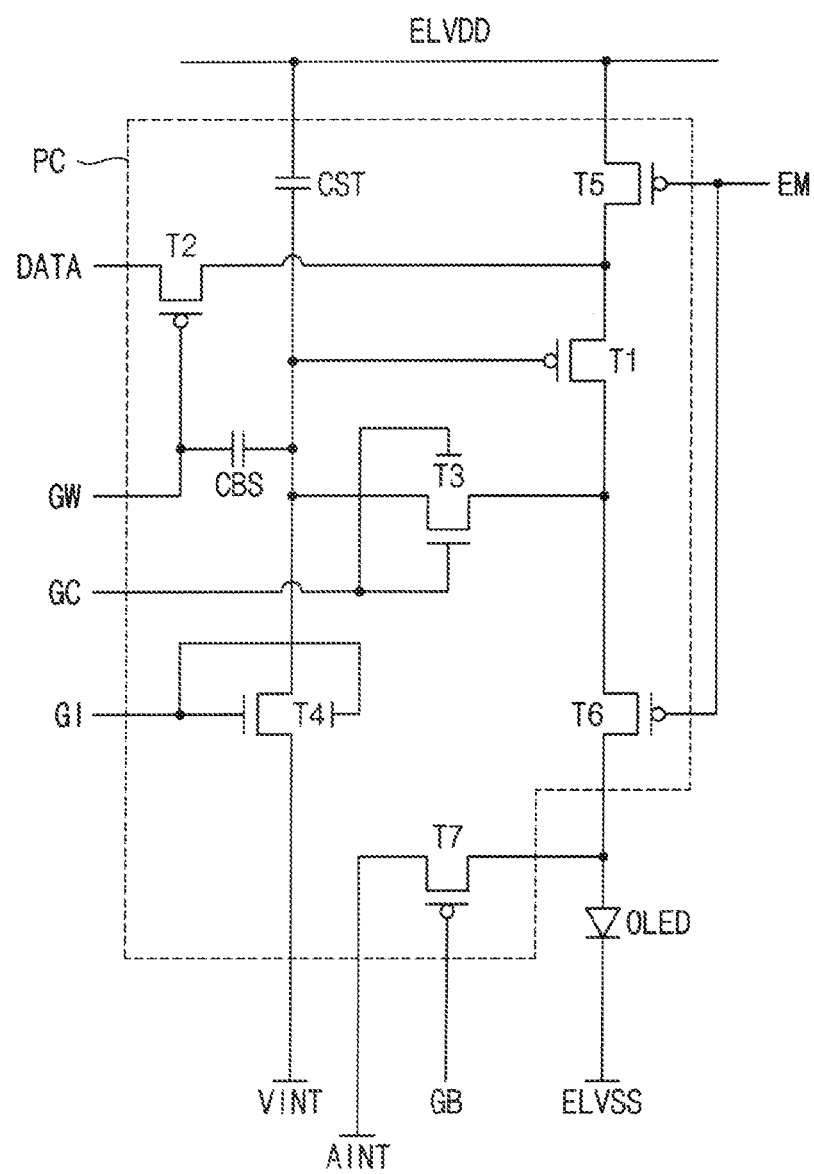
FIG. 4 is a circuit diagram showing one example of a pixel circuit and an organic light emitting diode included in the display device of FIG. 1.

FIG. 1 is a block diagram showing a display device according to one embodiment constructed according to principles of the invention. FIG. 2 is a plan view showing the display device of FIG. 1. FIG. 3 is an enlarged view for describing data transmission lines included in the display device of FIG. 2. FIG. 4 is a circuit diagram showing one example of a pixel circuit and an organic light emitting diode included in the display device of FIG. 1.

Referring to FIG. 1, according to one embodiment, a display device 10 may include a display panel PNL, a data driver DDV, a gate driver GDV, and a controller CON.

The display panel PNL may include a plurality of pixel structures (e.g., a pixel structure PX of FIG. 2). For example, the display panel PNL may include a first pixel structure PX1, a second pixel structure PX2, a third pixel structure PX3, and a fourth pixel structure PX4. Each of the first to fourth pixel structures PX1, PX2, PX3, and PX4 may receive a data voltage DATA, a gate signal GS, a high power supply voltage ELVDD, a low power supply voltage ELVSS, an initialization voltage VINT, and an anode initialization voltage AINT.

The data driver DDV may generate the data voltage DATA based on output image data ODAT and a data control signal DCTRL. For example, the data driver DDV may generate the data voltage DATA corresponding to the output image data ODAT, and may output the data voltage DATA in response to the data control signal DCTRL. The data control signal DCTRL may include an output data enable signal, a horizontal start signal, and a load signal. In an embodiment, the data driver DDV may be at least one integrated circuit (IC), and may be electrically connected to the display panel PNL. In another embodiment, the data driver DDV may be mounted on the display panel PNL, or may be integrated into a peripheral portion of the display panel PNL.

The gate driver GDV may generate the gate signal GS based on a gate control signal GCTRL. For example, the gate signal GS may include a gate-on voltage for turning on a transistor and a gate-off voltage for turning off the transistor. The gate control signal GCTRL may include a vertical start signal, a clock signal, and the like. In an embodiment, the gate driver GDV may be mounted on the display panel PNL. In another embodiment, the gate driver GDV may be electrically connected to the display panel PNL in the form of a chip-on-film (COF).

The controller CON (e.g., a timing controller T-CON) may receive input image data IDAT and a control signal CTRL from an external host processor (e.g., a GPU). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

Referring to FIGS. 2 and 3, the display device 10 may include: a display area DA; a non-display area NDA surrounding the display area DA; a bending area BA that may be bent; a peripheral area SA between the display area DA and the bending area BA; and a pad area PA.

For example, the pixel structure PX may be disposed in the display area DA, and a driver configured to drive the pixel structure PX may be disposed in the non-display area NDA. For example, a pad part PD and the data driver DDV may be disposed in the pad area PA, and the bending area BA may be bent based on a virtual bending axis.

The pixel structure PX and a data line DL, a gate line GL, a high power supply voltage line PL, and data transmission lines FL1 and FL2, which are connected to the pixel structure PX, may be disposed in the display area DA.

The data line DL may be electrically connected to the data driver DDV, and may extend in a second direction D2. The gate line GL may be connected to the gate driver GDV, and may extend in a first direction D1 intersecting the second direction D2. The high power supply voltage line PL may be connected to the pad part PD, and may extend in the second direction D2.

The data transmission lines FL1 and FL2 may be electrically connected to the data driver DDV and the data line DL. The data transmission lines FL1 and FL2 may connect the data driver DDV to the data line DL.

In an embodiment, as shown in FIG. 3, first to fourth data lines DL1, DL2, DL3, and DL4, a first data transmission line FL1, and a second data transmission line FL2 may be disposed in the display device 10. For example, the first and second data transmission lines FL1 and FL2 may be fan-out lines configured to electrically connect the data driver DDV to the data line DL.

In an embodiment, the first data transmission line FL1 may include a first vertical transmission line VFL1 and a first data transmission horizontal line HFL1, and the second data transmission line FL2 may include a second vertical transmission line VFL2 and a second data transmission horizontal line HFL2. For example, the first and second vertical transmission lines VFL1 and VFL2 may extend in the second direction D2, and the first and second data transmission horizontal lines HFL1 and HFL2 may extend in the first direction D1.

The first data transmission line FL1 may electrically connect the data driver DDV to the first data line DL1. For example, a first data voltage may be provided to the first pixel structure PX1 through the first data transmission line FL1 and the first data line DL1.

In detail, the first vertical transmission line VFL1 may be connected to a first connection line SCL1, the first connection line SCL1 may be connected to a first bending connection line BCL1, and the first bending connection line BCL1 may be connected to a first data connection line DCL1.

Figure 14:
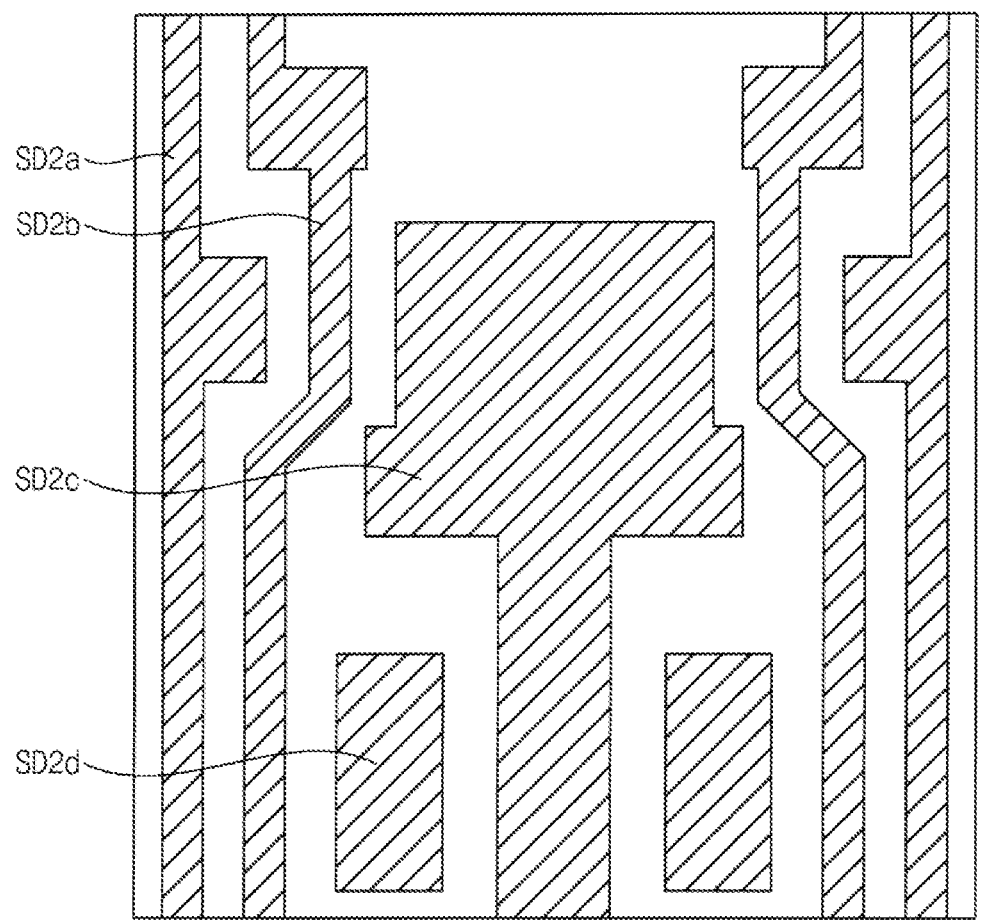
Figure 15:
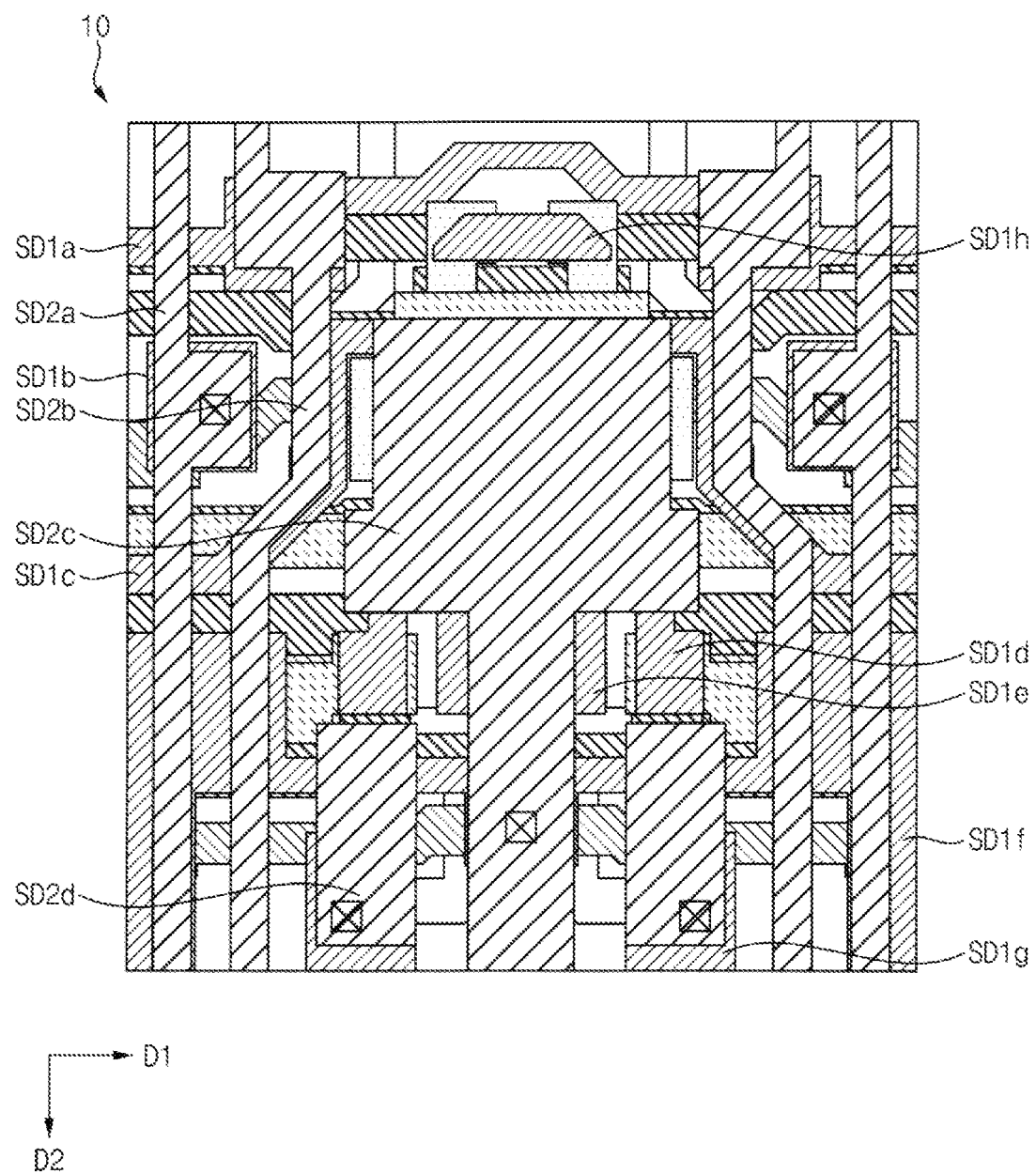

For example, the first vertical transmission line VFL1 may extend from the peripheral area SA to the display area DA, and may be formed in a first layer (e.g., a layer in which a vertical transmission line SD2b of FIG. 14 is formed). The first connection line SCL1 may be disposed in the peripheral area SA, and may be formed in a second layer disposed under the first layer. The first bending connection line BCL1 may be disposed in the bending area BA, and may be formed in the first layer. The first data connection line DCL1 may be disposed in the pad area PA, and may receive the first data voltage from the data driver DDV.

The second data transmission line FL2 may electrically connect the data driver DDV to the second data line DL2. For example, a second data voltage may be provided to the second pixel structure PX2 through the second data transmission line FL2 and the second data line DL2.

In detail, the second vertical transmission line VFL2 may be connected to a second connection line SCL2, the second connection line SCL2 may be connected to a second bending connection line BCL2, and the second bending connection line BCL2 may be connected to a second data connection line DCL2. However, since a structure of the second vertical transmission line VFL2, the second connection line SCL2, the second bending connection line BCL2, and the second data connection line DCL2 is substantially the same as the structure of the first vertical transmission line VFL1, the first connection line SCL1, the first bending connection line BCL1, and the first data connection line DCL1, detailed descriptions thereof will be omitted for sake of brevity.

The third data line DL3 may be connected to the data driver DDV. For example, a third data voltage may be provided to the third pixel structure PX3 through the third data line DL3.

In detail, the third data line DL3 may be connected to a third connection line SCL3, the third connection line SCL3 may be connected to a third bending connection line BCL3, and the third bending connection line BCL3 may be connected to a third data connection line DCL3.

For example, the third data line DL3 may extend from the peripheral area SA to the display area DA, and may be formed in the first layer. The third connection line SCL3 may be disposed in the peripheral area SA, and may be formed in a third layer disposed under the first layer. The third bending connection line BCL3 may be disposed in the bending area BA, and may be formed in the first layer. The third data connection line DCL3 may be disposed in the pad area PA, and may receive the third data voltage from the data driver DDV.

The fourth data line DL4 may be connected to the data driver DDV. For example, a fourth data voltage may be provided to the fourth pixel structure PX4 through the fourth data line DL4.

In detail, the fourth data line DL4 may be connected to a fourth connection line SCL4, the fourth connection line SCL4 may be connected to a fourth bending connection line BCL4, and the fourth bending connection line BCL4 may be connected to a fourth data connection line DCL4. However, since a structure of the fourth data line DL4, the fourth connection line SCL4, the fourth bending connection line BCL4, and the fourth data connection line DCL4 is substantially the same as the structure of the third data line DL3, the third connection line SCL3, the third bending connection line BCL3, and the third data connection line DCL3, detailed descriptions thereof will be omitted for sake of brevity.

FIG. 4 is a circuit diagram showing one example of a pixel circuit and an organic light emitting diode included in the display device of FIG. 1.

Referring to FIGS. 1 and 4, the first pixel structure PX1 may emit light through a pixel circuit PC and an organic light emitting diode OLED. In addition, the second pixel structure PX2 may emit light through a pixel circuit having substantially the same circuit structure as the pixel circuit PC, and an organic light emitting diode having substantially the same structure as the organic light emitting diode OLED. Hereinafter, a connection structure between the pixel circuit PC and the organic light emitting diode OLED of the first pixel structure PX1 will be described.

The pixel circuit PC may include a first transistor T1, a second transistor T2, a third transistor T3, a fourth transistor T4, a fifth transistor T5, a sixth transistor T6, a seventh transistor T7, a storage capacitor CST, and a boosting capacitor CBS. The pixel circuit PC may be electrically connected to the organic light emitting diode OLED to provide a driving current to the organic light emitting diode OLED.

The organic light emitting diode OLED may include a first terminal (e.g., an anode terminal) and a second terminal (e.g., a cathode terminal), in which the first terminal of the organic light emitting diode OLED may be connected to the first transistor T1 via the sixth transistor T6 to receive the driving current, and the second terminal of the organic light emitting diode OLED may receive the low power supply voltage ELVSS. The organic light emitting diode OLED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the high power supply voltage ELVDD.

The boosting capacitor CBS may include a first terminal and a second terminal. The first terminal of the boosting capacitor CBS may be connected to the first terminal of the storage capacitor CST, and the second terminal of the boosting capacitor CBS may receive a first gate signal GW. The boosting capacitor CBS may compensate for a voltage drop of a gate terminal of the first transistor T1 by increasing a voltage of the gate terminal of the first transistor T1 at a time when provision of the first gate signal GW is stopped.

The first transistor T1 may include the gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive the data voltage DATA. The second terminal of the first transistor T1 may provide the driving current to the organic light emitting diode OLED. The first transistor T1 may generate the driving current based on a voltage difference between the gate terminal and the first terminal thereof. For example, the first transistor T1 may be referred to as a driving transistor. In an embodiment, the first transistor T1 may further include a back-gate terminal. For example, the back-gate terminal may be synchronized with the gate terminal or the first terminal of the first transistor T1, or may be electrically floated. The back-gate terminal may include a metal, an alloy, conductive metal oxide, a transparent conductive material, a doped silicon semiconductor, and the like. The back-gate terminal may overlap the gate terminal, and may be implemented under the gate terminal.

The second transistor T2 may include a gate terminal, a first terminal (e.g., a source terminal), and a second terminal (e.g., a drain terminal). The gate terminal of the second transistor T2 may receive the first gate signal GW. The first terminal of the second transistor T2 may receive the data voltage DATA. During a period in which the second transistor T2 is turned on, the second terminal of the second transistor T2 may provide the data voltage DATA to the first terminal of the first transistor T1.

The second transistor T2 may be turned on or off in response to the first gate signal GW. For example, when the second transistor T2 is a PMOS transistor, the second transistor T2 may be turned off when the first gate signal GW has a positive voltage level, and the second transistor T2 may be turned on when the first gate signal GW has a negative voltage level. For example, the second transistor T2 may be referred to as a switching transistor.

The third transistor T3 may include a gate terminal, a back-gate terminal, a first terminal (e.g., a source terminal), and a second terminal (e.g., a drain terminal). The gate terminal and the back-gate terminal of the third transistor T3 may receive a second gate signal GC. Since the third transistor T3 has a dual-gate structure, reliability of the third transistor T3 may be improved. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is an NMOS transistor, the third transistor T3 may be turned on when the second gate signal GC has a positive voltage level, and the third transistor T3 may be turned off when the second gate signal GC has a negative voltage level.

During a period in which the third transistor T3 is turned on in response to the second gate signal GC, the third transistor T3 may diode-connect the first transistor T1. Since the first transistor T1 is diode-connected, a voltage difference corresponding to a threshold voltage of the first transistor T1 may occur between the gate terminal of the first transistor T1 and the first terminal of the first transistor T1. Accordingly, the data voltage DATA, which is compensated for by an amount corresponding to the voltage difference, may be provided to the gate terminal of the first transistor T1. Therefore, the third transistor T3 may compensate for the threshold voltage of the first transistor T1. For example, the third transistor T3 may be referred to as a compensation transistor.

The fourth transistor T4 may include a gate terminal, a back-gate terminal, a first terminal (e.g., a source terminal), and a second terminal (e.g., a drain terminal). The gate terminal and the back-gate terminal of the fourth transistor T4 may receive a third gate signal GI. Since the fourth transistor T4 has a dual-gate structure, reliability of the fourth transistor T4 may be improved. The first terminal of the fourth transistor T4 may receive the initialization voltage VINT. The second terminal of the fourth transistor T4 may be connected to the gate terminal of the first transistor T1.

The fourth transistor T4 may be turned on or off in response to the third gate signal GI. For example, when the fourth transistor T4 is an NMOS transistor, the fourth transistor T4 may be turned on when the third gate signal GI has a positive voltage level, and the fourth transistor T4 may be turned off when the third gate signal GI has a negative voltage level.

During a period in which the fourth transistor T4 is turned on in response to the third gate signal GI, the initialization voltage VINT may be provided to the gate terminal of the first transistor T1. Accordingly, the fourth transistor T4 may initialize the gate terminal of the first transistor T1 to the initialization voltage VINT. For example, the fourth transistor T4 may be referred to as an initialization transistor.

The fifth transistor T5 may include a gate terminal, a first terminal (e.g., a source terminal), and a second terminal (e.g., a drain terminal). The gate terminal of the fifth transistor T5 may receive an emission control signal EM. The first terminal of the fifth transistor T5 may receive the high power supply voltage ELVDD. The second terminal of the fifth transistor T5 may be connected to the first terminal of the first transistor T1. When the fifth transistor T5 is turned on in response to the emission control signal EM, the fifth transistor T5 may provide the high power supply voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the organic light emitting diode OLED. When the sixth transistor T6 is turned on in response to the emission control signal EM, the sixth transistor T6 may provide the driving current generated by the first transistor T1 to the organic light emitting diode OLED.

The seventh transistor T7 may include a gate terminal, a first terminal (e.g., a source terminal), and a second terminal (e.g., a drain terminal). The gate terminal of the seventh transistor T7 may receive a fourth gate signal GB. The first terminal of the seventh transistor T7 may receive the anode initialization voltage AINT. The second terminal of the seventh transistor T7 may be connected to the first terminal of the organic light emitting diode OLED. When the seventh transistor T7 is turned on in response to the fourth gate signal GB, the seventh transistor T7 may provide the anode initialization voltage AINT to the organic light emitting diode OLED. Accordingly, the seventh transistor T7 may initialize the first terminal of the organic light emitting diode OLED to the anode initialization voltage AINT. For example, the seventh transistor T7 may be referred to as an anode initialization transistor.

Since the connection structure between the pixel circuit PC and the organic light emitting diode OLED shown in FIG. 4 has been provided for illustrative purposes, the connection structure may be variously changed.

FIGS. 5 to 15 are layout diagrams for describing pixel structures included in a display device according to one embodiment.

Figure 5:
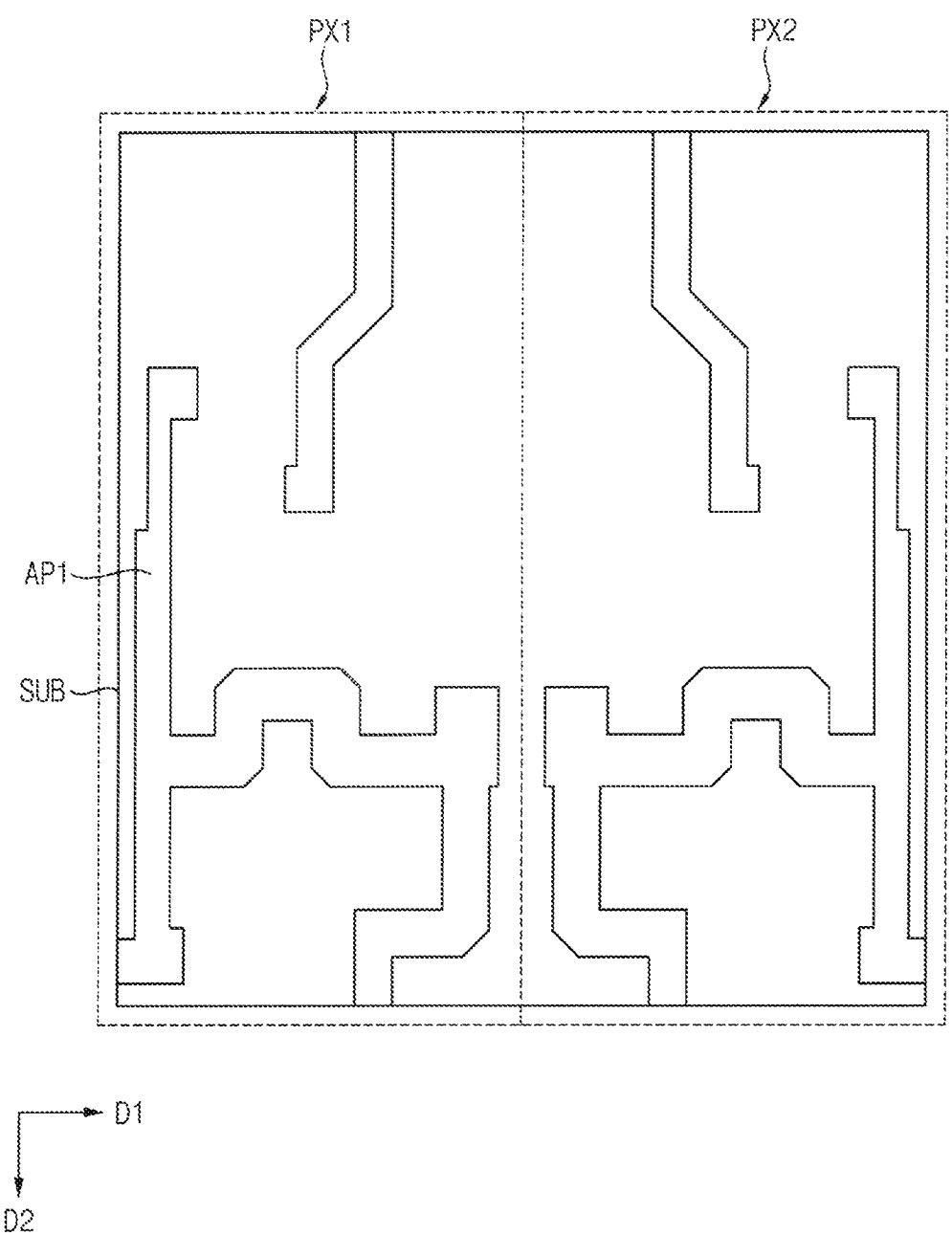

Referring to FIGS. 1, 4, and 5, the display device 10 may include the first pixel structure PX1 and the second pixel structure PX2, which are adjacent to each other. For example, the second pixel structure PX2 may have a structure that is symmetrical to a structure of the first pixel structure PX1 based on a virtual symmetry line.

A substrate SUB may include glass, quartz, plastic, and the like. In an embodiment, the substrate SUB may include plastic, so that the display device 10 may have a flexible characteristic. In this case, the substrate SUB may have a structure in which at least one organic film layer and at least one barrier layer are alternately stacked. For example, the organic film layer may be formed by using an organic material such as polyimide, and the barrier layer may be formed by using an inorganic material.

A barrier layer (e.g., a barrier layer BRR of FIG. 17) may be disposed on the substrate SUB. The barrier layer may prevent metal atoms or impurities from diffusing from the substrate SUB to a first active pattern AP1. The barrier layer may include silicon oxide, silicon nitride, and silicon oxynitride, and may have a single-layer structure or a multilayer structure.

A buffer layer (e.g., a buffer layer BFR of FIG. 17) may be disposed on the substrate SUB. The buffer layer may prevent metal atoms or impurities from diffusing from the substrate SUB to the first active pattern AP1. In addition, the buffer layer may control a heat supply rate during a crystallization process for forming the first active pattern AP1, so that the first active pattern AP1 may be uniformly formed. The buffer layer may include silicon oxide, silicon nitride, and silicon oxynitride, and may have a single-layer structure or a multilayer structure.

The first active pattern AP1 may be disposed on the buffer layer. In an embodiment, the first active pattern AP1 may include a silicon semiconductor. For example, the silicon semiconductor may include amorphous silicon, polycrystalline silicon, and the like. For example, the first active pattern AP1 may include the polycrystalline silicon formed by crystallizing the amorphous silicon.

In an embodiment, ions may be injected into the first active pattern AP1. For example, when the first, second, fifth, sixth, and seventh transistors T1, T2, T5, T6, and T7 are PMOS transistors, ions such as boron ions may be injected into the first active pattern AP1.

A first gate insulating layer may be disposed on the substrate SUB to cover the first active pattern AP1. The first gate insulating layer may include an insulating material. For example, the first gate insulating layer may include silicon oxide, silicon nitride, silicon oxynitride, aluminum oxide, and the like.

Figure 6:
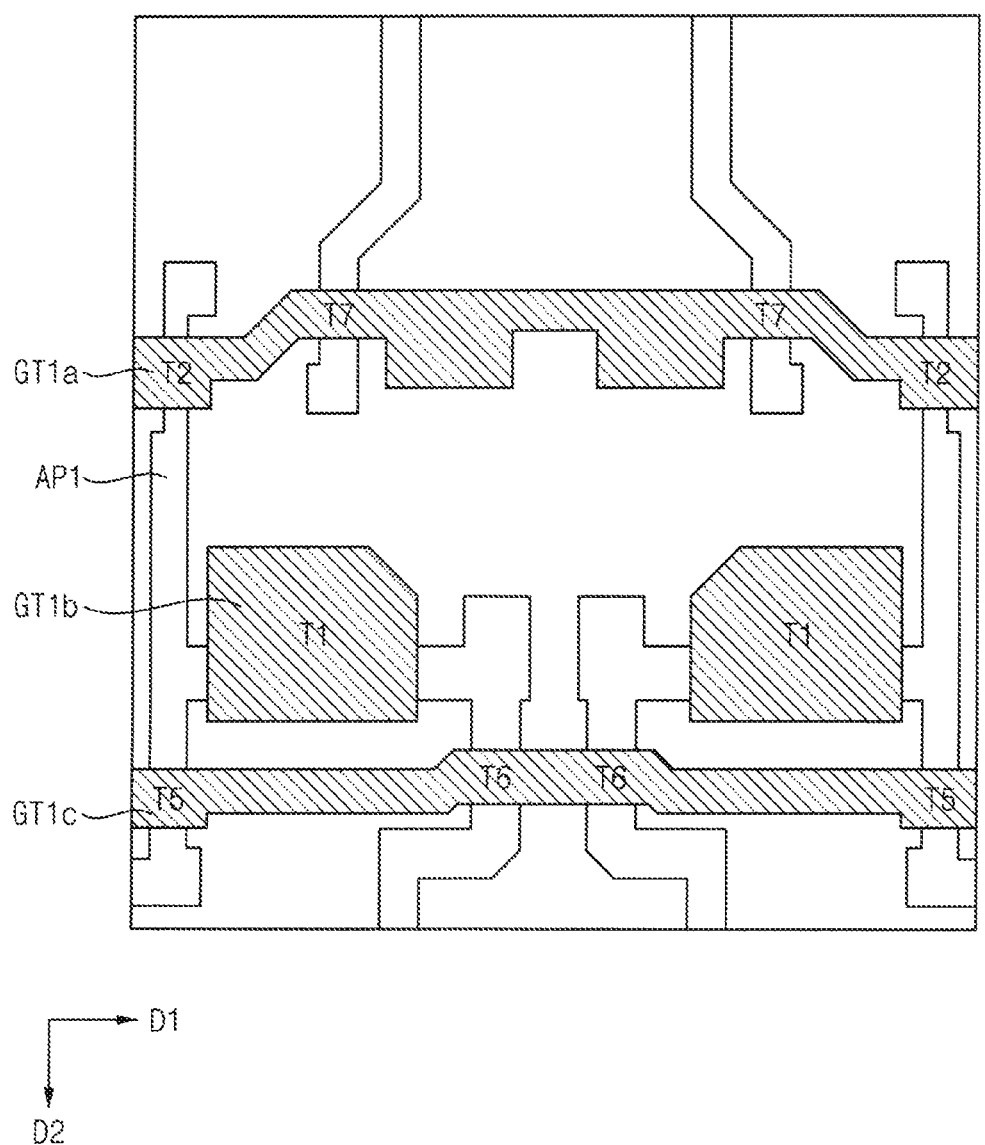

Referring to FIGS. 1, 4, and 6, a first conductive pattern may be disposed on the first gate insulating layer. The first conductive pattern may include a first gate line GT1*a*, a first gate electrode GT1*b*, and a second gate line GT1*c*.

The first gate line GT1*a* may extend in the first direction D1. The first gate line GT1*a* may form the second transistor T2 together with the first active pattern AP1. For example, the first gate signal GW may be provided to the first gate line GT1*a*. In addition, the first gate line GT1*a* may form the seventh transistor T7 together with the first active pattern AP1. For example, the fourth gate signal GB may be provided to the first gate line GT1*a*. The first gate signal GW and the fourth gate signal GB may have substantially the same waveform with a time difference therebetween.

The first gate electrode GT1*b* may have an island shape. The first gate electrode GT1*b* may form the first transistor T1 together with the first active pattern AP1.

The second gate line GT1*c* may extend in the first direction D1. The second gate line GT1*c* may form the fifth and sixth transistors T5 and T6 together with the first active pattern AP1. For example, the emission control signal EM may be provided to the second gate line GT1*c*. The second gate line GT1*c* may be referred to as an emission control line.

For example, the first conductive pattern may include a metal, an alloy, conductive metal oxide, a transparent conductive material, and the like. For example, the first conductive pattern may include a metal such as molybdenum (Mo), aluminum (Al), copper (Cu), and titanium (Ti). A second gate insulating layer may be disposed on the first gate insulating layer to cover the first conductive pattern. The second gate insulating layer may include an insulating material. In detail, the second gate insulating layer may include silicon oxide, silicon nitride, and silicon oxynitride, and may have a single-layer structure or a multilayer structure.

Referring to FIGS. 1, 4, and 7, a second conductive pattern may be disposed on the second gate insulating layer. The second conductive pattern may include a third gate line GT2*a*, a fourth gate line GT2*b*, a storage capacitor electrode GT2*c*, and a voltage line GT2*d*.

The third gate line GT2*a* may extend in the first direction D1. For example, the third gate line GT2*a* may be spaced apart from the first gate line GT1*a* when viewed in a plan view. The third gate signal GI may be provided to the third gate line GT2*a*.

The fourth gate line GT2*b* may extend in the first direction D1. For example, the fourth gate line GT2*b* may be spaced apart from the first gate line GT1*a* and the third gate line GT2*a* when viewed in a plan view. The second gate signal GC may be provided to the fourth gate line GT2*b*.

The storage capacitor electrode GT2*c* may overlap the first gate electrode GT1*b*, and may extend in the first direction D1. For example, the storage capacitor electrode GT2*c* may form the storage capacitor CST together with the first gate electrode GT1*b*. The high power supply voltage ELVDD may be provided to the storage capacitor electrode GT2*c*. In addition, the storage capacitor electrode GT2*c* may have a hole formed through the storage capacitor electrode GT2*c*, and the first gate electrode GT1*b* may be exposed through the hole.

The voltage line GT2*d* may extend in the first direction D1. In an embodiment, the initialization voltage VINT may be provided to the voltage line GT2*d*. The voltage line GT2*d* may provide the initialization voltage VINT to a connection pattern SD1*h* that will be described below.

For example, the second conductive pattern may include a metal, an alloy, conductive metal oxide, a transparent conductive material, and the like. In detail, the second conductive pattern may include a metal such as molybdenum (Mo), aluminum (Al), copper (Cu), and titanium (Ti).

A first interlayer insulating layer may be disposed on the second gate insulating layer to cover the second conductive pattern. The first interlayer insulating layer may include an insulating material. For example, the first interlayer insulating layer may include silicon oxide, silicon nitride, silicon oxynitride, aluminum oxide, and the like.

Referring to FIGS. 1, 4, 8, and 9, a second active pattern AP2 may be disposed on the first interlayer insulating layer. The second active pattern AP2 may include an oxide semiconductor. The first active pattern AP1 and the second active pattern AP2 may include mutually different materials.

For example, the second active pattern AP2 may include a binary compound (ABx), a ternary compound (ABxCy), a quaternary compound (ABxCyDz), and the like containing indium (In), zinc (Zn), gallium (Ga), tin (Sn), titanium (Ti), aluminum (Al), hafnium (Hf), zirconium (Zr), magnesium (Mg), and the like.

In an embodiment, the second active pattern AP2 may include indium-gallium-zinc oxide.

In an embodiment, the second active pattern AP2 may be spaced apart from the first active pattern AP1 when viewed in a plan view so as not to overlap the first active pattern AP1.

In an embodiment, the second active pattern AP2 may be disposed on a layer that is different from a layer of the first active pattern AP1, and may not overlap the first active pattern AP1. In other words, the second active pattern AP2 may be formed separately from the first active pattern AP1.

In an embodiment, the second active pattern AP2 may have a symmetrical shape based on a virtual line extending in the second direction D2 perpendicular to the first direction D1. The second active pattern AP2 may include a portion disposed in the first pixel structure PX1 and a portion disposed in the second pixel structure PX2.

In an embodiment, the second active pattern AP2 may overlap the first gate line GT1*a*, the third gate line GT2*a*, the fourth gate line GT2*b*, and the voltage line GT2*d*.

A third gate insulating layer may be disposed on the first interlayer insulating layer to cover the second active pattern AP2. The third gate insulating layer may include an insulating material. The third gate insulating layer may include silicon oxide, silicon nitride, and silicon oxynitride, and may have a single-layer structure or a multilayer structure.

Referring to FIGS. 1, 4, 10, and 11, a third conductive pattern may be disposed on the third gate insulating layer. The third conductive pattern may include a second gate electrode GT3*a*, a fifth gate line GT3*b*, and a first transmission pattern GT3*c*.

The second gate electrode GT3*a* may overlap the third gate line GT2*a* and the second active pattern AP2. The second gate electrode GT3*a* may be electrically connected to the third gate line GT2*a*. For example, the second gate electrode GT3*a* may make contact with the third gate line GT2*a* through a contact. The third gate signal GI may be provided to the second gate electrode GT3*a*. The third gate line GT2*a*, the second active pattern AP2, and the second gate electrode GT3*a* may form the fourth transistor T4. For example, the third gate line GT2*a* may correspond to the back-gate terminal of the fourth transistor T4 described with reference to FIG. 4, and the second gate electrode GT3*a* may correspond to the gate terminal of the fourth transistor described with reference to FIG. 4.

A length of the second gate electrode GT3a in the first direction D1 may be smaller than a length of the third gate line GT2a in the first direction D1.

The fifth gate line GT3b may extend in the first direction D1. The fifth gate line GT3b may overlap the fourth gate line GT2b and the second active pattern AP2. The fifth gate line GT3b may be electrically connected to the fourth gate line GT2b. For example, the fifth gate line GT3b may make contact with the fourth gate line GT2b through a contact. The second gate signal GC may be provided to the fifth gate line GT3b. The fourth gate line GT2b, the second active pattern AP2, and the fifth gate line GT3b may form the third transistor T3. For example, the fourth gate line GT2b may correspond to the back-gate terminal of the third transistor T3 described with reference to FIG. 4, and the fifth gate line GT3b may correspond to the gate terminal of the third transistor T3 described with reference to FIG. 4.

The first transmission pattern GT3c may make contact with the exposed first gate electrode GT1b. The first transmission pattern GT3c may transmit the initialization voltage VINT to the first gate electrode GT1b.

For example, the third conductive pattern may include a metal, a metal alloy, metal nitride, conductive metal oxide, and the like. For example, the third conductive pattern may include the same material as the first conductive pattern or the second conductive pattern.

A second interlayer insulating layer may be disposed on the third gate insulating layer to cover the third conductive pattern. The second interlayer insulating layer may include an insulating material. For example, the second interlayer insulating layer may include silicon oxide, silicon nitride, silicon oxynitride, aluminum oxide, and the like.

Referring to FIGS. 1, 4, 12, and 13, a fourth conductive pattern may be disposed on the second interlayer insulating layer. The fourth conductive pattern may include a horizontal transmission line SD1a, a second transmission pattern SD1b, an anode initialization voltage line SD1c, a third transmission pattern SD1d, a fourth transmission pattern SD1e, a fifth transmission pattern SD1f, a sixth transmission pattern SD1g, and a connection pattern SD1h.

The horizontal transmission line SD1a may extend in the first direction D1. In one pixel area, the horizontal transmission line SD1a may correspond to a horizontal extension part of the connection line described in FIG. 1. Therefore, the data voltage DATA may be provided to the horizontal transmission line SD1a. The data voltage may be transmitted to another data line that is not shown in the drawings. In another pixel area, the horizontal transmission line SD1a may be a dummy line to which the data voltage is not applied. In an embodiment, the horizontal transmission line SD1a may overlap the voltage line GT2d. For example, the voltage line GT2d may shield the horizontal transmission line SD1a.

The second transmission pattern SD1b may make contact with the first active pattern AP1. The data voltage DATA may be transmitted to the first active pattern AP1 through the second transmission pattern SD1b.

The anode initialization voltage line SD1c may extend in the first direction D1. The anode initialization voltage AINT may be provided to the anode initialization voltage line SD1c. The anode initialization voltage line SD1c may make contact with the first active pattern AP1, and may transmit the anode initialization voltage AINT to the first active pattern AP1.

The third transmission pattern SD1d may make contact with the second active pattern AP2 and the first transmission pattern GT3c. The initialization voltage VINT may be transmitted to the first gate electrode GT1b through the voltage line GT2d, the connection pattern SD1h, the second active pattern AP2, the third transmission pattern SD1d, and the first transmission pattern GT3c.

The fourth transmission pattern SD1e may make contact with the second active pattern AP2 and the first active pattern AP1. The fourth transmission pattern SD1e may electrically connect the second active pattern AP2 to the first active pattern AP1.

The fifth transmission pattern SD1f may extend in the first direction D1. The high power supply voltage ELVDD may be provided to the fifth transmission pattern SD1f. The fifth transmission pattern SD1f may make contact with the first active pattern AP1, and may transmit the high power supply voltage ELVDD to the first active pattern AP1.

The sixth transmission pattern SD1g may make contact with the first active pattern AP1. The sixth transmission pattern SD1g may transmit the driving current or the anode initialization voltage AINT from the first active pattern AP1 to the organic light emitting diode OLED.

The connection pattern SD1h may be spaced apart from the horizontal transmission line SD1a. In detail, the connection pattern SD1h may be spaced apart from the horizontal transmission line SD1a in the second direction D2 intersecting the first direction D1. In addition, the connection pattern SD1h may be spaced apart from the third gate line GT2a and the second gate electrode GT3a. The connection pattern SD1h may be disposed between the third gate line GT2a and the horizontal transmission line SD1a when viewed in a plan view. The connection pattern SD1h may make electrical contact with the second active pattern AP2 and the voltage line GT2d. In detail, the connection pattern SD1h may make contact with the second active pattern AP2 and the voltage line GT2d through a contact CNT. The connection pattern SD1h and the contact CNT will be described in detail below.

A first via insulating layer may be disposed on the second interlayer insulating layer to cover the fourth conductive pattern. The first via insulating layer may include an organic insulating material. For example, the first via insulating layer may include a photoresist, a polyacryl-based resin, a polyimide-based resin, an acryl-based resin, and the like.

Referring to FIGS. 1, 4, 14, and 15, a fifth conductive pattern may be disposed on the first via insulating layer. The fifth conductive pattern may include a data line SD2a, a vertical transmission line SD2b, a high power supply voltage line SD2c, and a seventh transmission pattern SD2d.

The data line SD2a may extend in the second direction D2. The data voltage DATA may be transmitted to the first active pattern AP1 through the data line SD2a and the second transmission pattern SD1b.

The vertical transmission line SD2b may extend in the second direction D2. The vertical transmission line SD2b may make contact with the horizontal transmission line SD1a. In an embodiment, the vertical transmission line SD2b may overlap the voltage line GT2d, the anode initialization voltage line SD1c, and the fifth transmission pattern SD1f. The voltage line GT2d, the anode initialization voltage line SD1c, and the fifth transmission pattern SD1f may shield the vertical transmission line SD2b.

In an embodiment, the horizontal transmission line SD1a may correspond to the first data transmission horizontal line HFL1 described with reference to FIG. 3, the data line SD2a may correspond to the fourth data line DL4 described with reference to FIG. 3, and the vertical transmission line SD2b may correspond to the first vertical transmission line VFL1 described with reference to FIG. 3. For example, mutually different data voltages may be is provided to the data line SD2*a* and the vertical transmission line SD2*b*, respectively. In detail, a first data voltage may be transmitted to the first active pattern AP1 through the data line SD2*a*, and a second data voltage that is different from the first data voltage may be transmitted to the horizontal transmission line SD1*a* through the vertical transmission line SD2*b*.

The seventh transmission pattern SD2*d* may make contact with the sixth transmission pattern SD1*g*. The seventh transmission pattern SD2*d* may transmit the driving current or the anode initialization voltage AINT from the sixth transmission pattern SD1*g* to the organic light emitting diode OLED.

A second via insulating layer may be disposed on the first via insulating layer to cover the fifth conductive pattern. The second via insulating layer may include an organic insulating material.

Figure 13:
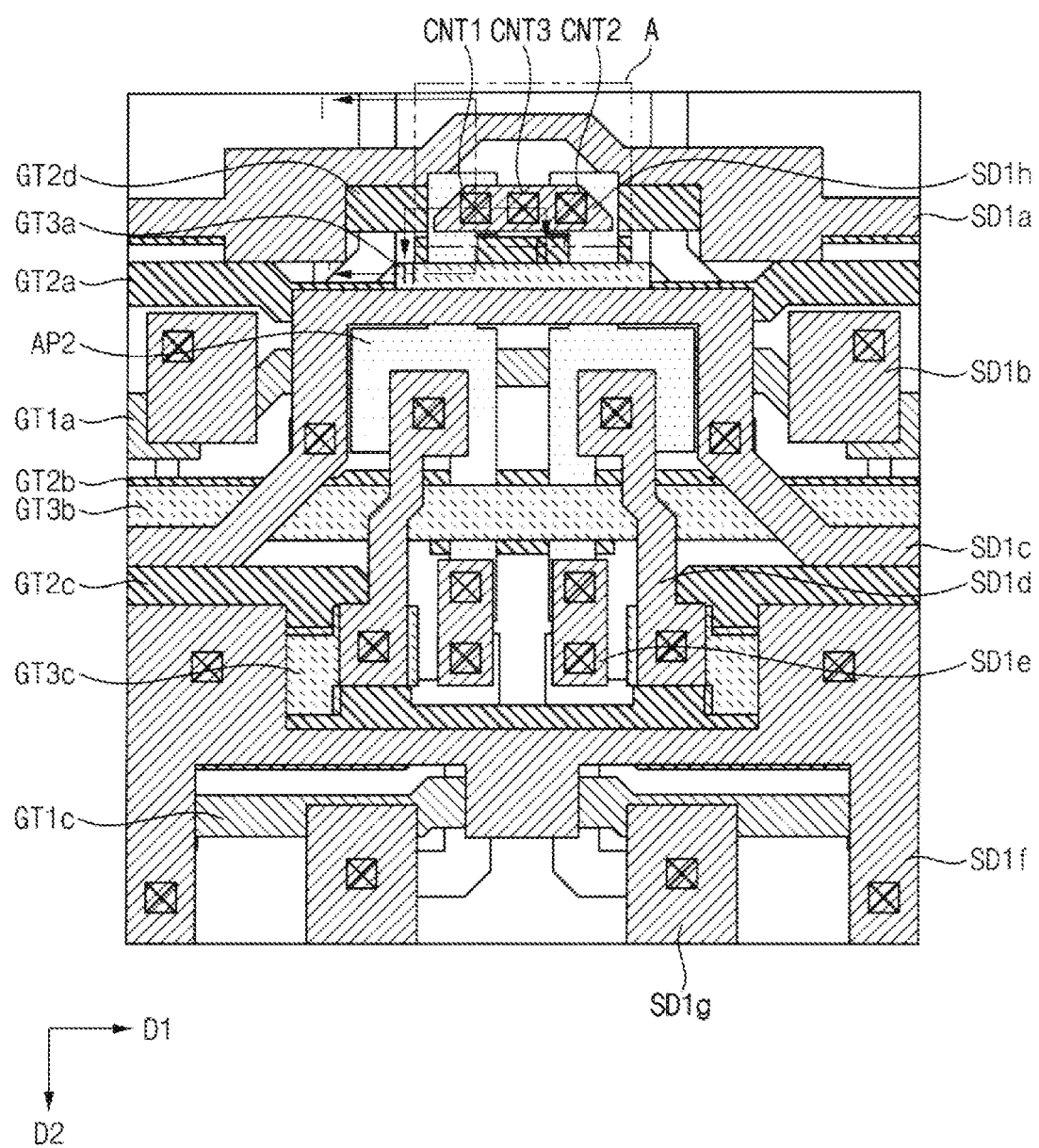
Figure 16:
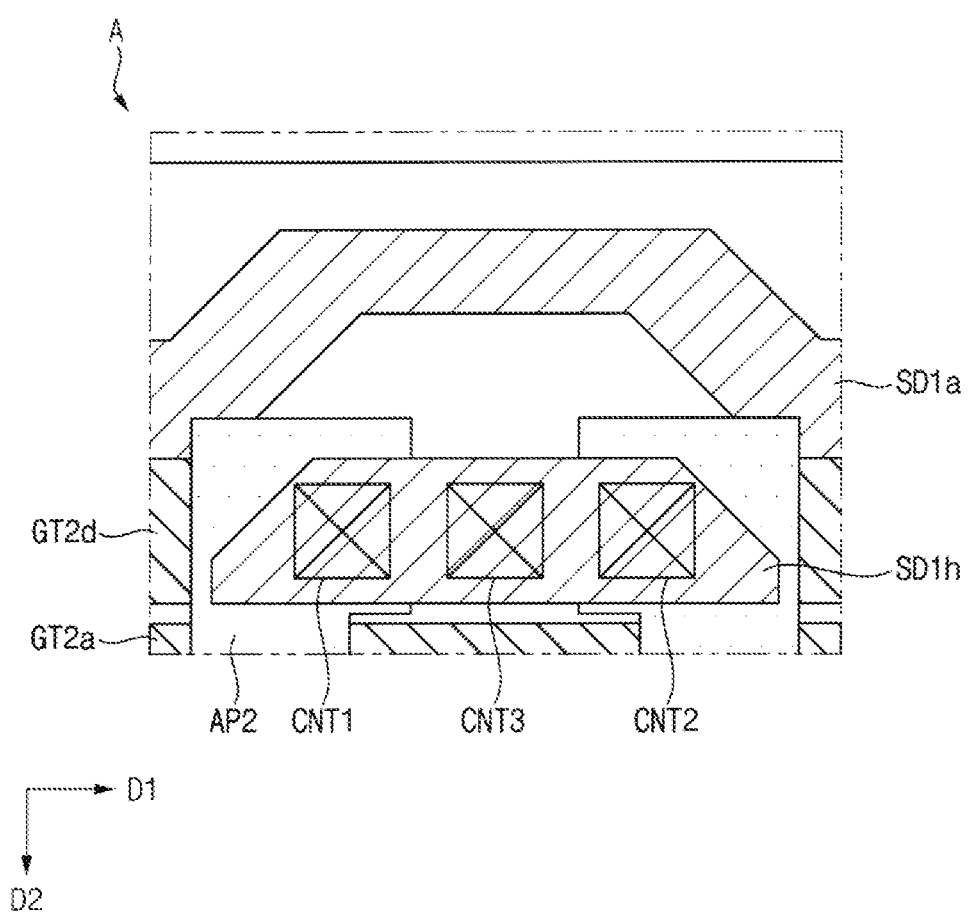
FIG. 16 is an enlarged view showing 'A' region of FIG. 13.
Figure 17:
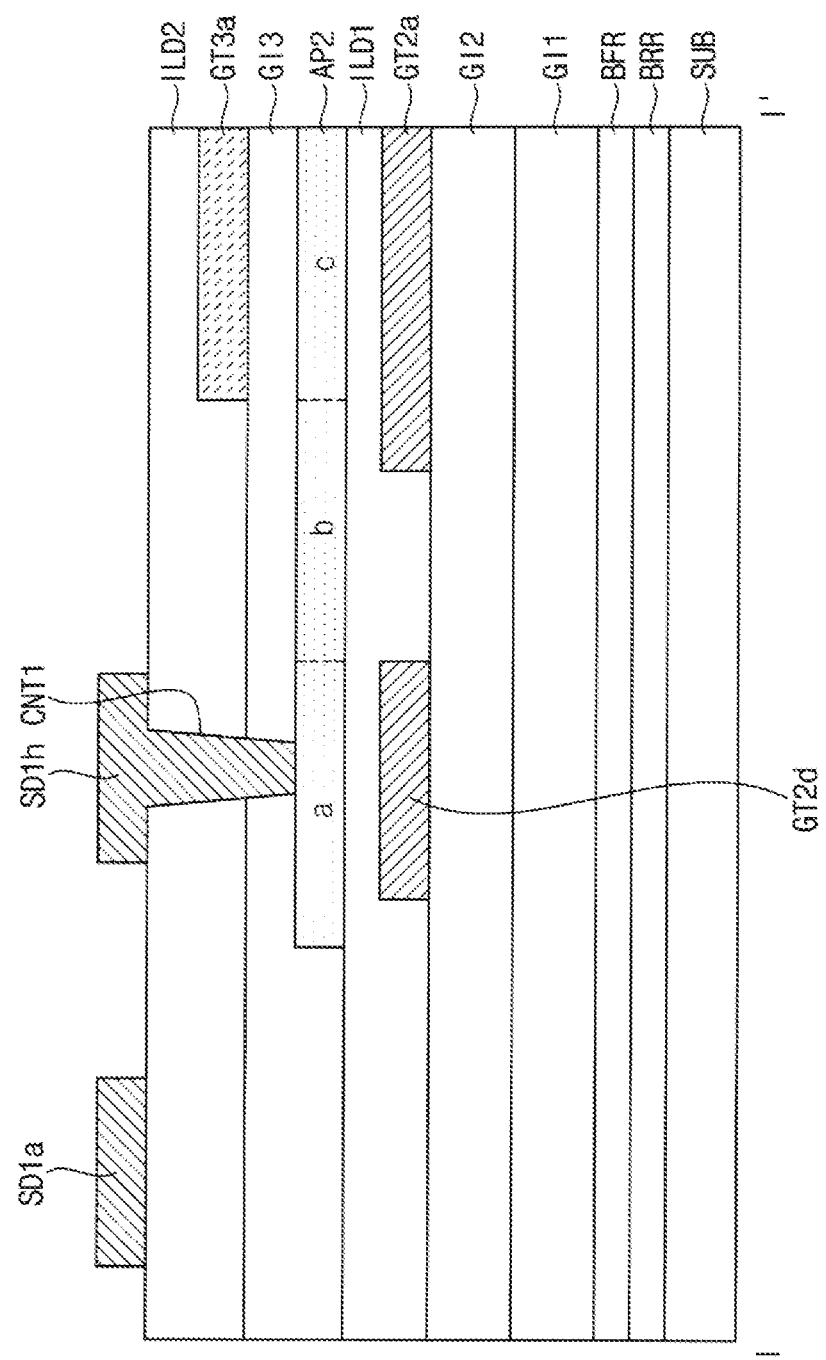
FIG. 17 is a sectional view taken along line I-I' of FIG. 13.

FIG. 16 is an enlarged view showing 'A' region of FIG. 13. FIG. 17 is a sectional view taken along line I-I' of FIG. 13.

Referring to FIGS. 13 and 16, the connection pattern SD1*h* may overlap the voltage line GT2*d* when viewed in a plan view. In addition, the connection pattern SD1*h* may overlap a part of the second active pattern AP2. Therefore, the voltage line GT2*d* may overlap the part of the second active pattern AP2.

Referring further to FIG. 17, the second active pattern AP2 may include a first portion a, a second portion b, and a third portion c. The first portion a may be a portion overlapping the connection pattern SD1*h* and the voltage line GT2*d*. The second portion b may be a portion that does not overlap both the connection pattern SD1*h* and the second gate electrode GT3*a*. The third portion c may be a portion overlapping the second gate electrode GT3*a*. The third portion c overlapping the second gate electrode GT3*a* may not be doped with is ions. The first and second portions a and b that do not overlap the second gate electrode GT3*a* may be doped with ions.

Figure 18:
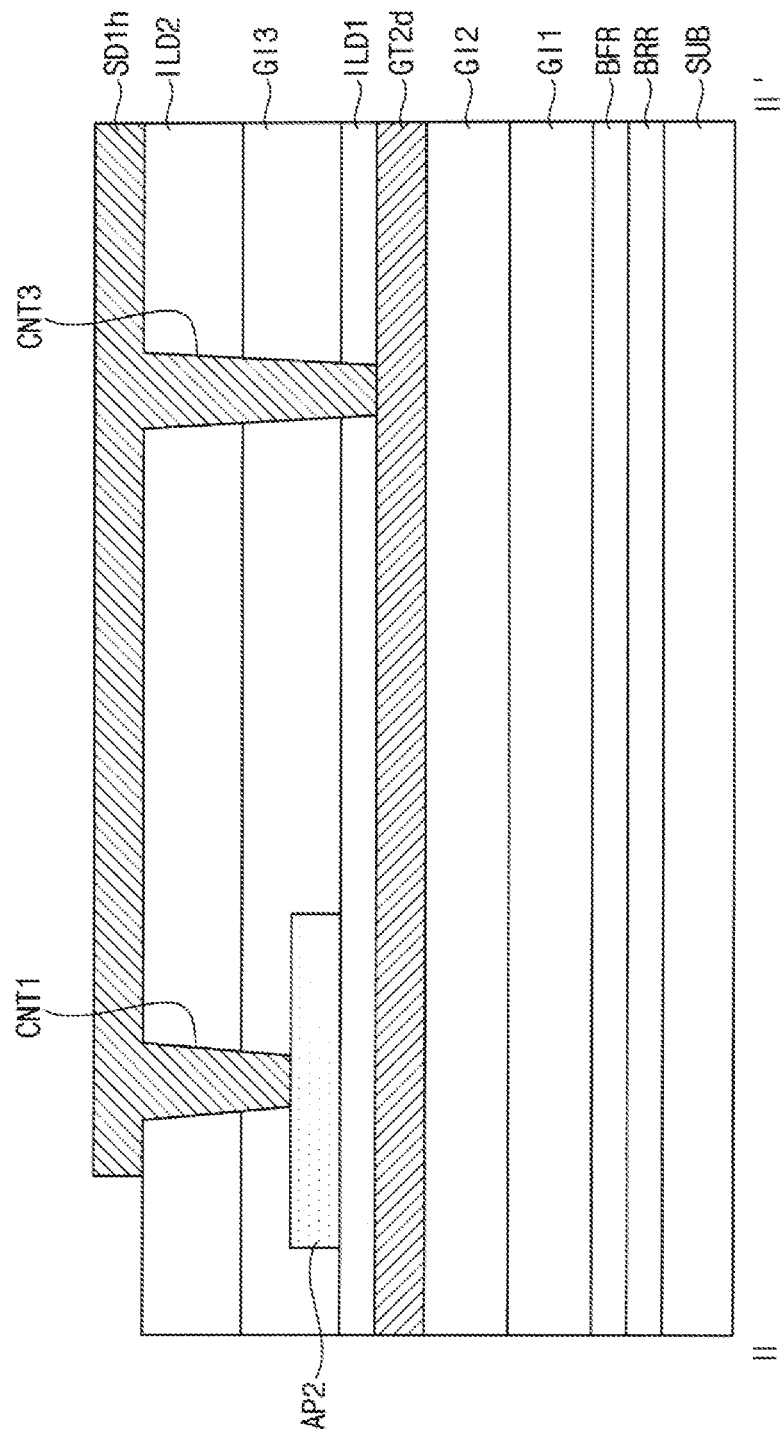
FIG. 18 is a sectional view taken along line II-IF of FIG. 13.
Figure 19:
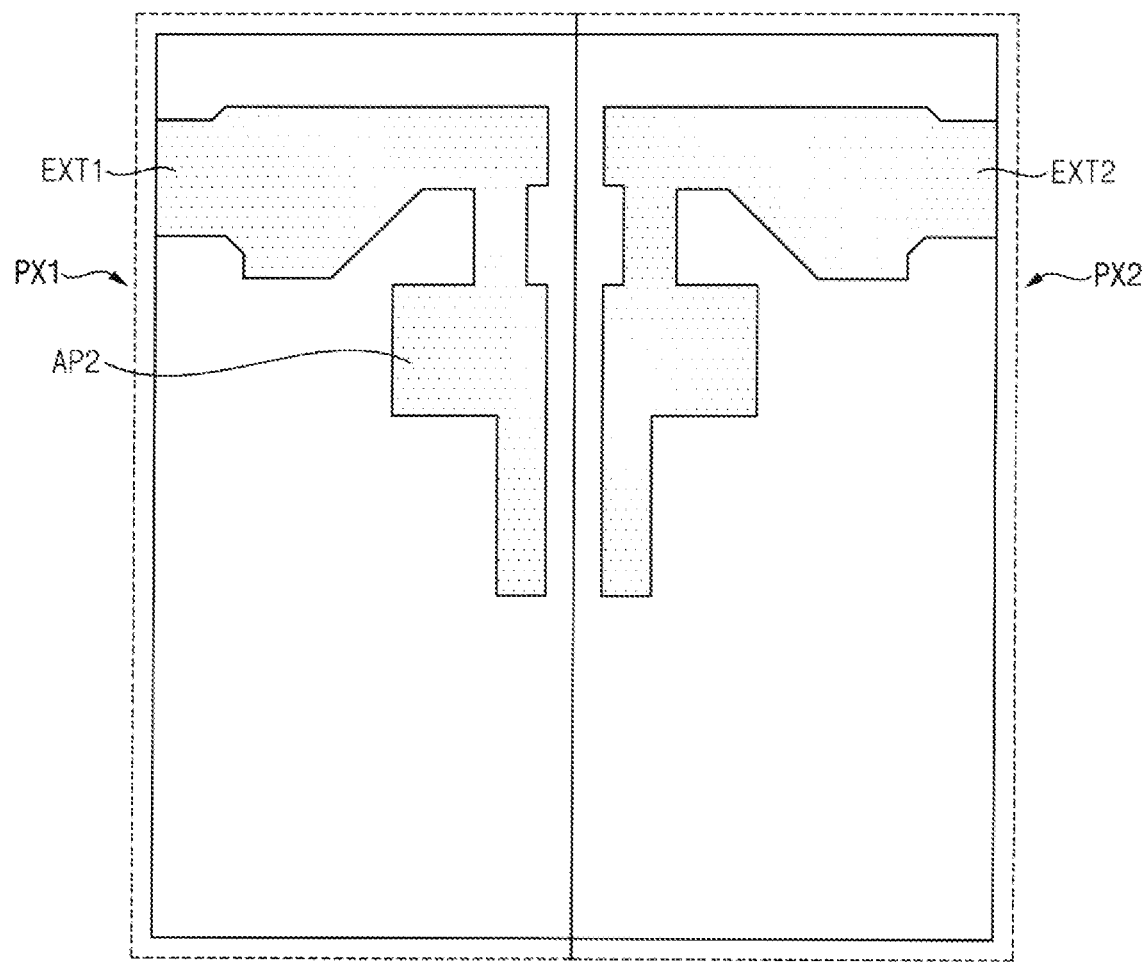
FIGS. 19, 20, 21, 22, and 23 are layout diagrams for describing pixel structures included in a display device according to one embodiment.
Figure 20:
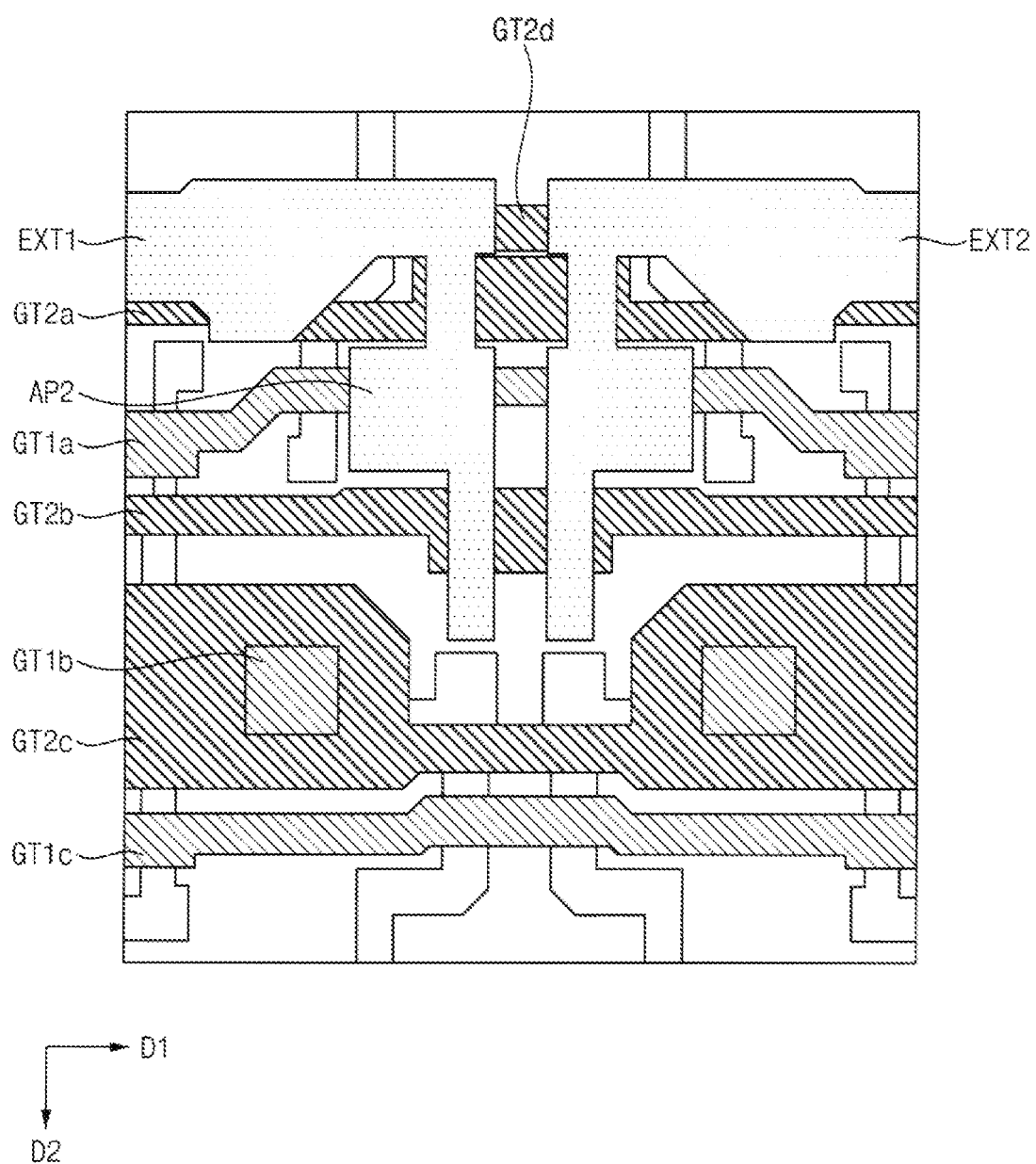

FIG. 18 is a sectional view taken along line II-IF of FIG. 13.

Referring to FIG. 18, in an embodiment, the connection pattern SD1*h* may make contact with the second active pattern AP2 through each of a first contact CNT1 and a second contact CNT2. The first contact CNT1 may be disposed at one end of the connection pattern SD1*h*. The second contact CNT2 may be disposed at an opposite end of the connection pattern SD1*h*.

In an embodiment, the connection pattern SD1*h* may further include a third contact CNT3. The third contact CNT3 may be disposed between the first contact CNT1 and the second contact CNT2. However, in another embodiment, the first to third contacts CNT1, CNT2, and CNT3 may be arranged differently from the above configuration. The connection pattern SD1*h* may make contact with the voltage line GT2*d* through the third contact CNT3.

In an embodiment, the connection pattern SD1*h* may be electrically connected to the voltage line GT2*d* and the second active pattern AP2. The voltage line GT2*d* may provide the initialization voltage VINT to the connection pattern SD1*h*. In addition, the connection pattern SD1*h* may provide the initialization voltage VINT to the second active pattern AP2. Therefore, the initialization voltage VINT may be provided to the first terminal of the fourth transistor through the voltage line GT2*d*, the connection pattern SD1*h*, and the second active pattern AP2.

In a conventional display device, a voltage line and an active pattern may make contact with each other through a contact. An initialization voltage may be provided from the voltage line to the active pattern through the contact. In this case, distribution of contact resistance values may be increased by the contact. According to one embodiment of the present is invention, the voltage line GT2*d* and the second active pattern AP2 may be electrically connected to each other through the connection pattern SD1*h* instead of the contact. The initialization voltage VINT may be provided from the voltage line GT2*d* to the second active pattern AP2 through the connection pattern SD1*h*. Therefore, distribution of contact resistance values may be reduced.

In addition, the connection pattern SD1*h* may be spaced apart from the horizontal transmission line SD1*a* in the second direction D2. Referring to FIG. 17, the connection pattern SD1*h* may be located between the horizontal transmission line SD1*a* and the third gate line GT2*a*. In addition, the connection pattern SD1*h* may be located between the horizontal transmission line SD1*a* and the second gate electrode GT3*a*. Therefore, the connection pattern SD1*h* may prevent a coupling phenomenon that may occur between the horizontal transmission line SD1*a* and the third gate line GT2*a*, and between the horizontal transmission line SD1*a* and the second gate electrode GT3*a*. In detail, the data voltage DATA may be provided to the horizontal transmission line SD1*a*, and the third gate signal GI may be provided to the third gate line GT2*a*. Since the connection baton SD1*h* is disposed between the horizontal transmission line SD1*a* and the third gate line GT2*a*, a coupling phenomenon between the data voltage DATA and the third gate signal GI may be prevented.

FIGS. 19 to 23 are layout diagrams for describing pixel structures included in a display device according to one embodiment. Since components of pixel structures of a display device 11 that will be described with reference to FIGS. 19 to 23, which are the same as the components of the pixel structures of the display device 10 described with reference to FIGS. 5 to 15, have been described above, descriptions thereof will be omitted below for ease in explanation of these figures.

Referring to FIGS. 1, 4, 19, and 20, the display device 11 may include a first pixel structure PX1 and a second pixel structure PX2, which are adjacent to each other. For example, the second pixel structure PX2 may have a structure that is symmetrical to a structure of the first pixel structure PX1 based on a virtual symmetry line.

A first active pattern AP1 may be disposed on a buffer layer disposed on a substrate. In an embodiment, the first active pattern AP1 may include a silicon semiconductor. A first gate insulating layer may be disposed on the substrate SUB to cover the first active pattern AP1.

A first conductive pattern may be disposed on the first gate insulating layer. The first conductive pattern may include a first gate line GT1*a*, a first gate electrode GT1*b*, and a second gate line GT1*c*.

A second gate insulating layer may be disposed on the first gate insulating layer to cover the first conductive pattern. A second active pattern AP2 may be disposed on a first interlayer insulating layer.

A second conductive pattern may be disposed on the second gate insulating layer. The second conductive pattern may include a third gate line GT2*a*, a fourth gate line GT2*b*, a storage capacitor electrode GT2*c*, and a voltage line GT2*d*.

The first interlayer insulating layer may be disposed on the second gate insulating layer to cover the second conductive pattern.

The second active pattern AP2 may continuously extend in the first pixel structure PX1 and the second pixel structure PX2. For example, the second active pattern AP2 may have a symmetrical shape based on a virtual line extending in the second direction D2 perpendicular to the first direction D1. The second active pattern AP2 may include a first extension part EXT1 is and a second extension part EXT2 extending in the first direction D1. The first extension part EXT1 may be disposed on the first pixel structure PX1. The second extension part EXT2 may be disposed on the second pixel structure PX2. In an embodiment, the second active pattern AP2 may overlap the first gate line GT1a, the third gate line GT2a, the fourth gate line GT2b, and the voltage line GT2d. In detail, the first extension part EXT1 and the second extension part EXT2 may overlap the voltage line GT2d.

A third gate insulating layer may be disposed on the first interlayer insulating layer to cover the second active pattern AP2. The third gate insulating layer may include an insulating material.

Figure 21:
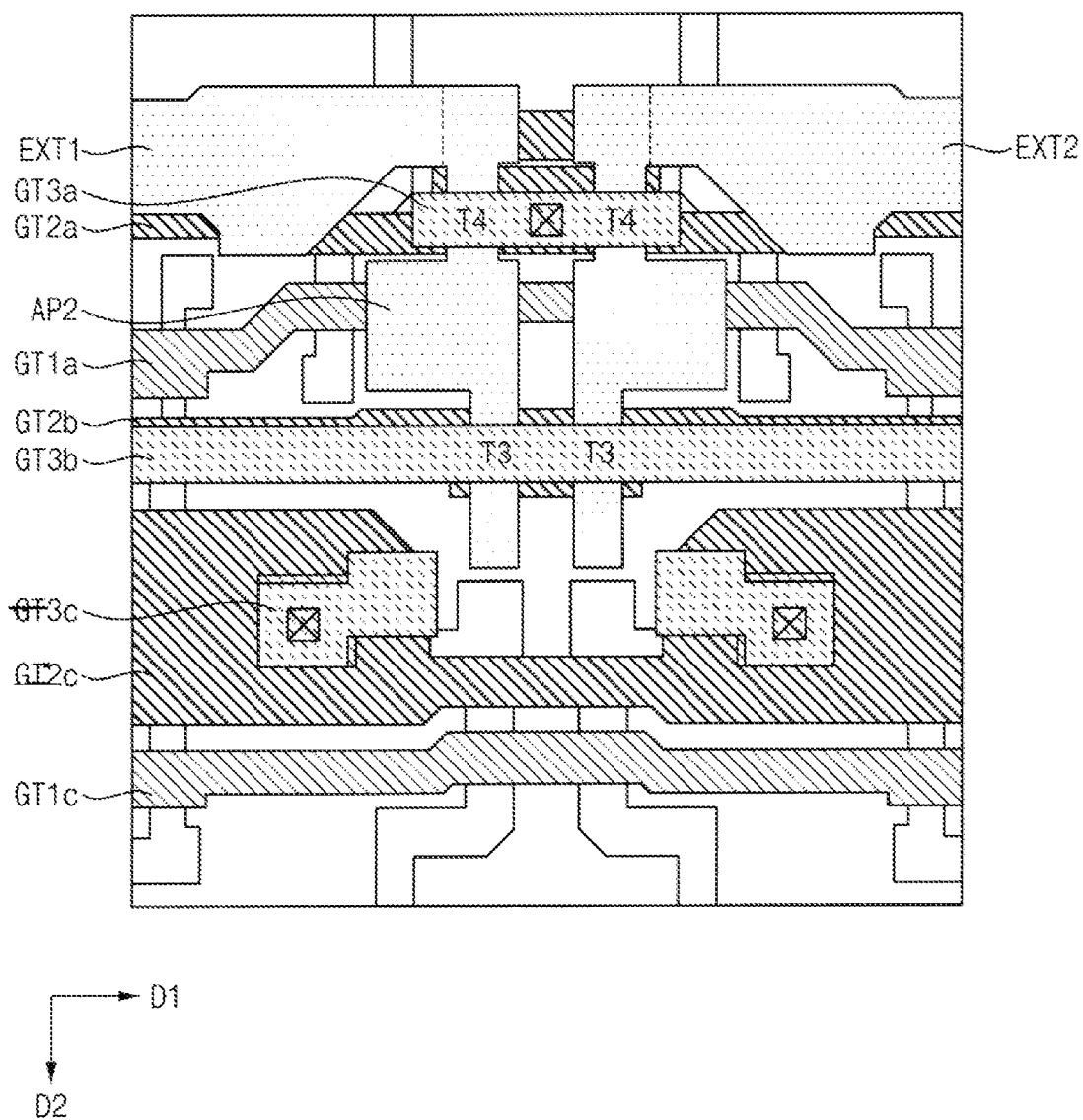

Referring to FIGS. 1, 4, and 21, a third conductive pattern may be disposed on the third gate insulating layer. The third conductive pattern may include a second gate electrode GT3a, a fifth gate line GT3b, and a first transmission pattern GT3c.

The second gate electrode GT3a may overlap the third gate line GT2a and the second active pattern AP2. The second gate electrode GT3a may be electrically connected to the third gate line GT2a. The third gate signal GI may be provided to the second gate electrode GT3a. The third gate line GT2a, the second active pattern AP2, and the second gate electrode GT3a may form the fourth transistor T4.

A length of the second gate electrode GT3a in the first direction D1 may be smaller than a length of the third gate line GT2a in the first direction D1.

A second interlayer insulating layer may be disposed on the third gate insulating layer to cover the third conductive pattern.

Figure 22:
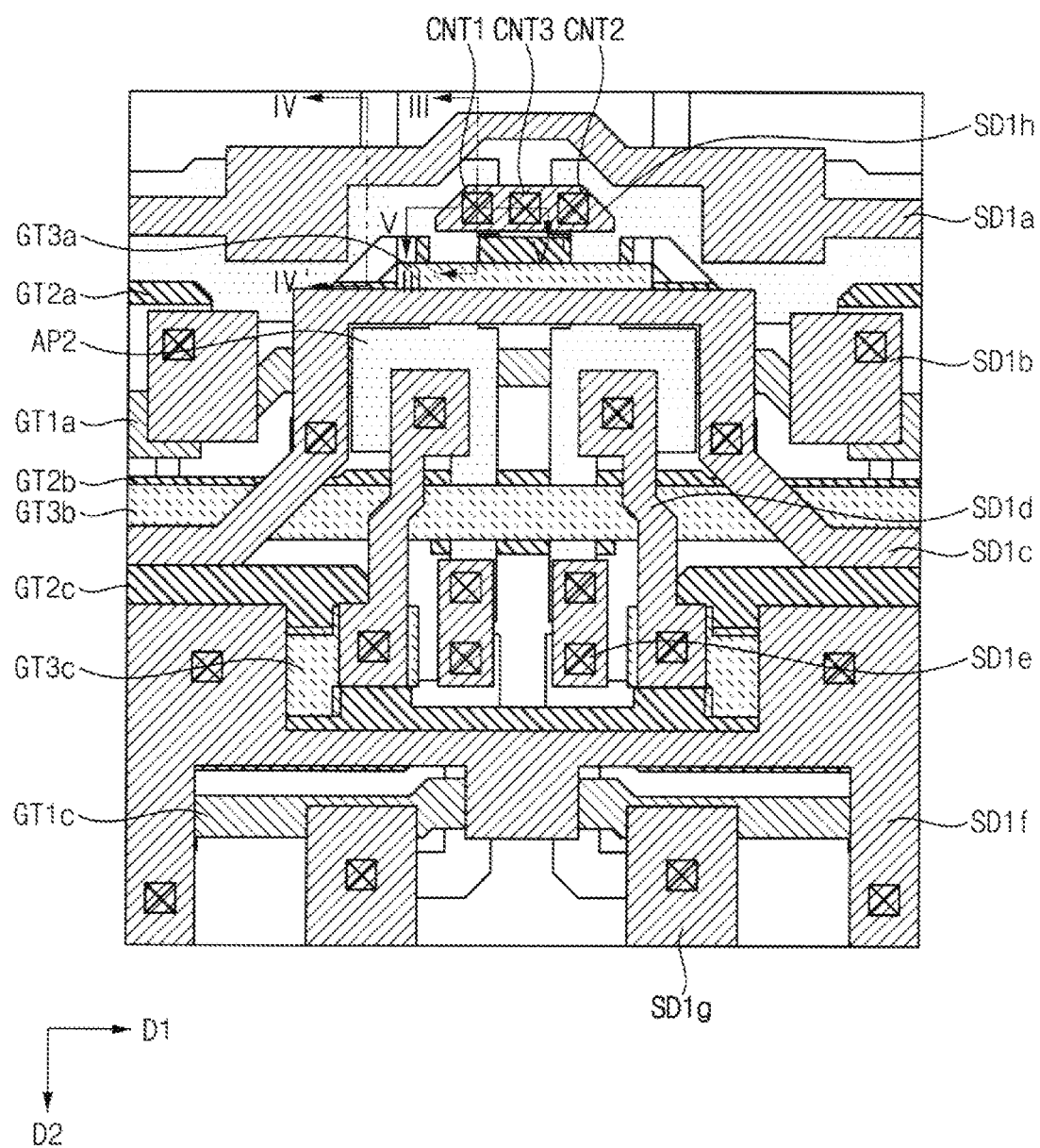

Referring to FIGS. 1, 4, and 22, a fourth conductive pattern may be disposed on the second interlayer insulating layer. The fourth conductive pattern may include a horizontal is transmission line SD1a, a second transmission pattern SD1b, an anode initialization voltage line SD1c, a third transmission pattern SD1d, a fourth transmission pattern SD1e, a fifth transmission pattern SD1f, a sixth transmission pattern SD1g, and a connection pattern SD1h.

The horizontal transmission line SD1a may extend in the first direction D1. In an embodiment, the horizontal transmission line SD1a may overlap the voltage line GT2d. For example, the voltage line GT2d may shield the horizontal transmission line SD1a. The horizontal transmission line SD1a may overlap the first extension part EXT1 and the second extension part EXT2 of the second active pattern AP2.

The connection pattern SD1h may be spaced apart from the horizontal transmission line SD1a. In detail, the connection pattern SD1h may be spaced apart from the horizontal transmission line SD1a in the second direction D2 intersecting the first direction D1. In addition, the connection pattern SD1h may be spaced apart from the third gate line GT2a. The connection pattern SD1h may be disposed between the third gate line GT2a and the horizontal transmission line SD1a when viewed in a plan view.

The connection pattern SD1h may make electrical contact with the second active pattern AP2 and the voltage line GT2d. In detail, the connection pattern SD1h may make contact with the second active pattern AP2 through a first contact CNT1 and a second contact CNT2. In addition, the connection pattern SD1h may make contact with the voltage line GT2d through a third contact CNT3.

A first via insulating layer may be disposed on the second interlayer insulating layer to cover the fourth conductive pattern.

Figure 23:
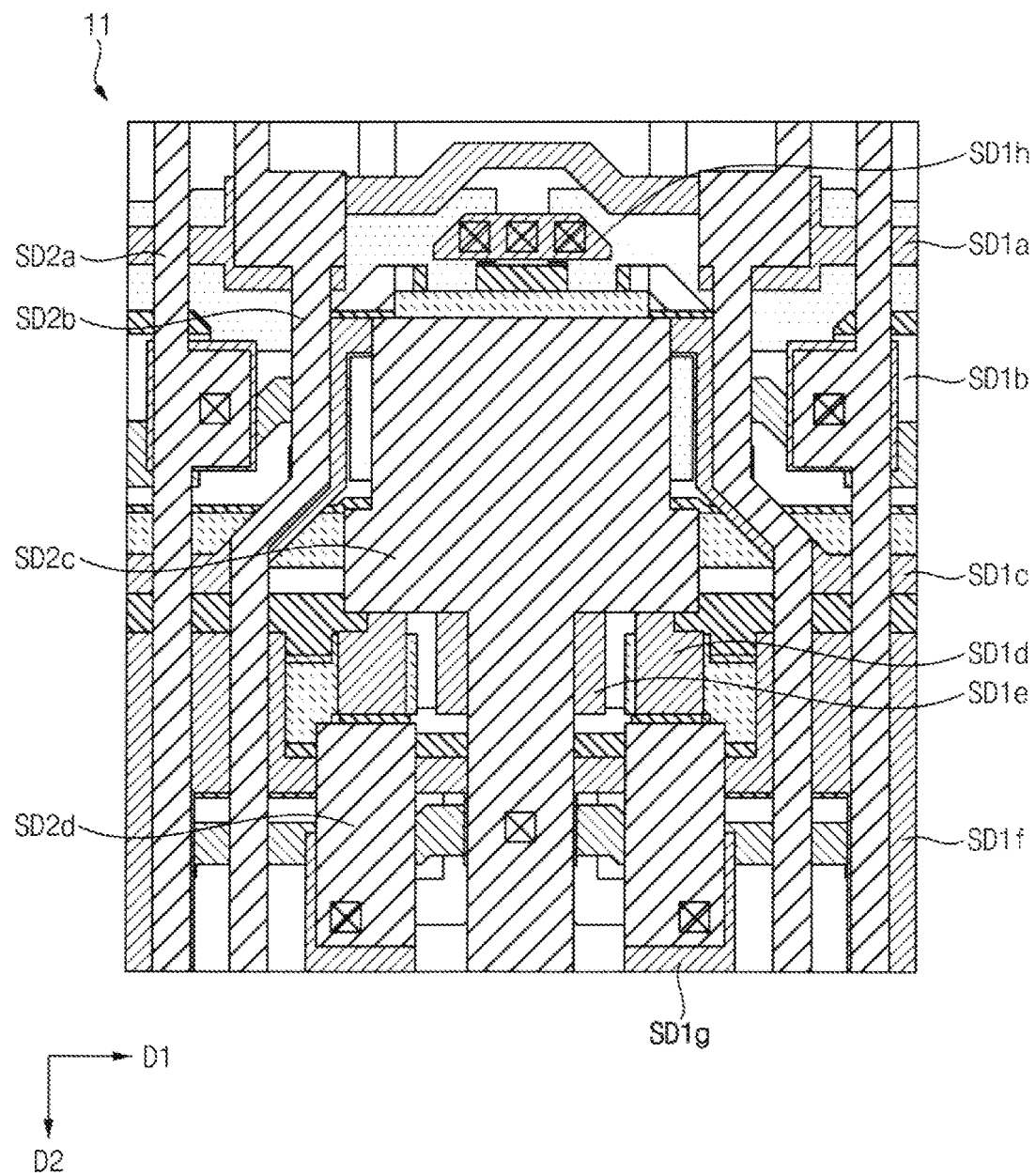

Referring to FIGS. 1, 4, and 23, a fifth conductive pattern may be disposed on the first via insulating layer. The fifth conductive pattern may include a data line SD2a, a vertical is transmission line SD2b, a high power supply voltage line SD2c, and a seventh transmission pattern SD2d.

Figure 24:
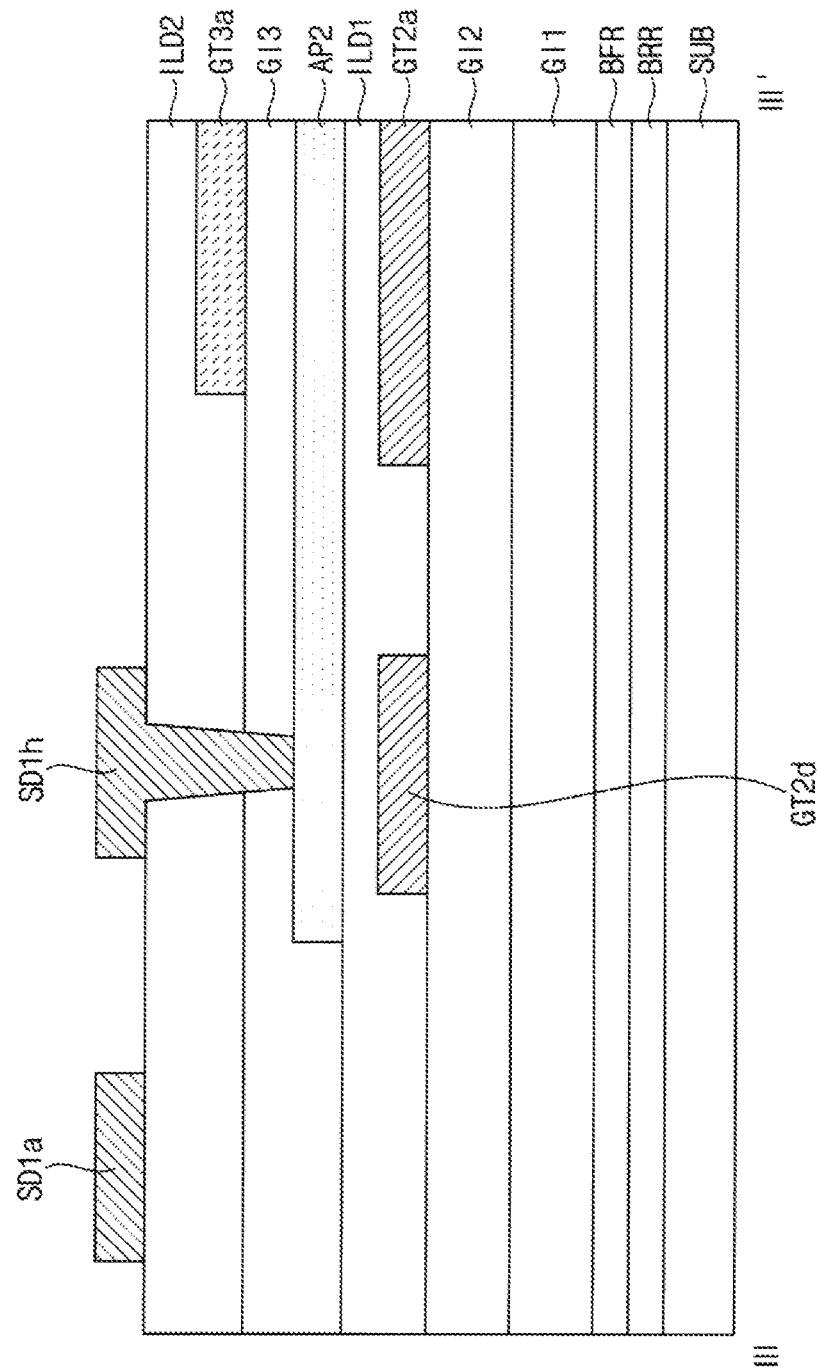
FIG. 24 is a sectional view taken along line of FIG. 22.
Figure 25:
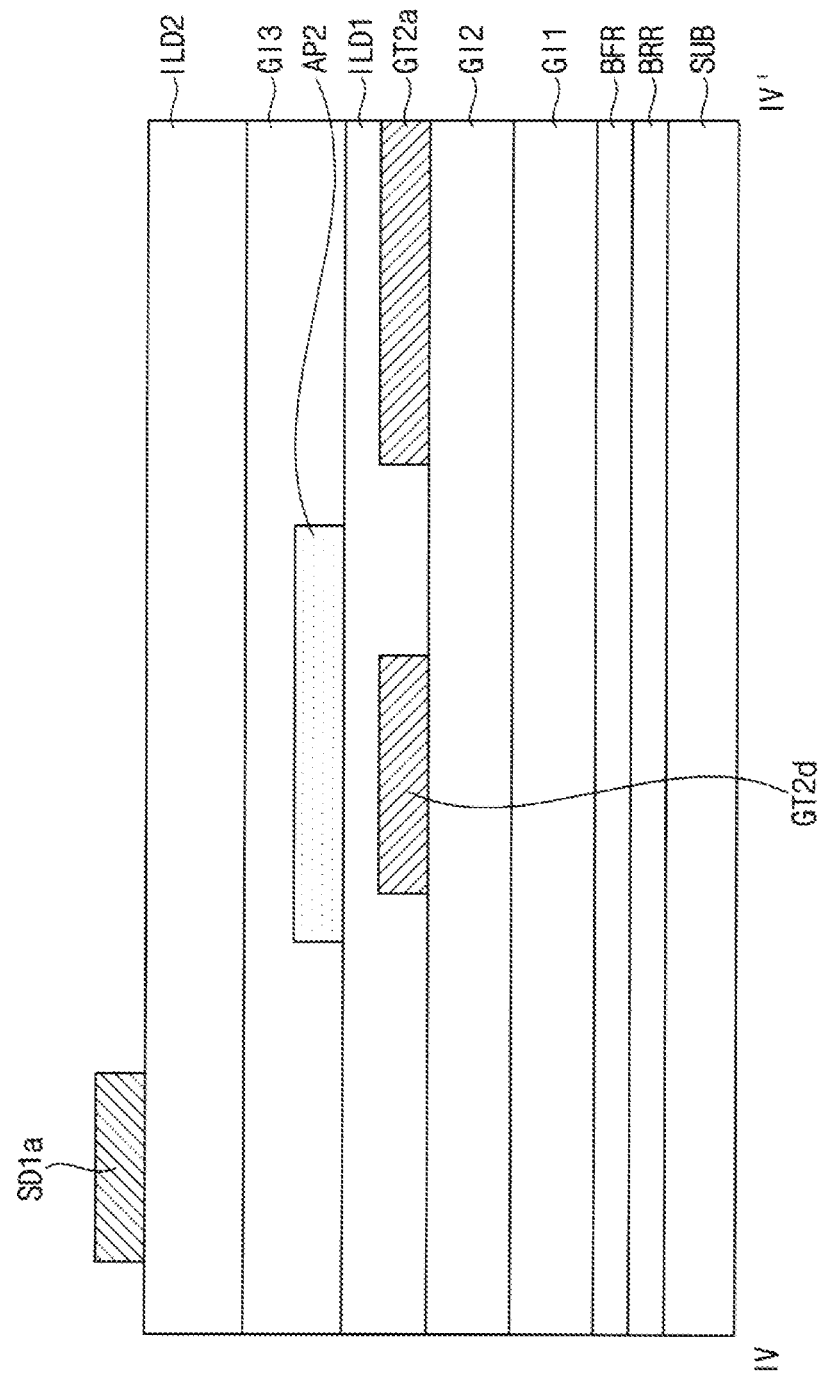
FIG. 25 is a sectional view taken along line IV-IV' of FIG. 22.

FIG. 24 is a sectional view taken along line of FIG. 22.
FIG. 25 is a sectional view taken along line IV-IV' of FIG. 22.

Referring to FIGS. 22, 24, and 25, the connection pattern SD1h may overlap the voltage line GT2d when viewed in a plan view. The voltage line GT2d may overlap the first extension part EXT1 and the second extension part EXT2 of the second active pattern AP2.

Figure 26:
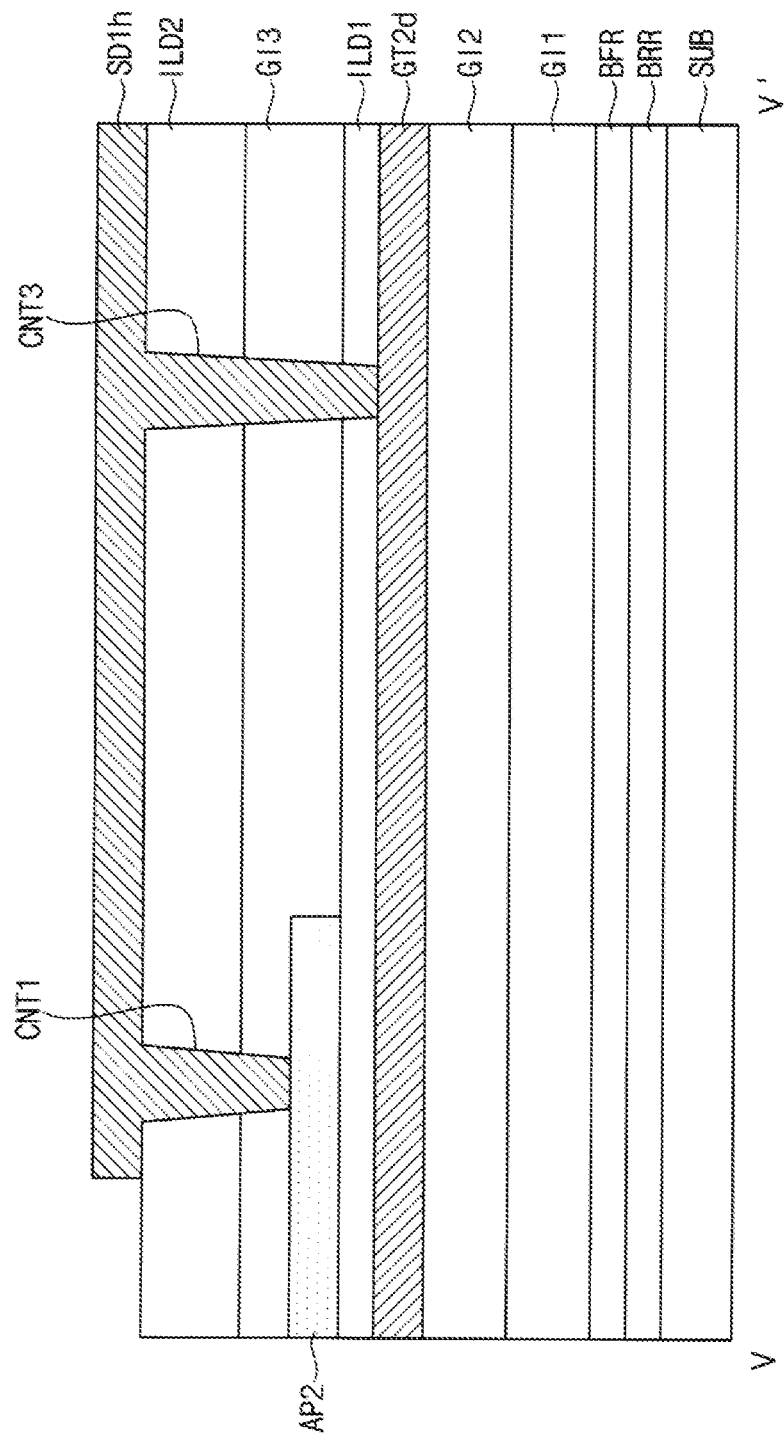
FIG. 26 is a sectional view taken along line V-V' of FIG. 22.

FIG. 26 is a sectional view taken along line V-V' of FIG. 22.

Referring to FIG. 26, in an embodiment, the connection pattern SD1h may include a first contact CNT1 and a second contact CNT2. The connection pattern SD1h may make contact with the second active pattern AP2 through each of the first contact CNT1 and the second contact CNT2. In an embodiment, the connection pattern SD1h may further include a third contact CNT3. The connection pattern SD1h may make contact with the voltage line GT2d through the third contact CNT3.

In an embodiment, the connection pattern SD1h may be electrically connected to the voltage line GT2d and the second active pattern AP2. The initialization voltage VINT may be provided sequentially through the voltage line GT2d, the connection pattern SD1h, and the second active pattern AP2. Therefore, the distribution of the contact resistance values may be reduced.

In addition, the second gate electrode GT3a and the third gate line GT2a may be spaced apart from the horizontal transmission line SD1a. The connection pattern SD1h may be located between the horizontal transmission line SD1a and the third gate line GT2a. Therefore, the connection pattern SD1h may prevent a coupling phenomenon that may occur between the is horizontal transmission line SD1a and the third gate line GT2a. Similarly, the first extension part EXT1 and the second extension part EXT2 of the second active pattern AP2 may prevent a coupling phenomenon that may occur between the horizontal transmission line SD1a and the third gate line GT2a.

FIGS. 27 to 34 are layout diagrams for describing pixel structures included in a display device according to one embodiment. Since components of pixel structures of a display device 12 that will be described with reference to FIGS. 27 to 34, which are the same as the components of the pixel structures of the display device 10 described with reference to FIGS. 5 to 15, have been described above, descriptions thereof will be omitted below for ease in explanation of these figures.

Figure 27:
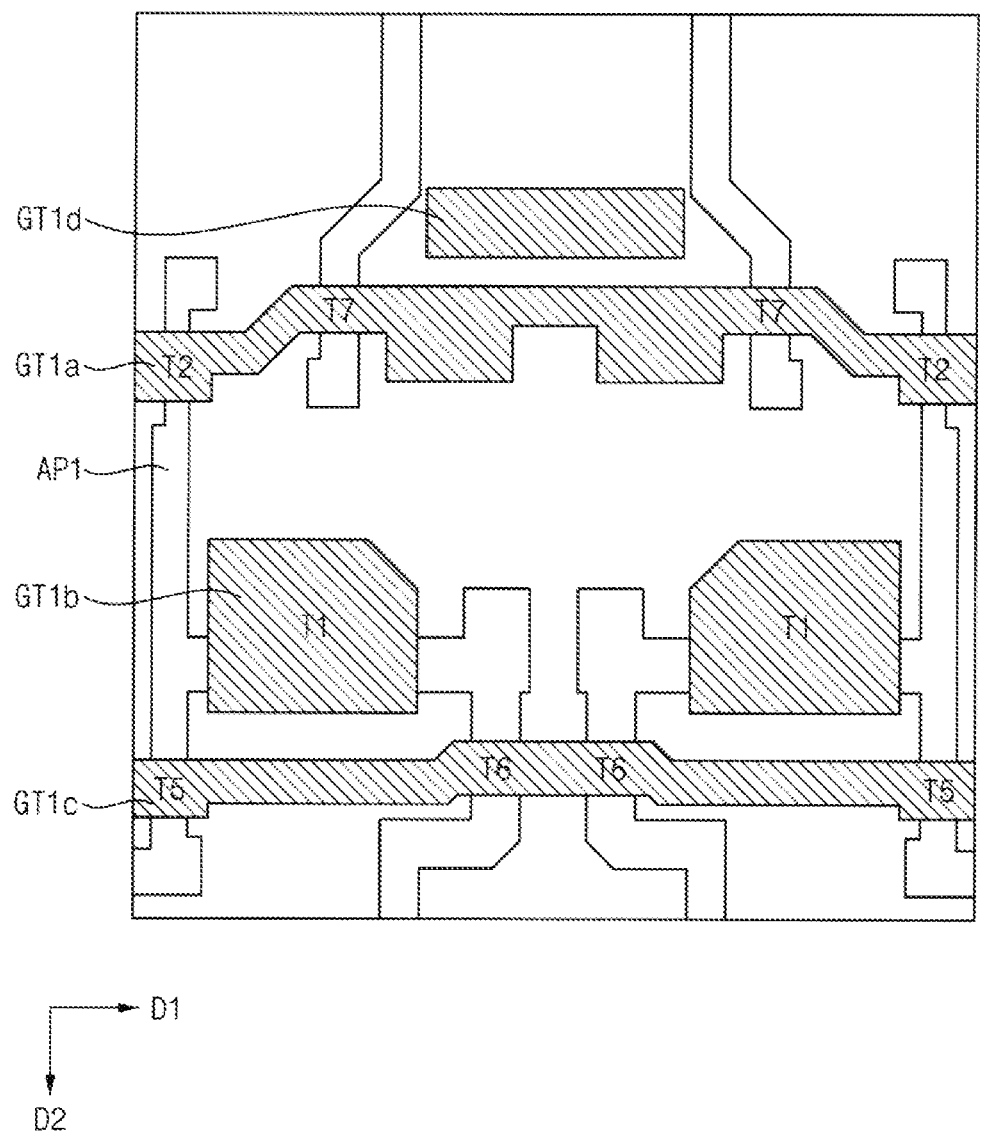
FIGS. 27, 28, 29, 30, 31, 32, 33, and 34 are layout diagrams for describing pixel structures included in a display device according to one embodiment.

Referring to FIGS. 1, 4, and 27, a first conductive pattern may be disposed on a first gate insulating layer. The first conductive pattern may include a first gate line GT1a, a first gate electrode GT1b, a second gate line GT1c, and a second gate electrode GT1d.

The second gate electrode GT1d may overlap a second active pattern AP2 and a fourth gate line GT3a, which will be described below. The second gate electrode GT1d may be electrically connected to the fourth gate line GT3a (see FIG. 33).

A second gate insulating layer may be disposed on the first gate insulating layer to cover the first conductive pattern. The second gate insulating layer may include an insulating material. In detail, the second gate insulating layer may include silicon oxide, silicon nitride, and silicon oxynitride, and may have a single-layer structure or a multilayer structure.

Figure 28:
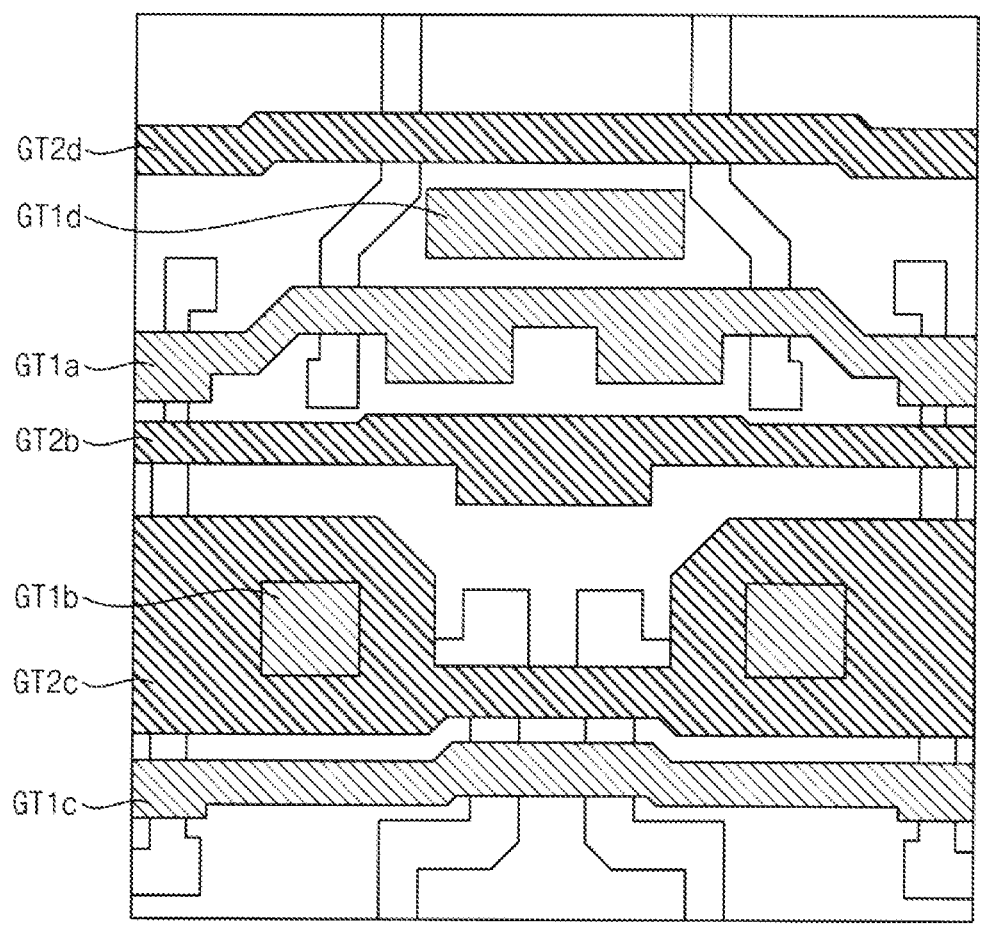

Referring to FIGS. 1, 4, and 28, a second conductive pattern may be disposed on the second gate insulating layer. The second conductive pattern may include a third gate line GT2b, a storage capacitor electrode GT2c, and a voltage line GT2d.

The voltage line GT2d may extend in the first direction D1. In an embodiment, the initialization voltage VINT may be provided to the voltage line GT2d. The voltage line GT2d may provide the initialization voltage VINT to a connection pattern SD1h that will be described below.

A first interlayer insulating layer may be disposed on the second gate insulating layer to cover the second conductive pattern.

Figure 29:
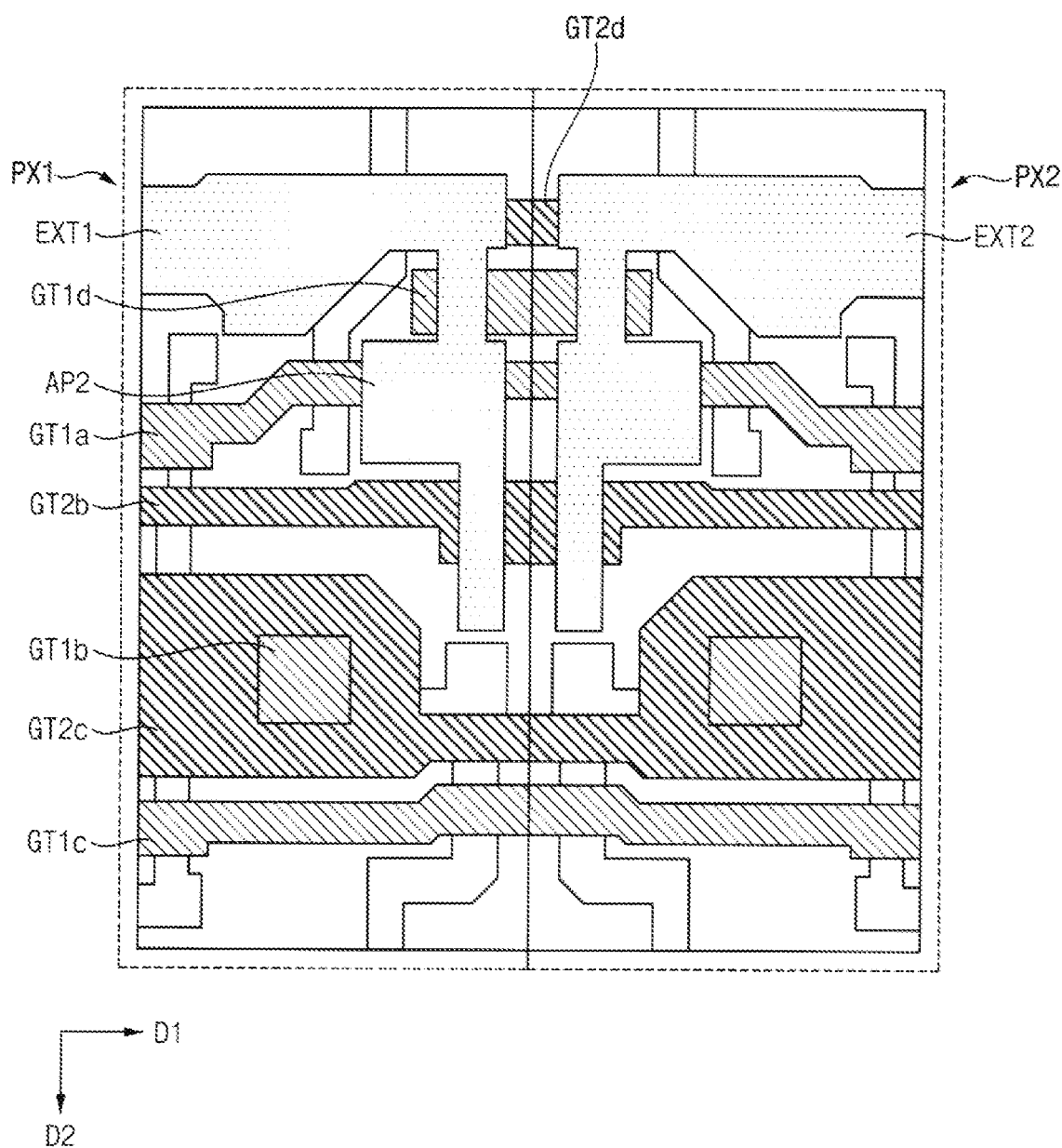
Figure 30:
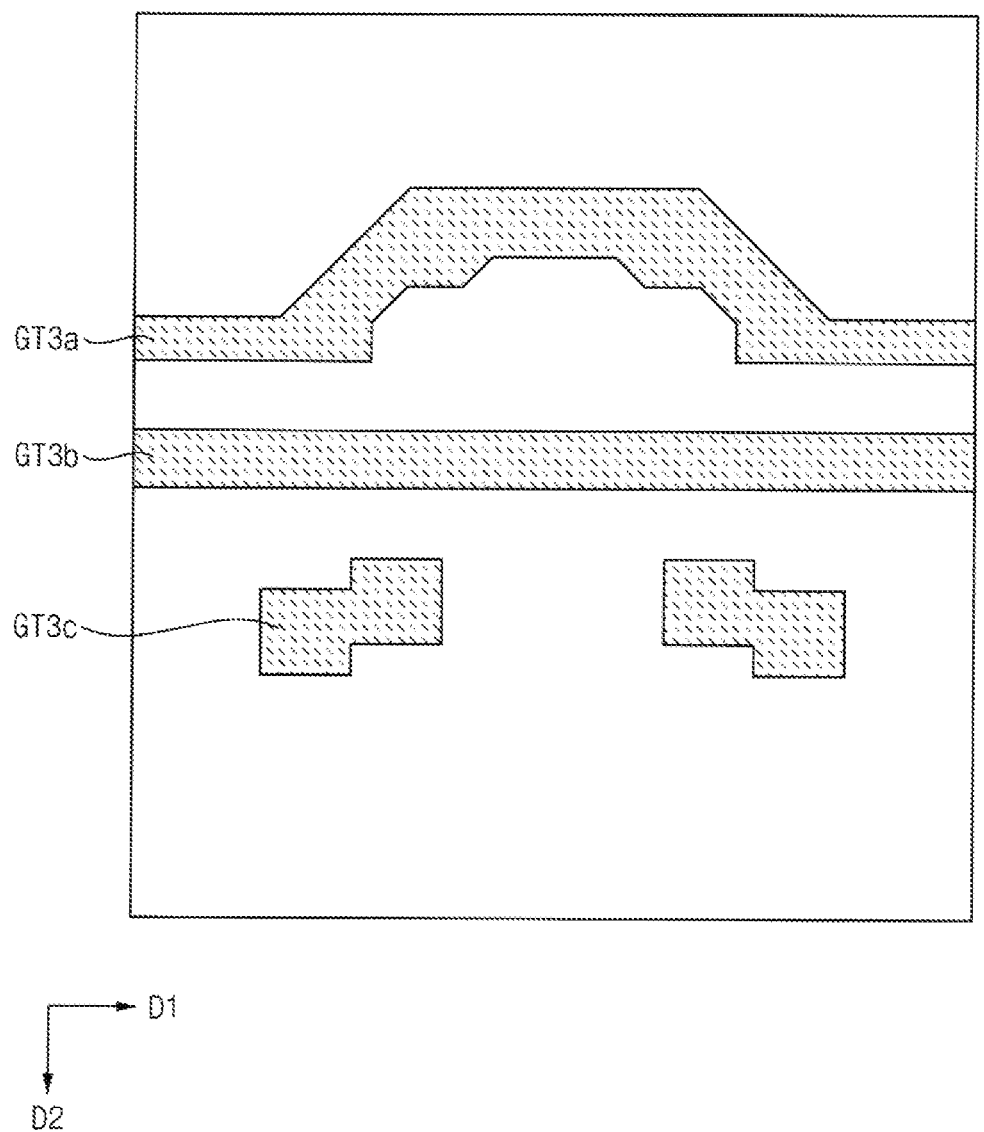
Figure 31:
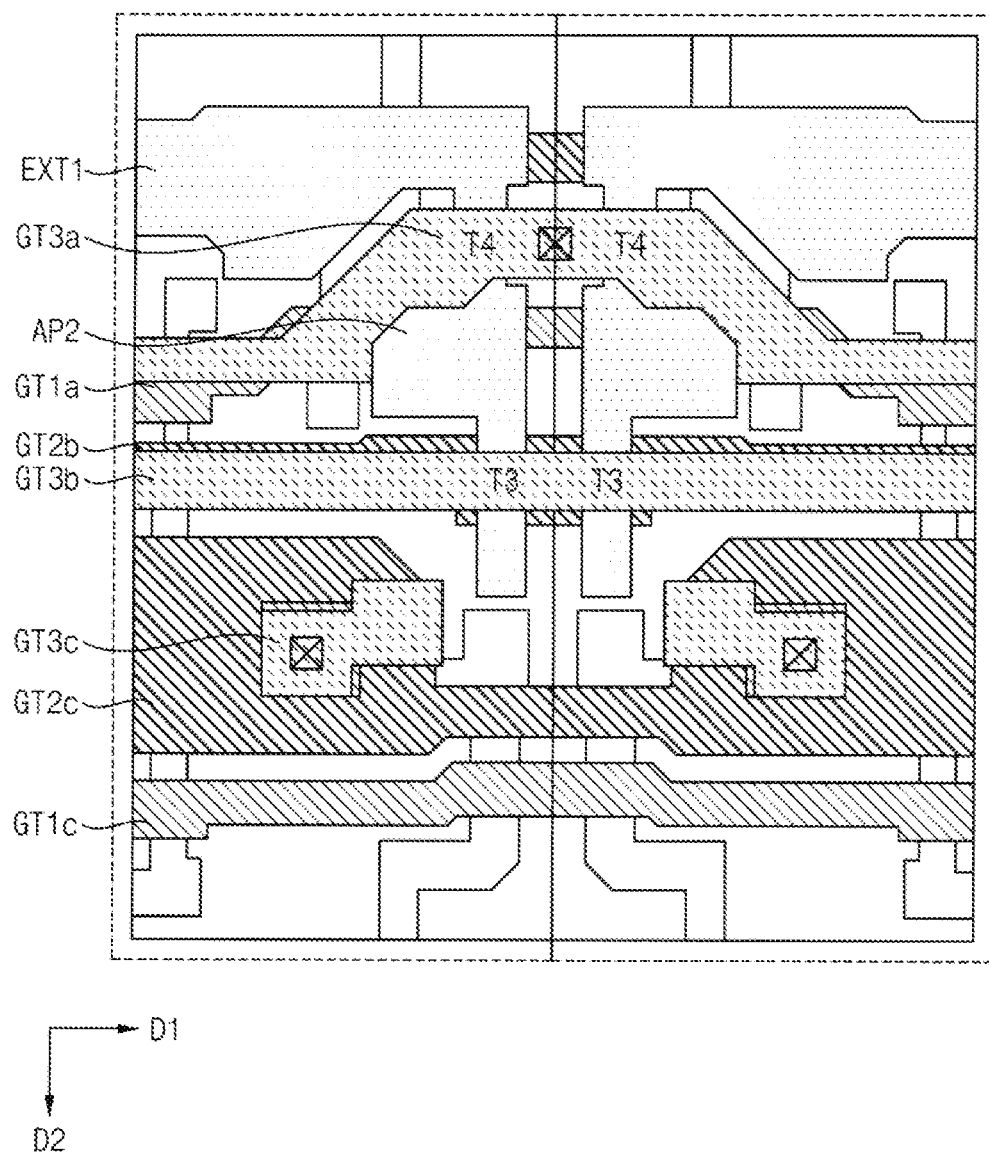
Figure 32:
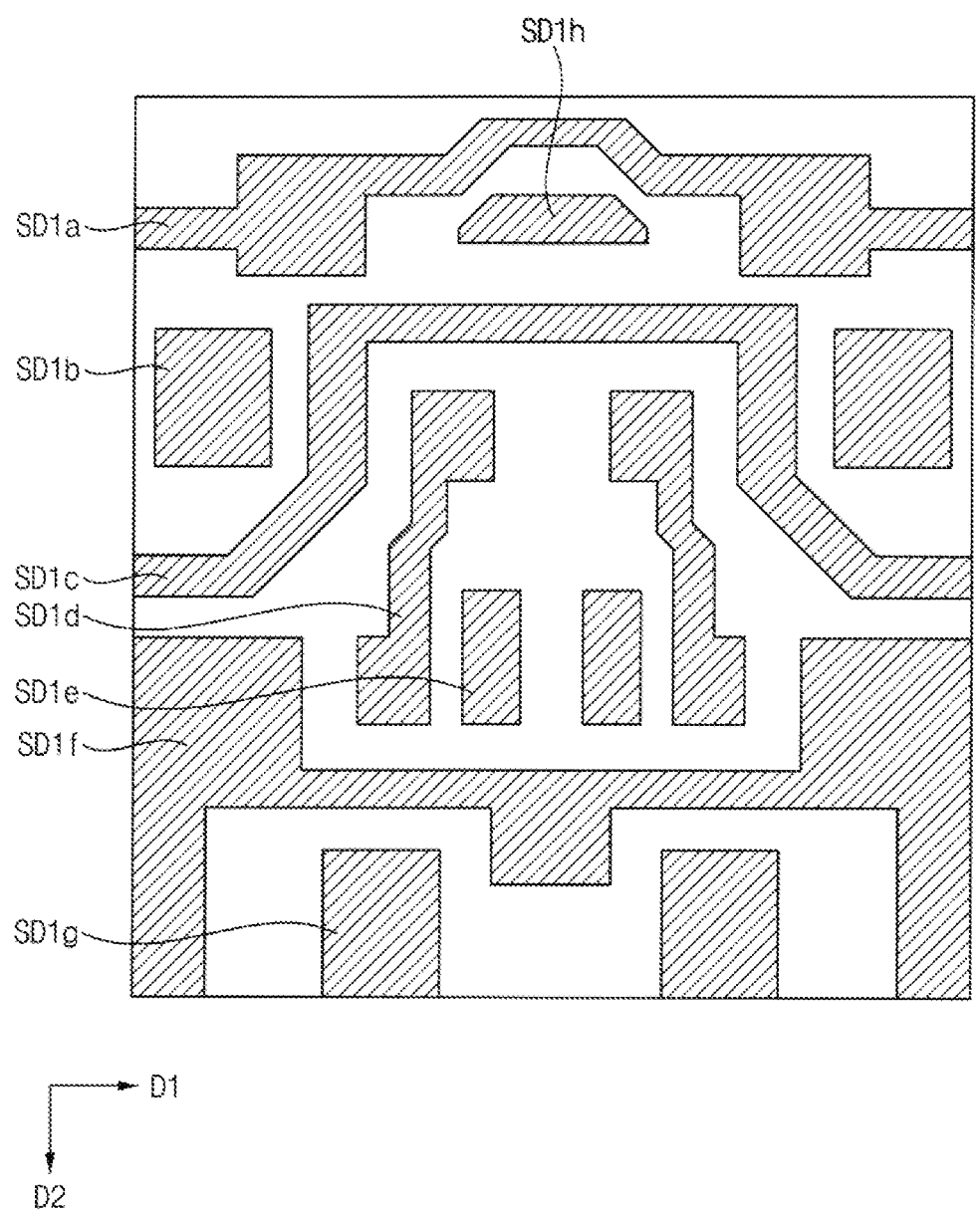

Referring to FIGS. 1, 4, and 29, the second active pattern AP2 may be disposed on the first interlayer insulating layer. The second active pattern AP2 may include an oxide semiconductor. A first active pattern AP1 and the second active pattern AP2 may include mutually different materials.

In an embodiment, the second active pattern AP2 may be disposed on a layer that is different from a layer of the first active pattern AP1. In other words, the second active pattern AP2 may be formed separately from the first active pattern AP1.

The second active pattern AP2 may continuously extend in a first pixel structure PX1 and a second pixel structure PX2. For example, the second active pattern AP2 may have a symmetrical shape based on a virtual line extending in the second direction D2 perpendicular to the first direction D1. The second active pattern AP2 may include a first extension part EXT1 and a second extension part EXT2 extending in the first direction D1. The first extension part EXT1 may be disposed on the first pixel structure PX1. The second extension part EXT2 may be disposed on the second pixel structure PX2.

In an embodiment, the second active pattern AP2 may overlap the first gate line GT1a, the second gate electrode GT1d, the third gate line GT2b, and the voltage line GT2d. In detail, the first extension part EXT1 and the second extension part EXT2 may overlap the is voltage line GT2d.

A third gate insulating layer may be disposed on the first interlayer insulating layer to cover the second active pattern AP2. The third gate insulating layer may include an insulating material.

Referring to FIGS. 1, 4, 30, and 31, a third conductive pattern may be disposed on the third gate insulating layer. The third conductive pattern may include a fourth gate line GT3a, a fifth gate line GT3b, and a first transmission pattern GT3c.

The fourth gate line GT3a may extend in the first direction D1. The fourth gate line GT3a may overlap the second gate electrode GT1d and the second active pattern AP2. The second gate electrode GT1d may be electrically connected to the fourth gate line GT3a. For example, the second gate electrode GT1d may make contact with the fourth gate line GT3a through a contact. The third gate signal GI may be provided to the fourth gate line GT3a. The second gate electrode GT1d, the second active pattern AP2, and the fourth gate line GT3a may form the fourth transistor T4. For example, the second gate electrode GT1d may correspond to the back-gate terminal of the fourth transistor T4 described with reference to FIG. 4, and the fourth gate line GT3a may correspond to the gate terminal of the fourth transistor T4 described with reference to FIG. 4.

A length of the fourth gate line GT3a in the first direction D1 may be greater than a length of the second gate electrode GT1d in the first direction D1.

The fifth gate line GT3b may extend in the first direction D1. The fifth gate line GT3b may overlap the third gate line GT2b and the second active pattern AP2. The fifth gate line GT3b may be electrically connected to the third gate line GT2b. For example, the fifth gate line GT3b may make contact with the third gate line GT2b through a contact. The second gate signal is GC may be provided to the fifth gate line GT3b. The third gate line GT2b, the second active pattern AP2, and the fifth gate line GT3b may form the third transistor T3. For example, the third gate line GT2b may correspond to the back-gate terminal of the third transistor T3 described with reference to FIG. 4, and the fifth gate line GT3b may correspond to the gate terminal of the third transistor T3 described with reference to FIG. 4.

For example, the third conductive pattern may include a metal, a metal alloy, metal nitride, conductive metal oxide, and the like. For example, the third conductive pattern may include the same material as the first conductive pattern or the second conductive pattern.

A second interlayer insulating layer may be disposed on the third gate insulating layer to cover the third conductive pattern. The second interlayer insulating layer may include an insulating material. For example, the second interlayer insulating layer may include silicon oxide, silicon nitride, silicon oxynitride, aluminum oxide, and the like.

Referring to FIGS. 1, 4, 32, and 33, a fourth conductive pattern may be disposed on the second interlayer insulating layer. The fourth conductive pattern may include a horizontal transmission line SD1a, a second transmission pattern SD1b, an anode initialization voltage line SD1c, a third transmission pattern SD1d, a fourth transmission pattern SD1e, a fifth transmission pattern SD1f, a sixth transmission pattern SD1g, and a connection pattern SD1h.

The connection pattern SD1h may be spaced apart from the horizontal transmission line SD1a. In detail, the connection pattern SD1h may be spaced apart from the horizontal transmission line SD1a in the second direction D2 crossing the first direction D1. In addition, the connection pattern SD1h may be spaced apart from the fourth gate line GT3a. The connection pattern SD1h may be disposed between the horizontal transmission line SD1a and the fourth gate line GT3a when viewed in a plan view. The connection pattern SD1h may make is electrical contact with the second active pattern AP2 and the voltage line GT2d. In detail, the connection pattern SD1h may make contact with the second active pattern AP2 and the voltage line GT2d through a contact CNT.

Figure 34:
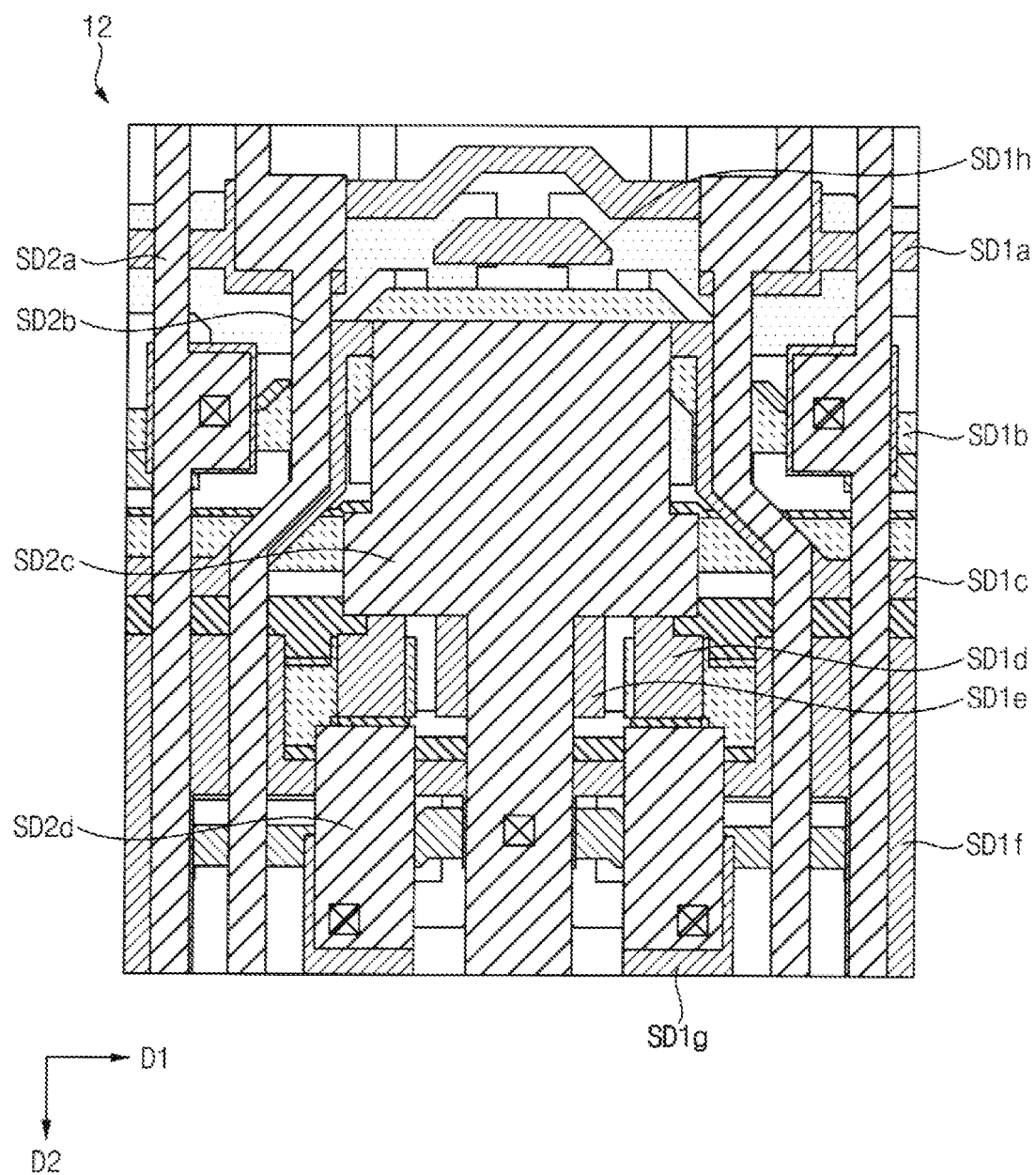

Referring to FIGS. 1, 4, and 34, a fifth conductive pattern may be disposed on a first via insulating layer. The fifth conductive pattern may include a data line SD2a, a vertical transmission line SD2b, a high power supply voltage line SD2c, and a seventh transmission pattern SD2d.

Figure 33:
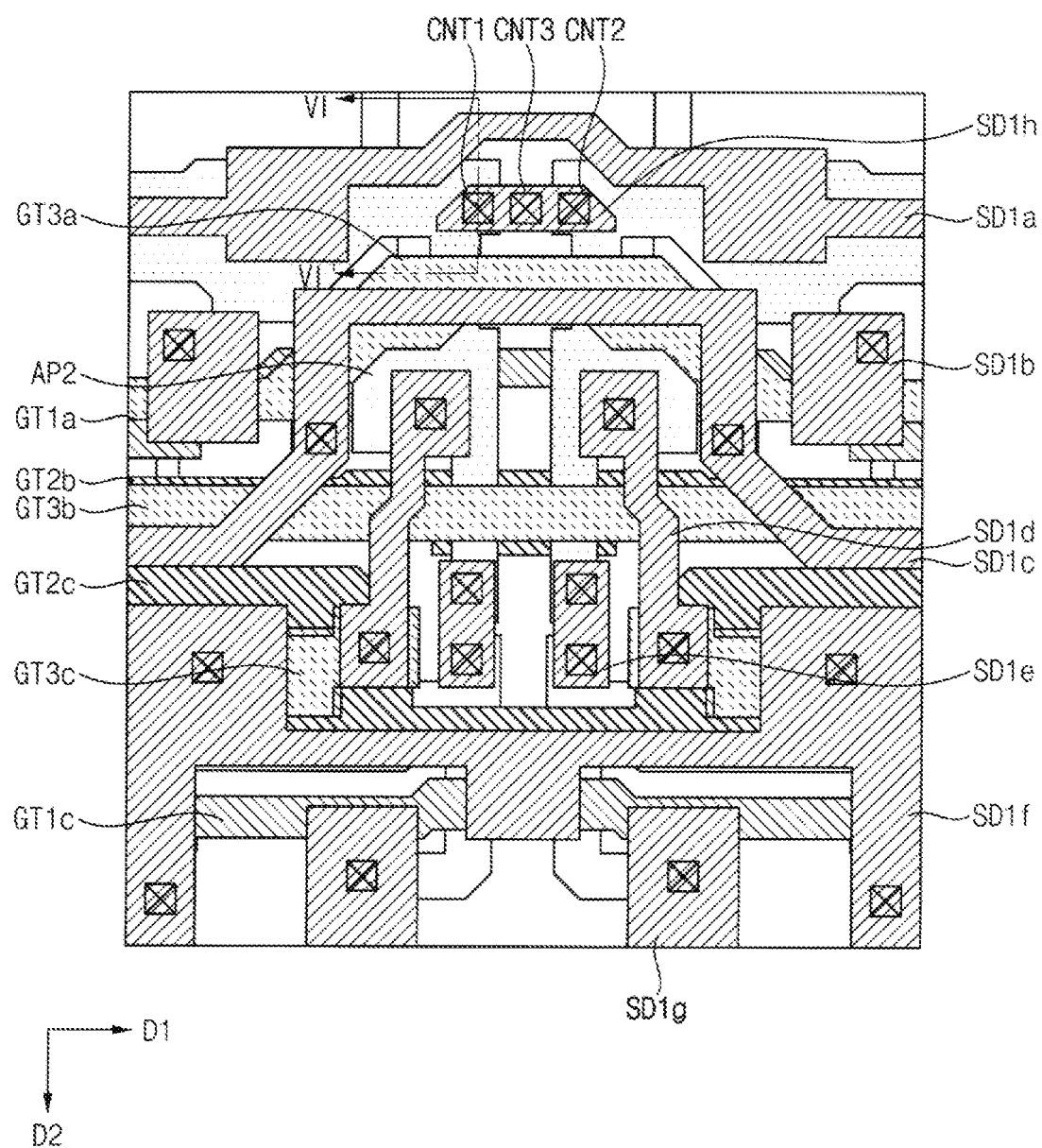
Figure 35:
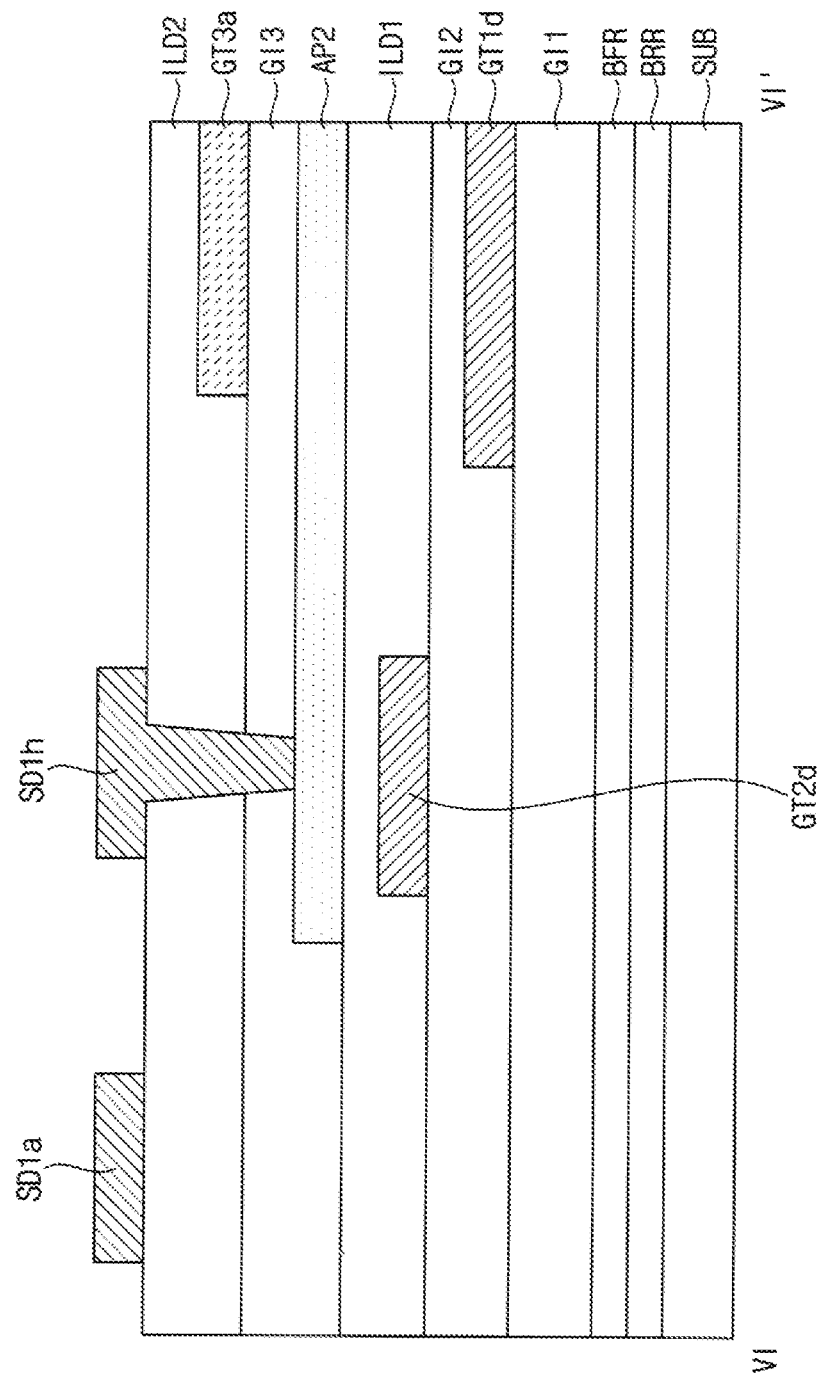
FIG. 35 is a sectional view taken along line VI-VI' of FIG. 33.

FIG. 35 is a sectional view taken along line VI-VI' of FIG. 33.

Referring to FIGS. 33 and 35, in an embodiment, the connection pattern SD1h may overlap the voltage line GT2d when viewed in a plan view. In addition, the connection pattern SD1h may overlap a part of the second active pattern AP2. The voltage line GT2d may overlap the first extension part EXT1 and the second extension part EXT2 of the second active pattern AP2 (see FIG. 29).

In an embodiment, the connection pattern SD1*h* may include a first contact CNT1 and a second contact CNT2. The connection pattern SD1*h* may make contact with the second active pattern AP2 through each of the first contact CNT1 and the second contact CNT2. In an embodiment, the connection pattern SD1*h* may further include a third contact CNT3. The connection pattern SD1*h* may make contact with the voltage line GT2*d* through the third contact CNT3 (see FIG. 26).

In an embodiment, the connection pattern SD1*h* may be electrically connected to the voltage line GT2*d* and the second active pattern AP2. The initialization voltage VINT may be provided sequentially through the voltage line GT2*d*, the connection pattern SD1*h*, and the second active pattern AP2. Therefore, the distribution of the contact resistance values may be is reduced.

In addition, the second gate electrode GT1*d* and the fourth gate line GT3*a* may be spaced apart from the horizontal transmission line SD1*a*. The connection pattern SD1*h* may be located between the horizontal transmission line SD1*a* and the fourth gate line GT3*a*. The connection pattern SD1*h* may be located between the horizontal transmission line SD1*a* and the second gate electrode GT1*d*. Therefore, the connection pattern SD may prevent a coupling phenomenon that may occur between the horizontal transmission line SD1*a* and the fourth gate line GT3*a*.

FIGS. 36 to 41 are layout diagrams for describing pixel structures included in a display device according to one embodiment. Since components of pixel structures of a display device 13 that will be described with reference to FIGS. 36 to 41, which are the same as the components of the pixel structures of the display device 10 described with reference to FIGS. 5 to 15, have been described above, descriptions thereof will be omitted below for ease in explanation of these figures.

Figure 36:
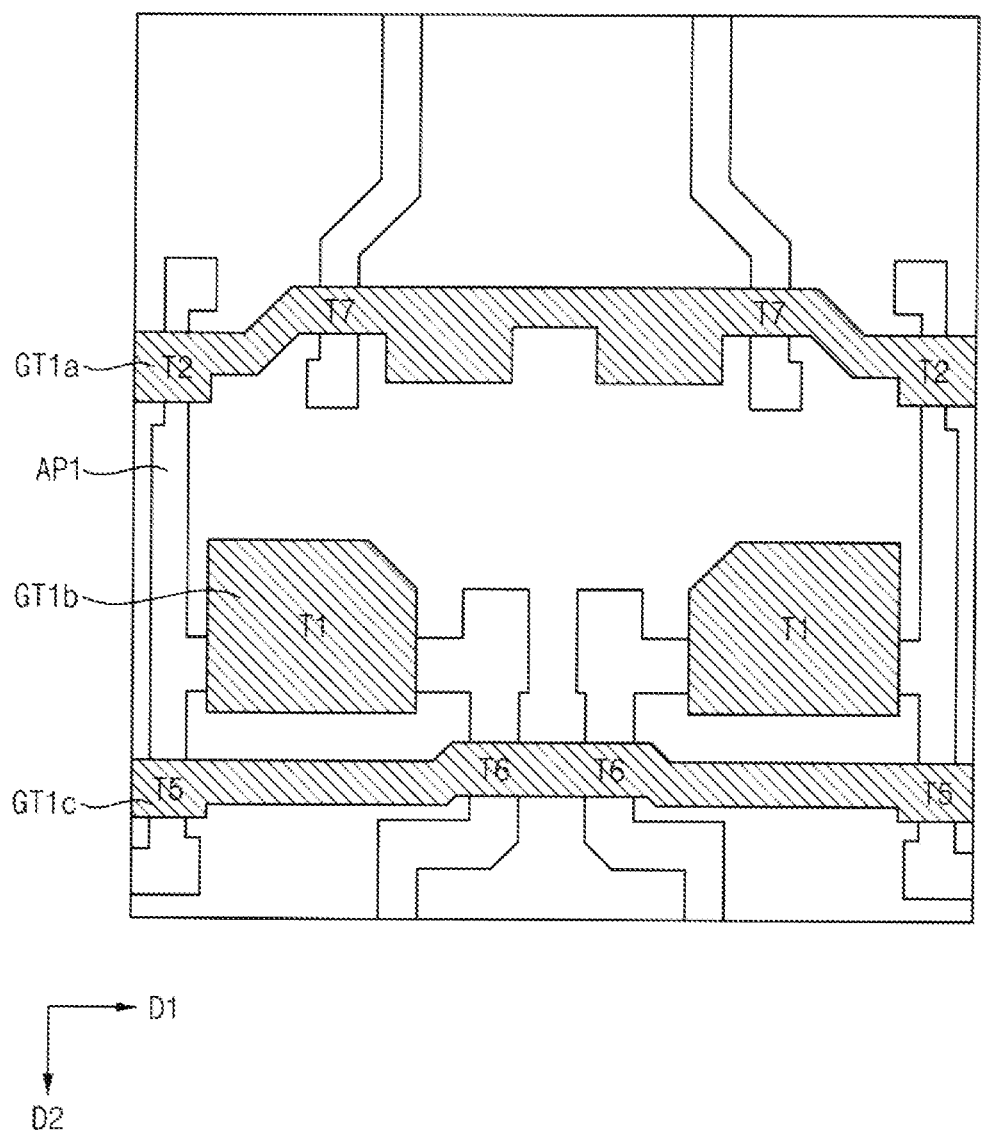
FIGS. 36, 37, 38, 39, 40, and 41 are layout diagrams for describing pixel structures included in a display device according to one embodiment.

Referring to FIGS. 1, 4, and 36, a first conductive pattern may be disposed on a first gate insulating layer. The first conductive pattern may include a first gate line GT1*a*, a first gate electrode GT1*b*, and a second gate line GT1*c*.

A second gate insulating layer may be disposed on the first gate insulating layer to cover the first conductive pattern. The second gate insulating layer may include an insulating material.

Figure 37:
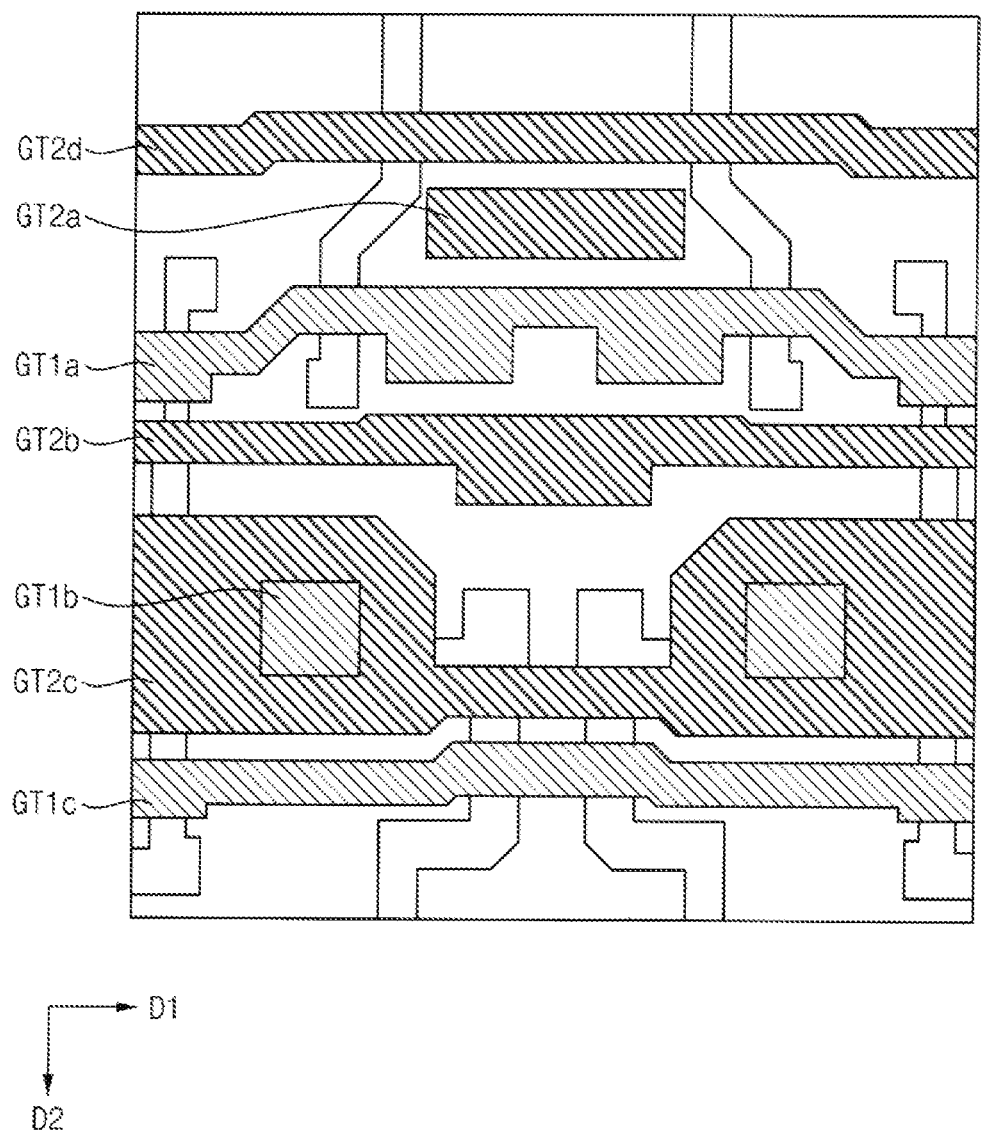

Referring to FIGS. 1, 4, and 37, a second conductive pattern may be disposed on the second gate insulating layer. The second conductive pattern may include a second gate electrode GT2*a*, a third gate line GT2*b*, a storage capacitor electrode GT2*c*, and a voltage line is GT2*d*.

The second gate electrode GT2*a* may overlap a second active pattern AP2 and a fourth gate line GT3*a*, which will be described below. The second gate electrode GT2*a* may be electrically connected to the fourth gate line GT3*a*.

A first interlayer insulating layer may be disposed on the second gate insulating layer to cover the second conductive pattern.

Figure 38:
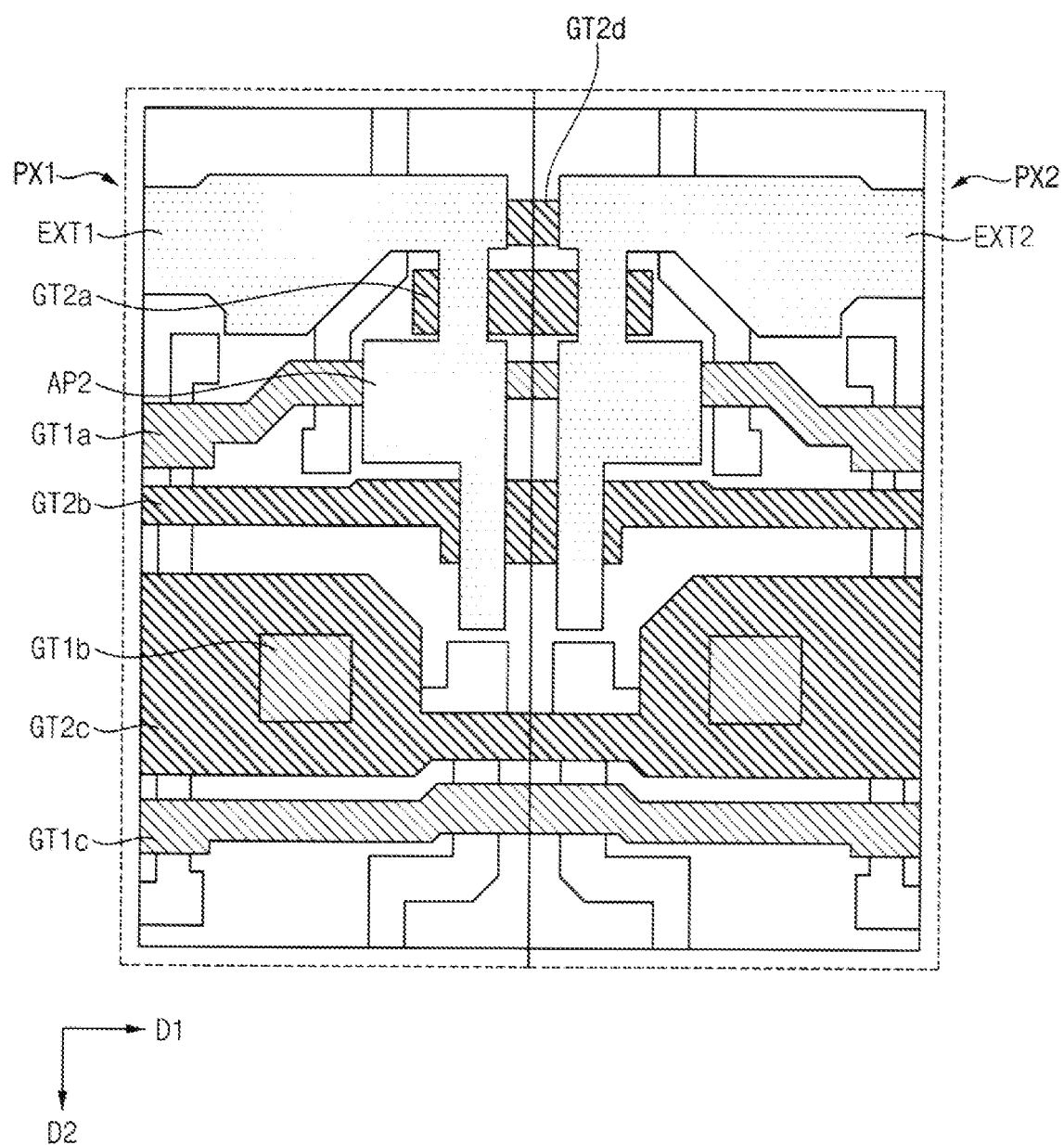

Referring to FIGS. 1, 4, and 38, the second active pattern AP2 may be disposed on the first interlayer insulating layer. The second active pattern AP2 may include an oxide semiconductor. A first active pattern AP1 may include a silicon semiconductor. The first active pattern AP1 and the second active pattern AP2 may include mutually different materials. In an embodiment, the second active pattern AP2 may be disposed on a layer that is different from a layer of the first active pattern AP1. In other words, the second active pattern AP2 may be formed separately from the first active pattern AP1.

In an embodiment, the second active pattern AP2 may have a symmetrical shape based on a virtual line extending in the second direction D2 perpendicular to the first direction D1. The second active pattern AP2 may include a first extension part EXT1 and a second extension part EXT2 extending in the first direction D1. The first extension part EXT1 may be disposed on a first pixel structure PX1. The second extension part EXT2 may be disposed on a second pixel structure PX2.

In an embodiment, the second active pattern AP2 may overlap the first gate line GT1*a*, the second gate electrode GT2*a*, the third gate line GT2*b*, and the voltage line GT2*d*. In detail, the first extension part EXT1 and the second extension part EXT2 may overlap the voltage line GT2*d*.

A third gate insulating layer may be disposed on the first interlayer insulating layer to cover the second active pattern AP2. The third gate insulating layer may include an insulating material.

Figure 39:
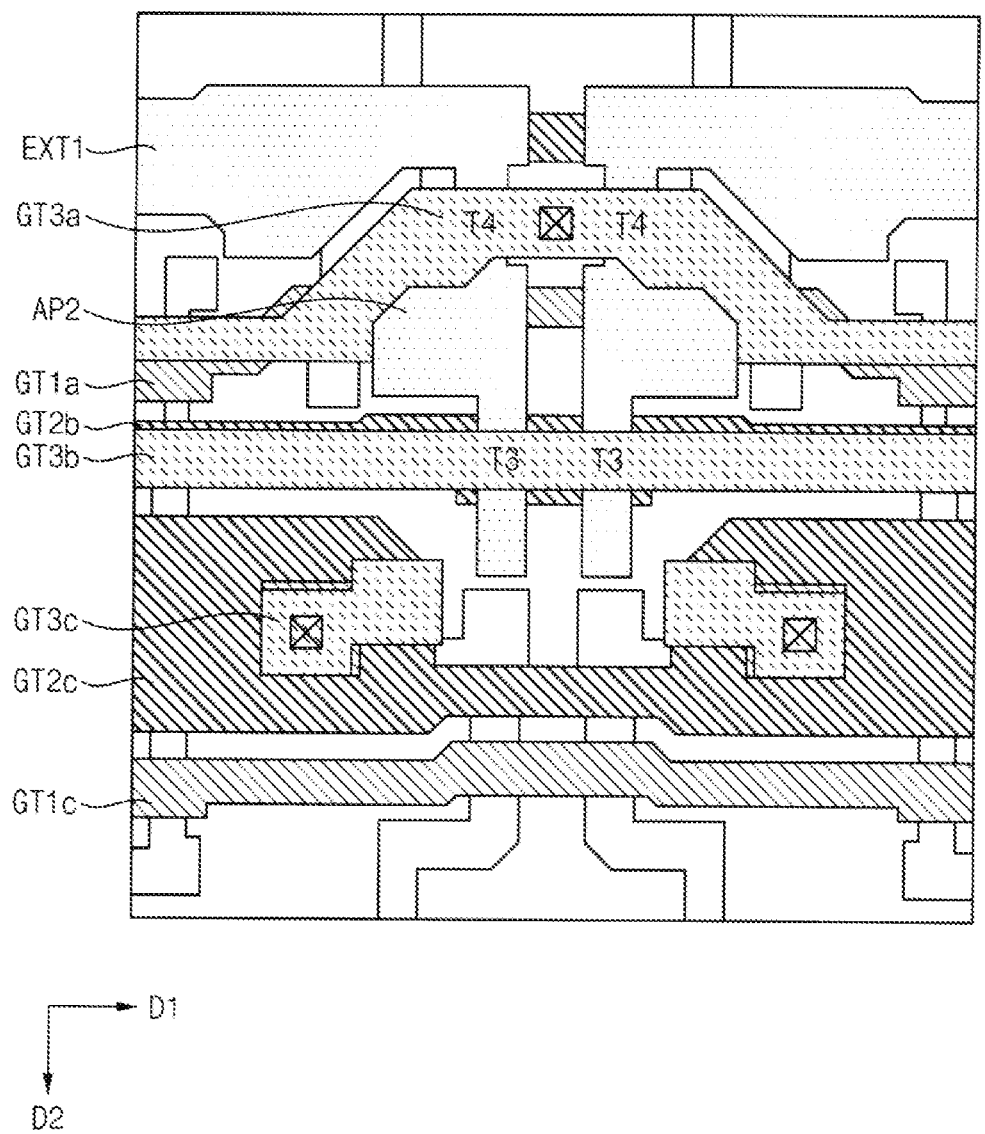

Referring to FIGS. 1, 4, and 39, a third conductive pattern may be disposed on the third gate insulating layer. The third conductive pattern may include a fourth gate line GT3*a*, a fifth gate line GT3*b*, and a first transmission pattern GT3*c*.

The fourth gate line GT3*a* may extend in the first direction D1. The fourth gate line GT3*a* may overlap the second gate electrode GT2*a* and the second active pattern AP2. The second gate electrode GT2*a* may be electrically connected to the fourth gate line GT3*a*. For example, the second gate electrode GT2*a* may make contact with the fourth gate line GT3*a* through a contact. The third gate signal GI may be provided to the fourth gate line GT3*a*. The second gate electrode GT2*a*, the second active pattern AP2, and the fourth gate line GT3*a* may form the fourth transistor T4. For example, the second gate electrode GT2*a* may correspond to the back-gate terminal of the fourth transistor T4 described with reference to FIG. 4, and the fourth gate line GT3*a* may correspond to the gate terminal of the fourth transistor T4 described with reference to FIG. 4.

A length of the fourth gate line GT3*a* in the first direction D1 may be greater than a length of the second gate electrode GT2*a* in the first direction D1.

The fifth gate line GT3*b* may extend in the first direction D1. The fifth gate line GT3*b* may overlap the third gate line GT2*b* and the second active pattern AP2. The fifth gate line GT3*b* may be electrically connected to the third gate line GT2*b*. For example, the fifth gate line GT3*b* may make contact with the third gate line GT2*b* through a contact. The second gate signal GC may be provided to the fifth gate line GT3*b*. The third gate line GT2*b*, the second active is pattern AP2, and the fifth gate line GT3*b* may form the third transistor T3.

For example, the third conductive pattern may include a metal, a metal alloy, metal nitride, conductive metal oxide, and the like. For example, the third conductive pattern may include the same material as the first conductive pattern or the second conductive pattern.

A second interlayer insulating layer may be disposed on the third gate insulating layer to cover the third conductive pattern. The second interlayer insulating layer may include an insulating material. For example, the second interlayer insulating layer may include silicon oxide, silicon nitride, silicon oxynitride, aluminum oxide, and the like.

Figure 40:
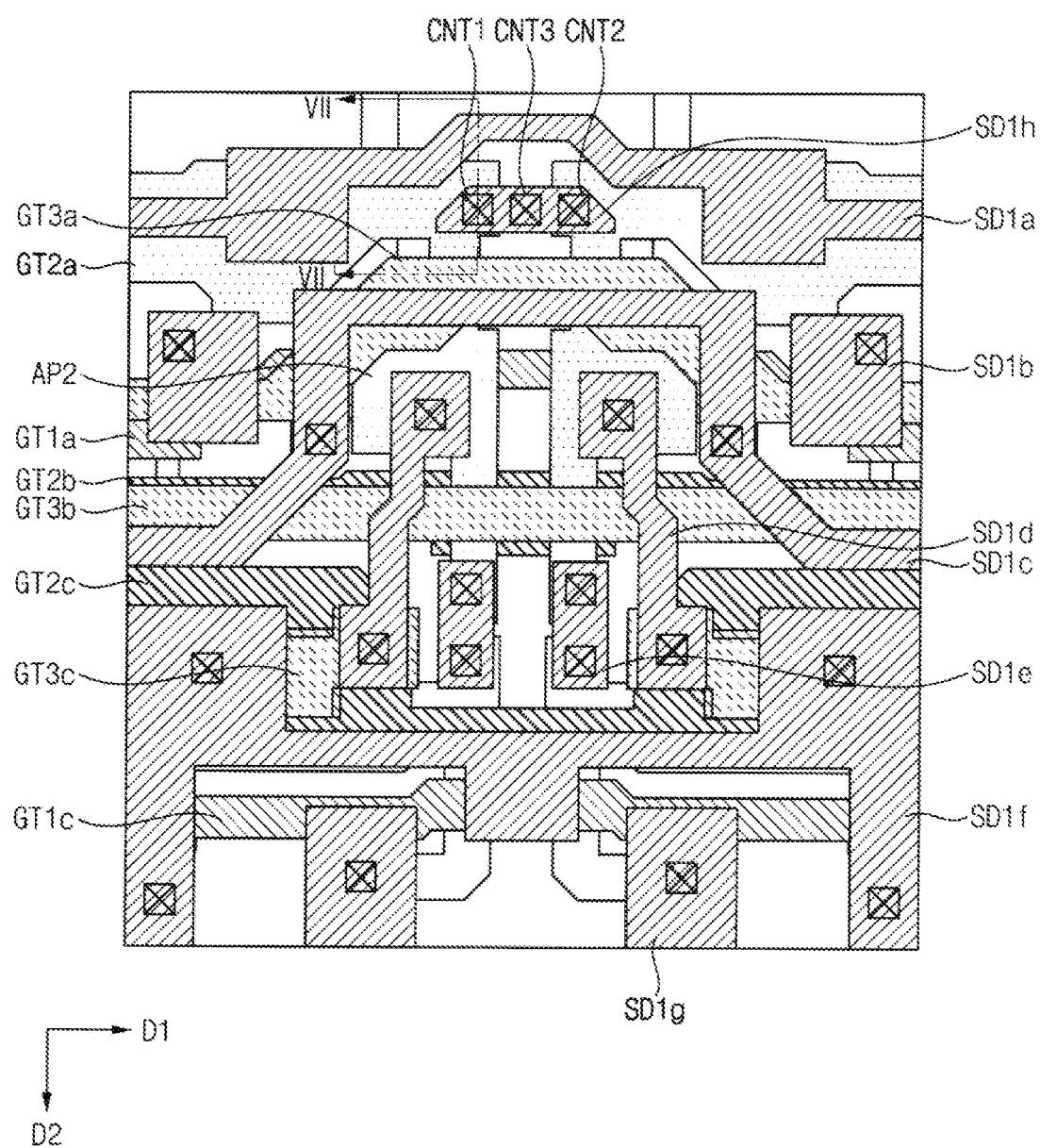

Referring to FIGS. 1, 4, and 40, a fourth conductive pattern may be disposed on the second interlayer insulating layer. The fourth conductive pattern may include a horizontal transmission line SD1*a*, a second transmission pattern SD1*b*, an anode initialization voltage line SD1*c*, a third transmission pattern SD1*d*, a fourth transmission pattern SD1e, a fifth transmission pattern SD1f, a sixth transmission pattern SD1g, and a connection pattern SD1h.

The connection pattern SD1h may be spaced apart from the horizontal transmission line SD1a. In addition, the connection pattern SD1h may be spaced apart from the fourth gate line GT3a. The connection pattern SD1h may be disposed between the horizontal transmission line SD1a and the fourth gate line GT3a when viewed in a plan view. The connection pattern SD1h may make electrical contact with the second active pattern AP2 and the voltage line GT2d. In detail, the connection pattern SD1h may make contact with the second active pattern AP2 and the voltage line GT2d through a contact CNT.

Figure 41:
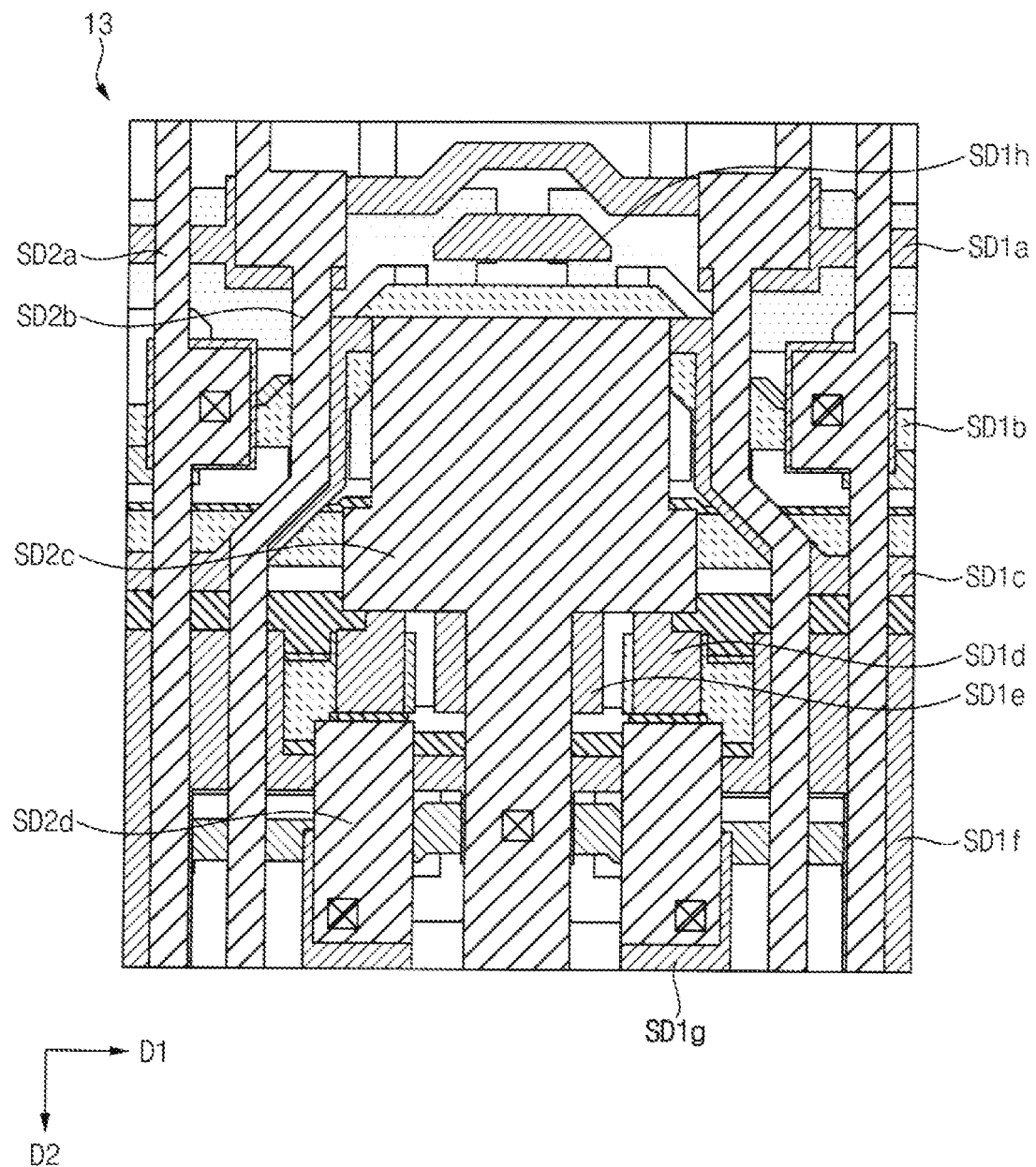

Referring to FIGS. 1, 4, and 41, a fifth conductive pattern may be disposed on a first via insulating layer. The fifth conductive pattern may include a data line SD2a, a vertical transmission line SD2b, a high power supply voltage line SD2c, and a seventh transmission is pattern SD2d.

Figure 42:
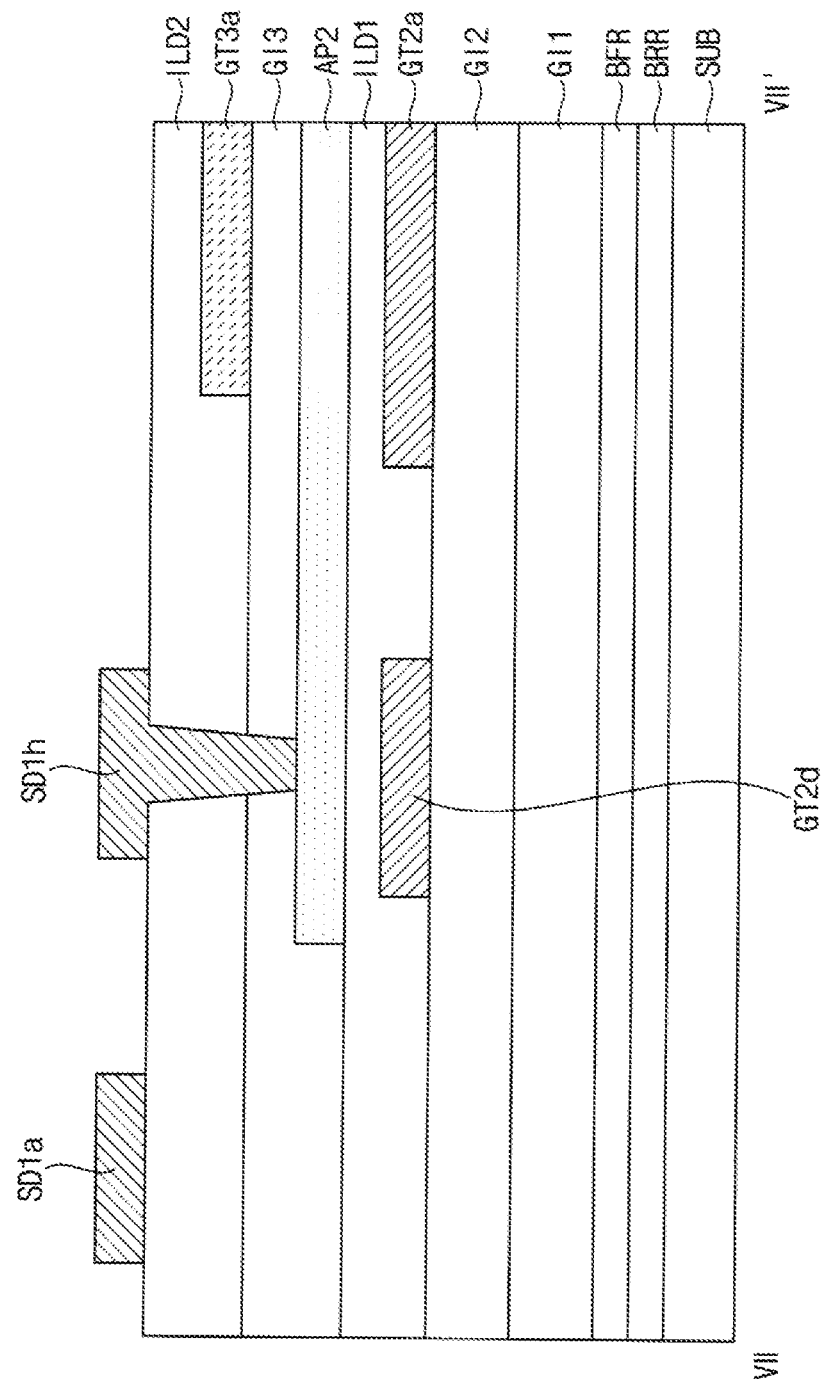
FIG. 42 is a sectional view taken along line VII-VII' of FIG. 40.

FIG. 42 is a sectional view taken along line VII-VII' of FIG. 40.

Referring to FIGS. 40 and 42, in an embodiment, the connection pattern SD1h may overlap the voltage line GT2d when viewed in a plan view. In addition, the connection pattern SD1h may overlap a part of the second active pattern AP2. The voltage line GT2d may overlap the first extension part EXT1 and the second extension part EXT2 of the second active pattern AP2 (see FIG. 38).

In an embodiment, the connection pattern SD1h may include a first contact CNT1 and a second contact CNT2. The connection pattern SD1h may make contact with the second active pattern AP2 through each of the first contact CNT1 and the second contact CNT2. In an embodiment, the connection pattern SD1h may further include a third contact CNT3. The connection pattern SD1h may make contact with the voltage line GT2d through the third contact CNT3 (see FIG. 26).

In an embodiment, the connection pattern SD1h may be electrically connected to the voltage line GT2d and the second active pattern AP2. The initialization voltage VINT may be provided sequentially through the voltage line GT2d, the connection pattern SD1h, and the second active pattern AP2. Therefore, the distribution of the contact resistance values may be reduced.

In addition, the second gate electrode GT2a and the fourth gate line GT3a may be spaced apart from the horizontal transmission line SD1a. The connection pattern SD1h may be located between the horizontal transmission line SD1a and the fourth gate line GT3a. Therefore, the connection pattern SD1h may prevent a coupling phenomenon that may occur between the horizontal transmission line SD1a and the fourth gate line GT3a.

FIGS. 43 to 51 are layout diagrams for describing pixel structures included in a display device according to one embodiment. Since components of pixel structures of a display device 14 that will be described with reference to FIGS. 43 to 51, which are the same as the components of the pixel structures of the display device 10 described with reference to FIGS. 5 to 15, have been described above, descriptions thereof will be omitted below for ease in explanation of these figures.

Figure 43:
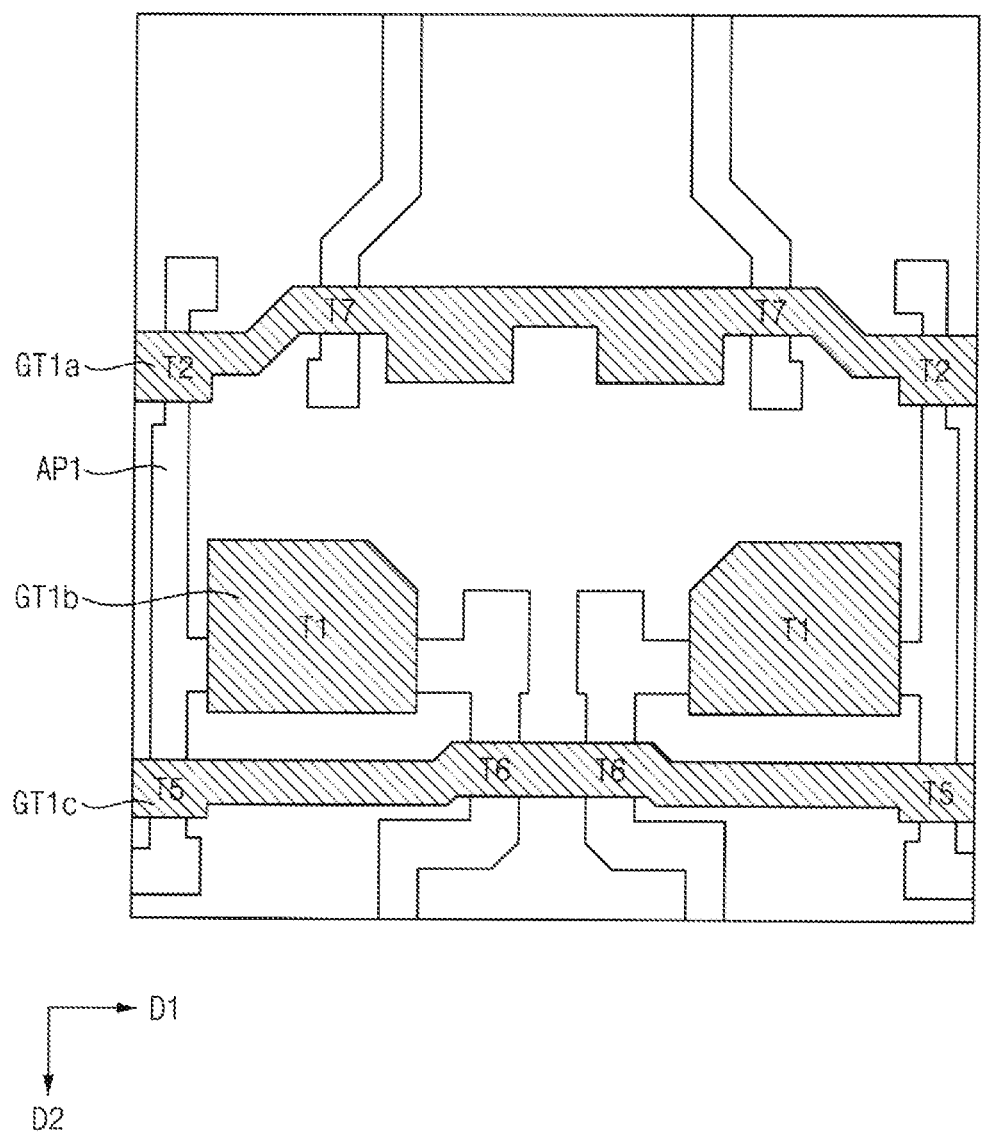
FIGS. 43, 44, 45, 46, 47, 48, 49, 50, and 51 are layout diagrams for describing pixel structures included in a display device according to one embodiment.

Referring to FIGS. 1, 4, and 43, a first conductive pattern may be disposed on a first gate insulating layer. The first conductive pattern may include a first gate line GT1a, a first gate electrode GT1b, and a second gate line GT1c.

A second gate insulating layer may be disposed on the first gate insulating layer to cover the first conductive pattern.

Figure 44:
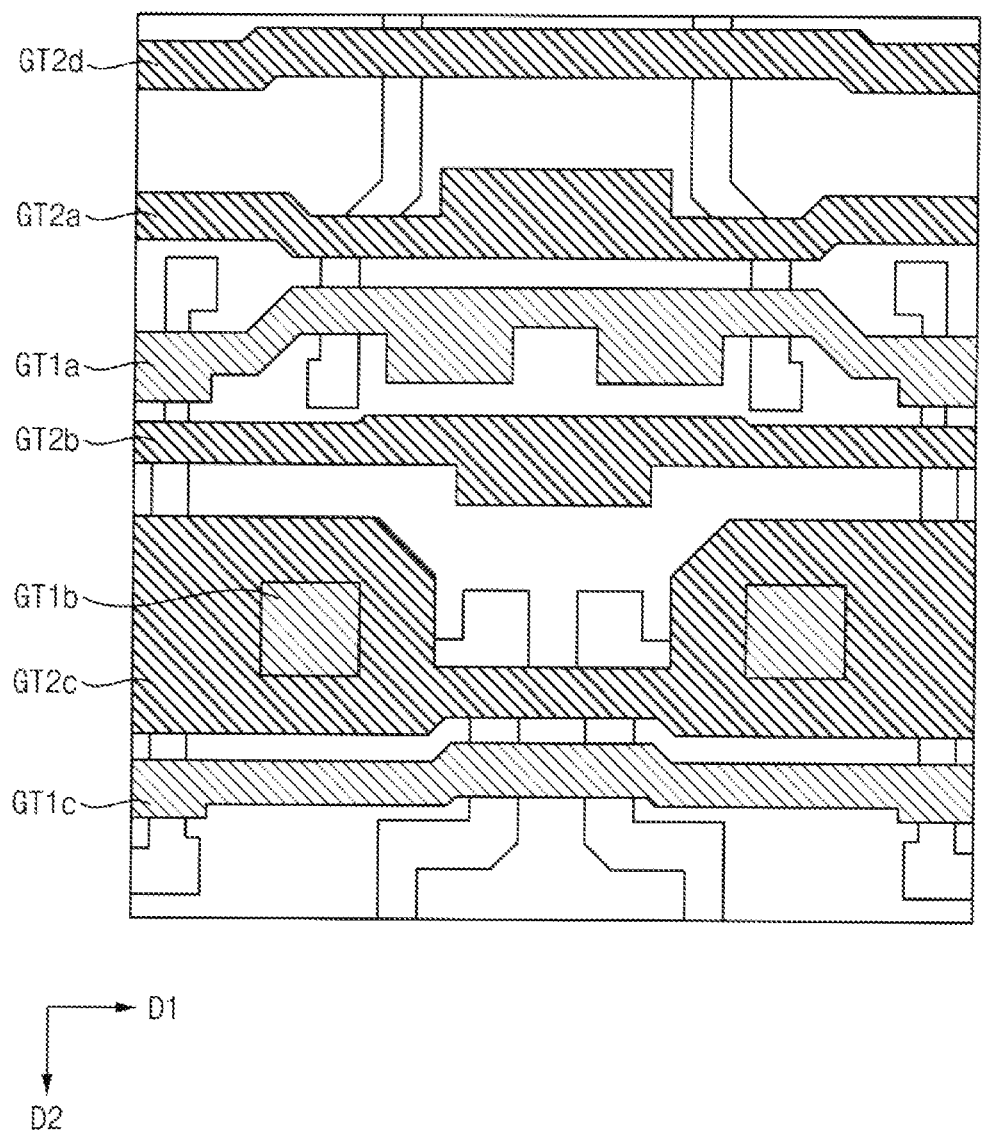

Referring to FIGS. 1, 4, and 44, a second conductive pattern may be disposed on the second gate insulating layer. The second conductive pattern may include a third gate line GT2a, a fourth gate line GT2b, a storage capacitor electrode GT2c, and a voltage line GT2d.

The voltage line GT2d may extend in the first direction D1. In an embodiment, the initialization voltage VINT may be provided to the voltage line GT2d. The voltage line GT2d may provide the initialization voltage VINT to a connection pattern SD1h that will be described below.

A first interlayer insulating layer may be disposed on the second gate insulating layer to cover the second conductive pattern.

Referring to FIGS. 1, 4, 45, and 46, a second active pattern AP2 may be disposed on the first interlayer insulating layer. The second active pattern AP2 may include an oxide semiconductor. A first active pattern AP1 may include a silicon semiconductor. The first active pattern AP1 and the second active pattern AP2 may include mutually different materials.

In an embodiment, the second active pattern AP2 may have a symmetrical shape based on a virtual line extending in the second direction D2 perpendicular to the first direction D1. The second active pattern AP2 may include a portion disposed in a first pixel structure PX1 and a portion disposed in a second pixel structure PX2.

In an embodiment, the second active pattern AP2 may overlap the first gate line GT1a, the third gate line GT2a, the fourth gate line GT2b, and the voltage line GT2d.

Figure 8:
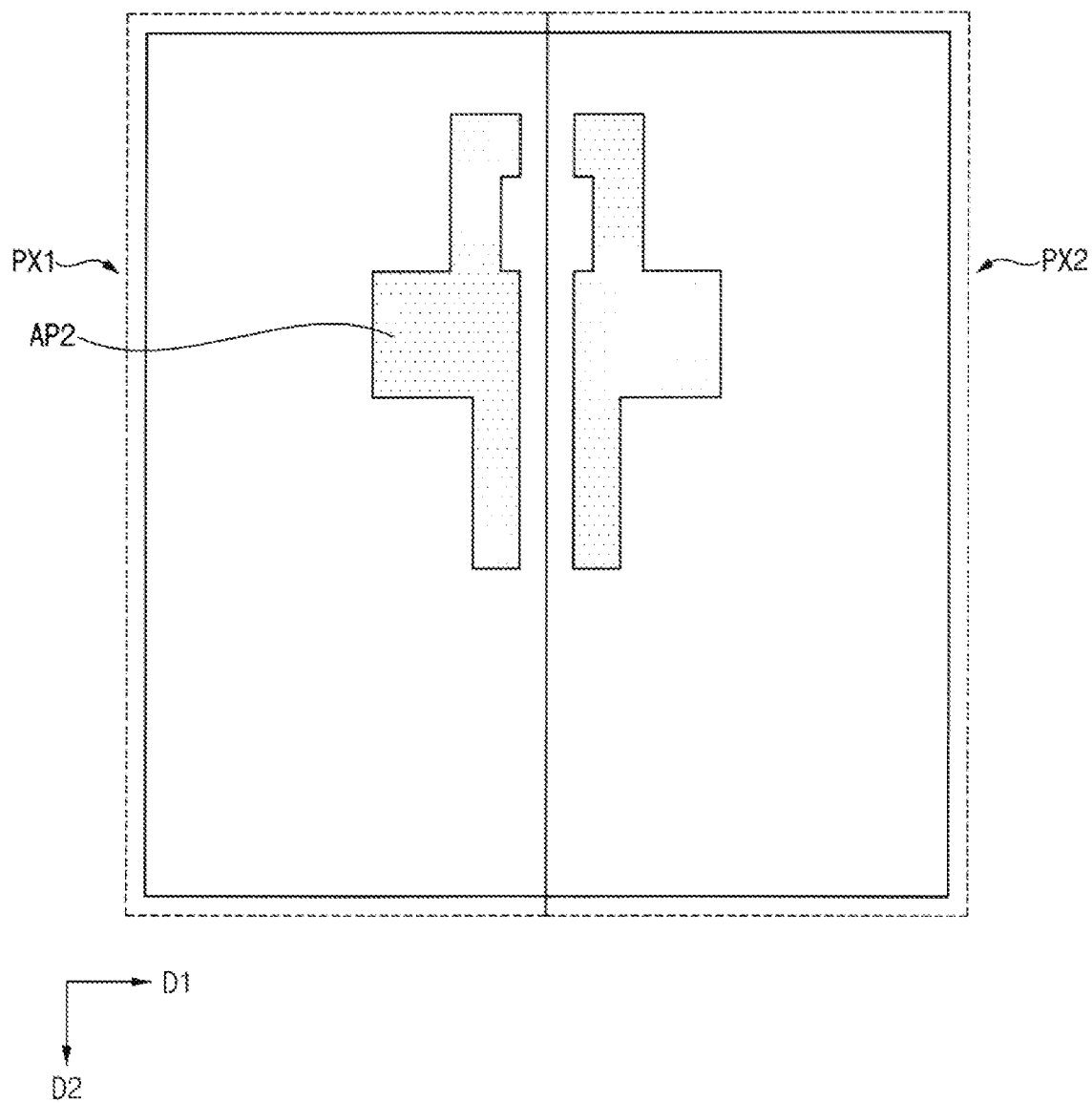
Figure 9:
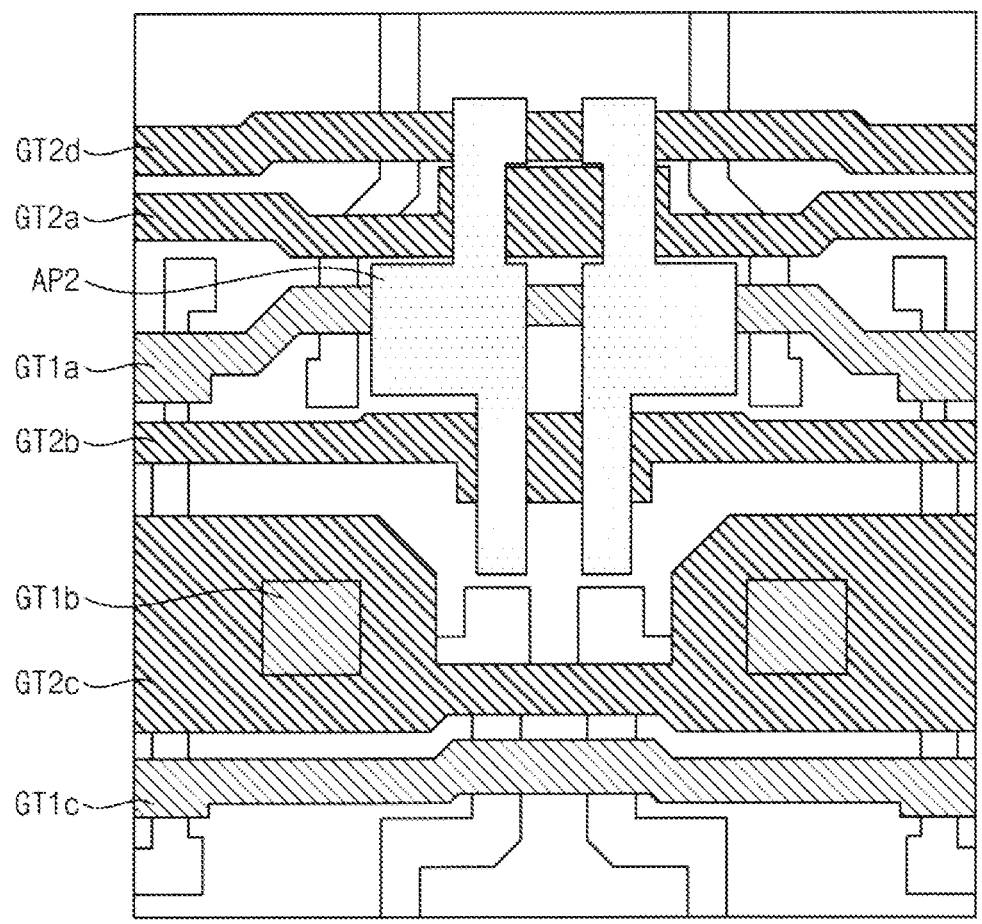
Figure 10:
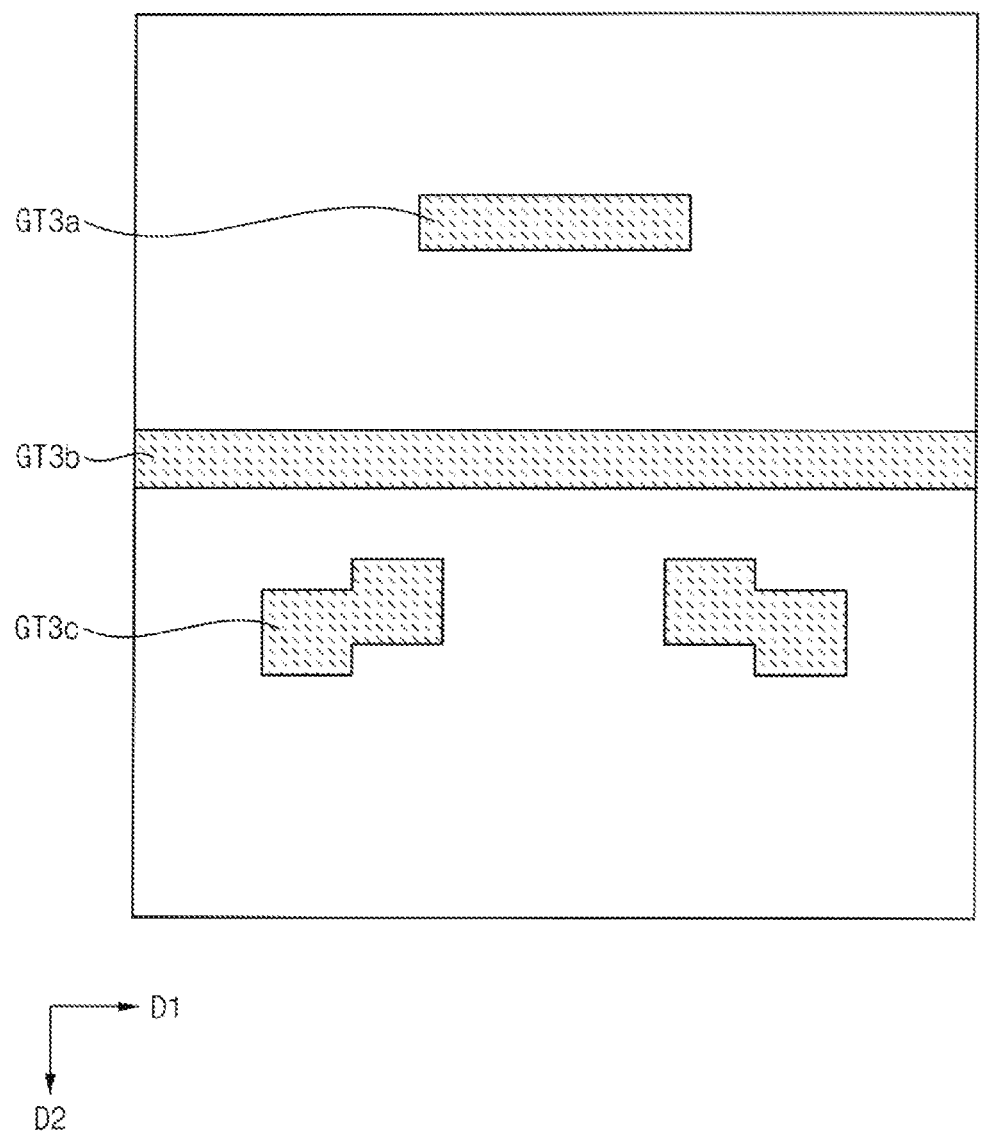
Figure 11:
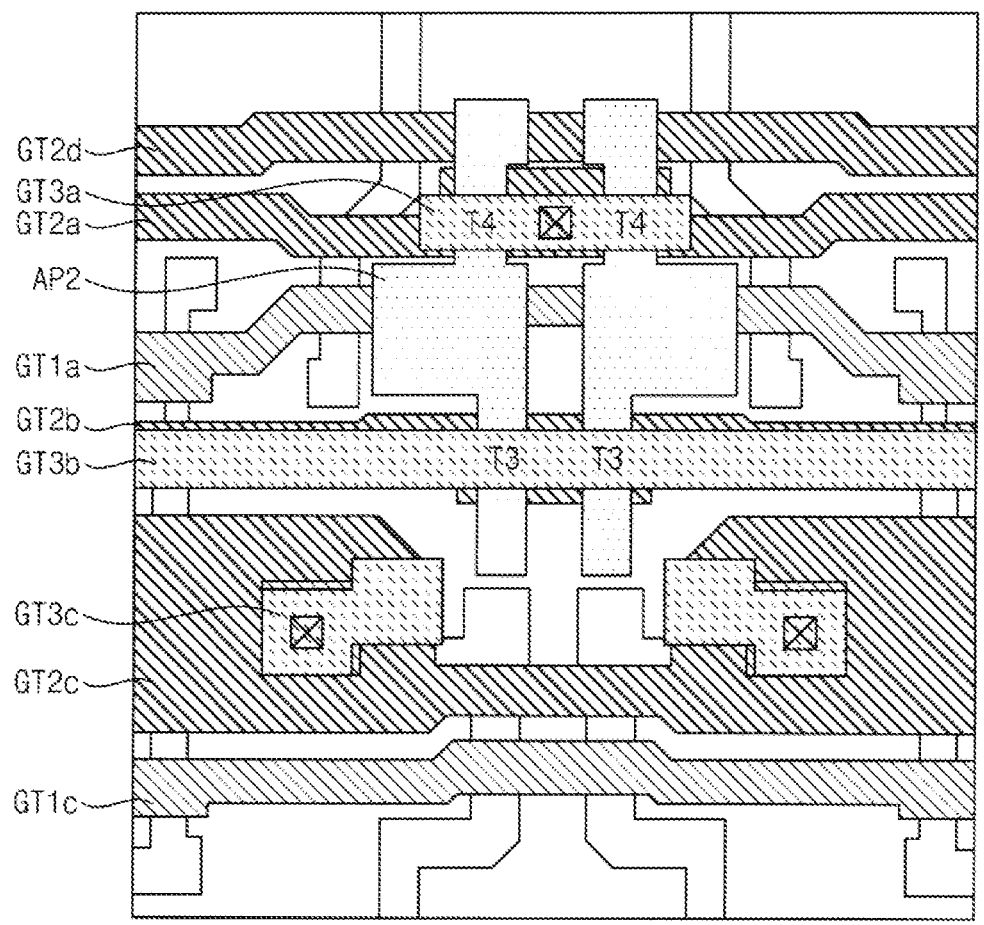
Figure 45:
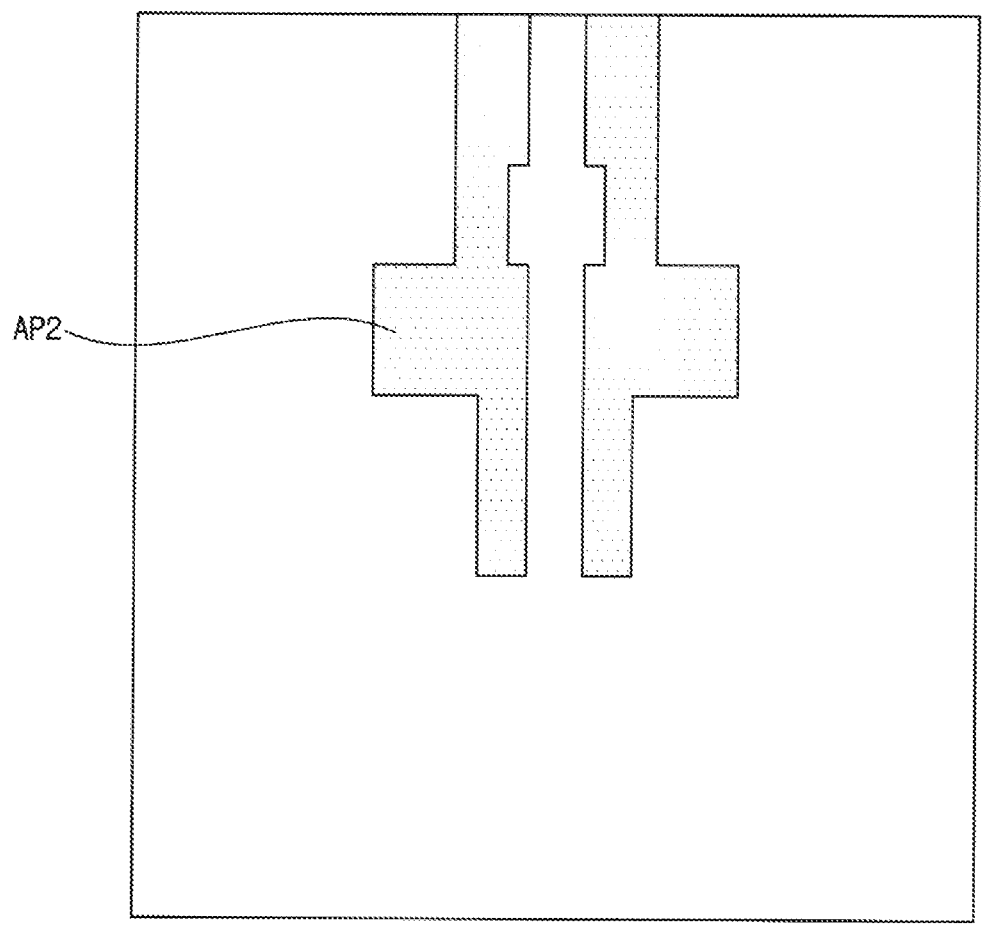
Figure 46:
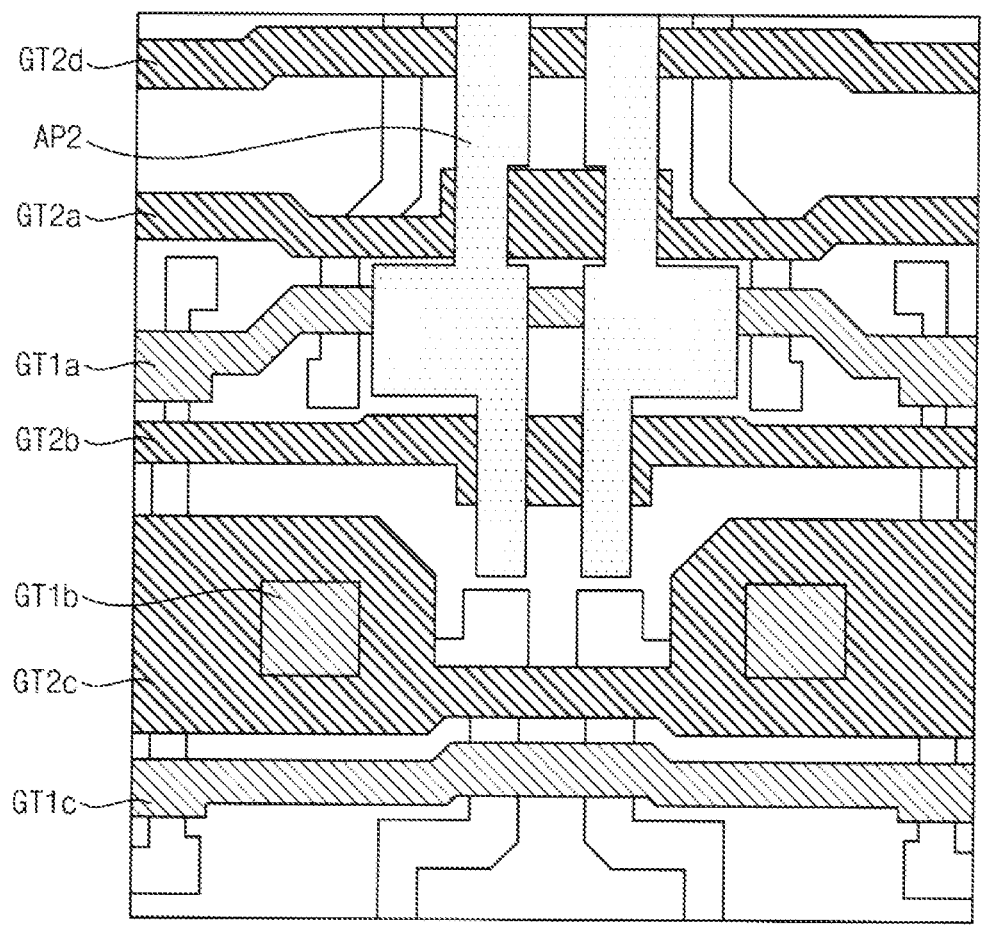
Figure 47:
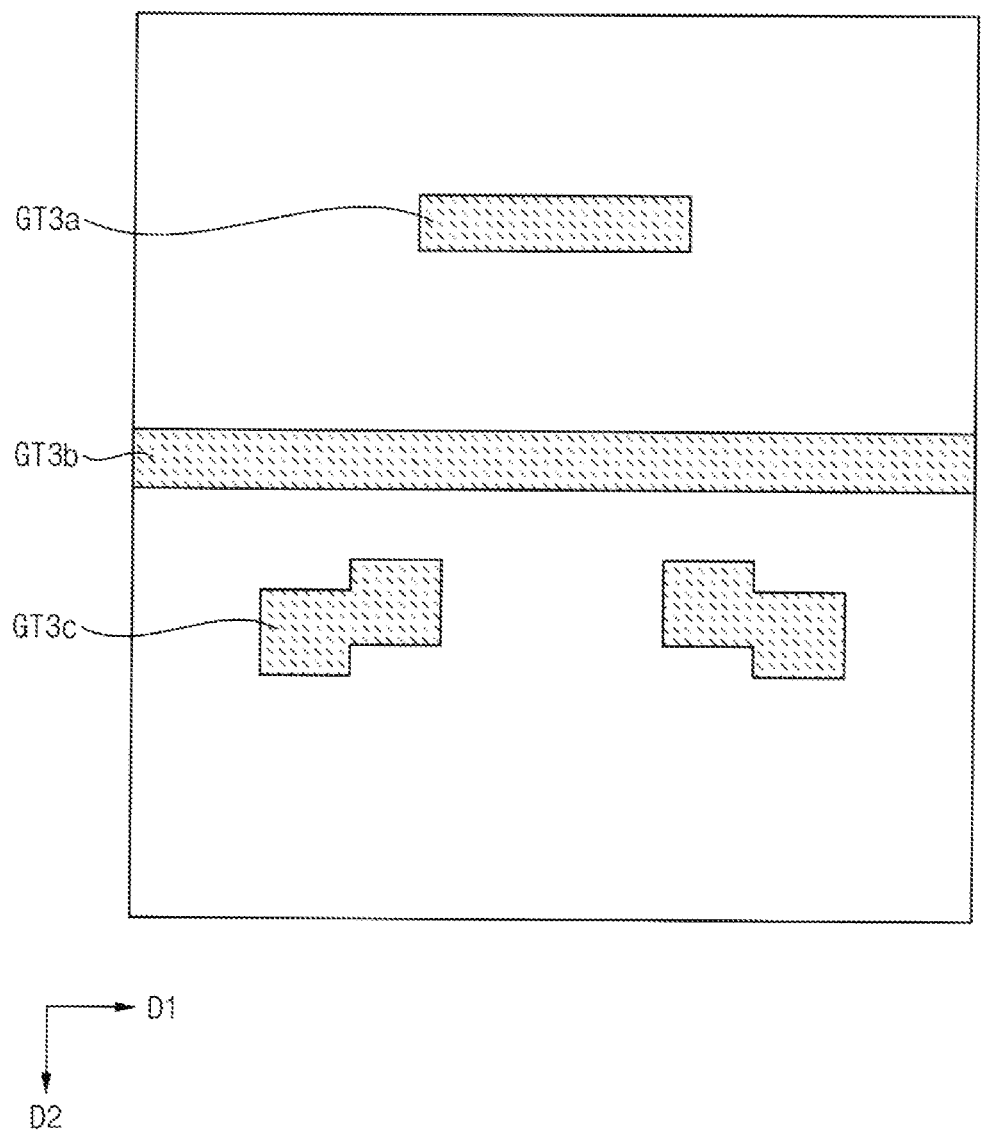
Figure 48:
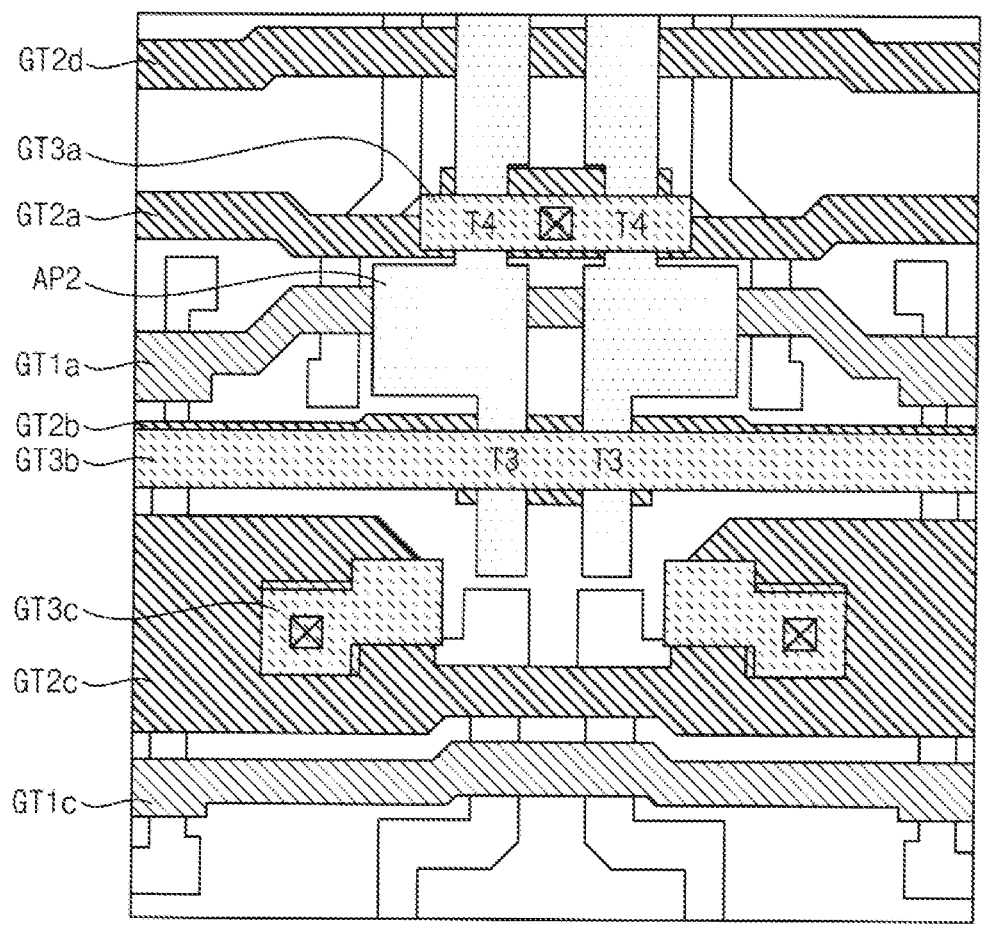
Figure 49:
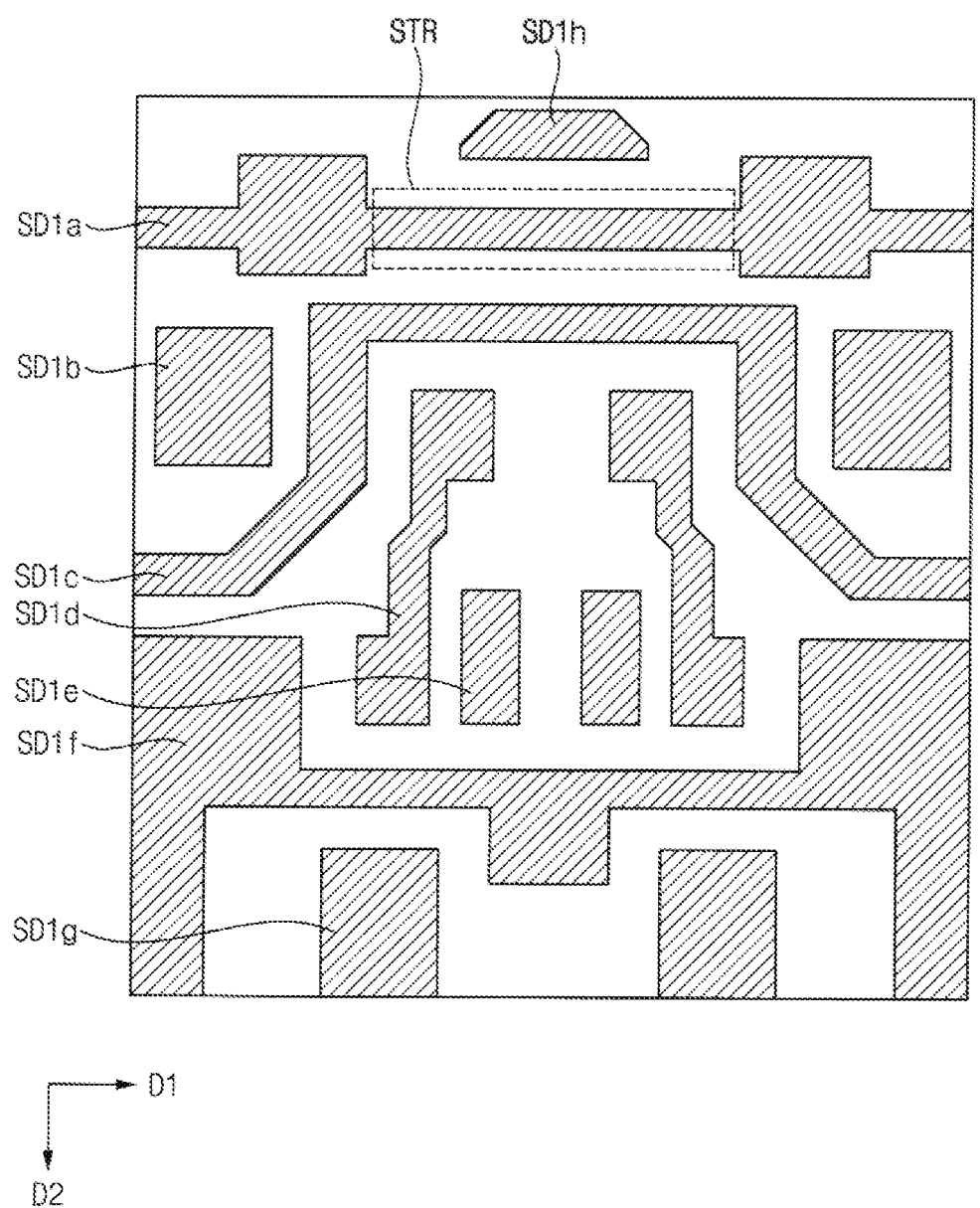

The second active pattern AP2 of FIG. 8 and the second active pattern AP2 of FIG. 45 may have mutually different shapes. A length of the second active pattern AP2 of FIG. 45 in the second direction D2 may be greater than a length of the second active pattern AP2 of FIG. 8 in the second direction D2. In addition, a distance between the voltage line GT2d and the third gate line GT2a in FIG. 46 may be greater than a distance between the voltage line GT2d and the third gate line GT2a in FIG. 9.

A third gate insulating layer may be disposed on the first interlayer insulating layer to cover the second active pattern AP2. The third gate insulating layer may include an insulating material.

Referring to FIGS. 1, 4, 47, and 48, a third conductive pattern may be disposed on the third gate insulating layer. The third conductive pattern may include a second gate electrode GT3a, a fifth gate line GT3b, and a first transmission pattern GT3c.

The second gate electrode GT3a may overlap the third gate line GT2a and the second active pattern AP2. The second gate electrode GT3a may be electrically connected to the third gate line GT2a. The third gate signal GI may be provided to the second gate electrode GT3a through the third gate line GT2a. The third gate line GT2a, the second active pattern AP2, and is the second gate electrode GT3a may form the fourth transistor T4. For example, the third gate line GT2a may correspond to the back-gate terminal of the fourth transistor T4 described with reference to FIG. 4, and the second gate electrode GT3a may correspond to the gate terminal of the fourth transistor described with reference to FIG. 4.

A length of the second gate electrode GT3a in the first direction D1 may be smaller than a length of the third gate line GT2a in the first direction D1.

A second interlayer insulating layer may be disposed on the third gate insulating layer to cover the third conductive pattern.

Referring to FIGS. 1, 4, 49, and 50, a fourth conductive pattern may be disposed on the second interlayer insulating layer. The fourth conductive pattern may include a horizontal transmission line SD1a, a second transmission pattern SD1b, an anode initialization voltage line SD1c, a third transmission pattern SD1d, a fourth transmission pattern SD1e, a fifth transmission pattern SD1f, a sixth transmission pattern SD1g, and a connection pattern SD1h.

The horizontal transmission line SD1a may extend in the first direction D1. In one pixel area, the horizontal transmission line SD1a may correspond to a horizontal extension part of the connection line described in FIG. 1. Therefore, the data voltage DATA may be provided to the horizontal transmission line SD1a. The data voltage may be transmitted to another data line that is not shown in the drawings. In another pixel area, the horizontal transmission line SD1a may be a dummy line to which the data voltage is not applied. In an embodiment, the horizontal transmission line SD1a may overlap the voltage line GT2d. For example, the voltage line GT2d may shield the horizontal transmission line SD1a.

Unlike the horizontal transmission line SD1a of FIG. 13, the horizontal transmission line SD1a may overlap the second active pattern AP2. In detail, the horizontal is transmission line SD1a of FIG. 13 may be spaced apart from the second active pattern AP2. On the contrary, a straight line part STR of the horizontal transmission line SD1a of FIG. 52 may overlap the second active pattern AP2.

The connection pattern SD1h may be spaced apart from the horizontal transmission line SD1a and the third gate line GT2a. The horizontal transmission line SD1a may be disposed between the connection pattern SD1h and the third gate line GT2a when viewed in a plan view. The connection pattern SD1h may make electrical contact with the second active pattern AP2 and the voltage line GT2d. In detail, the connection pattern SD1h may make contact with the second active pattern AP2 and the voltage line GT2d through a contact CNT.

Figure 12:
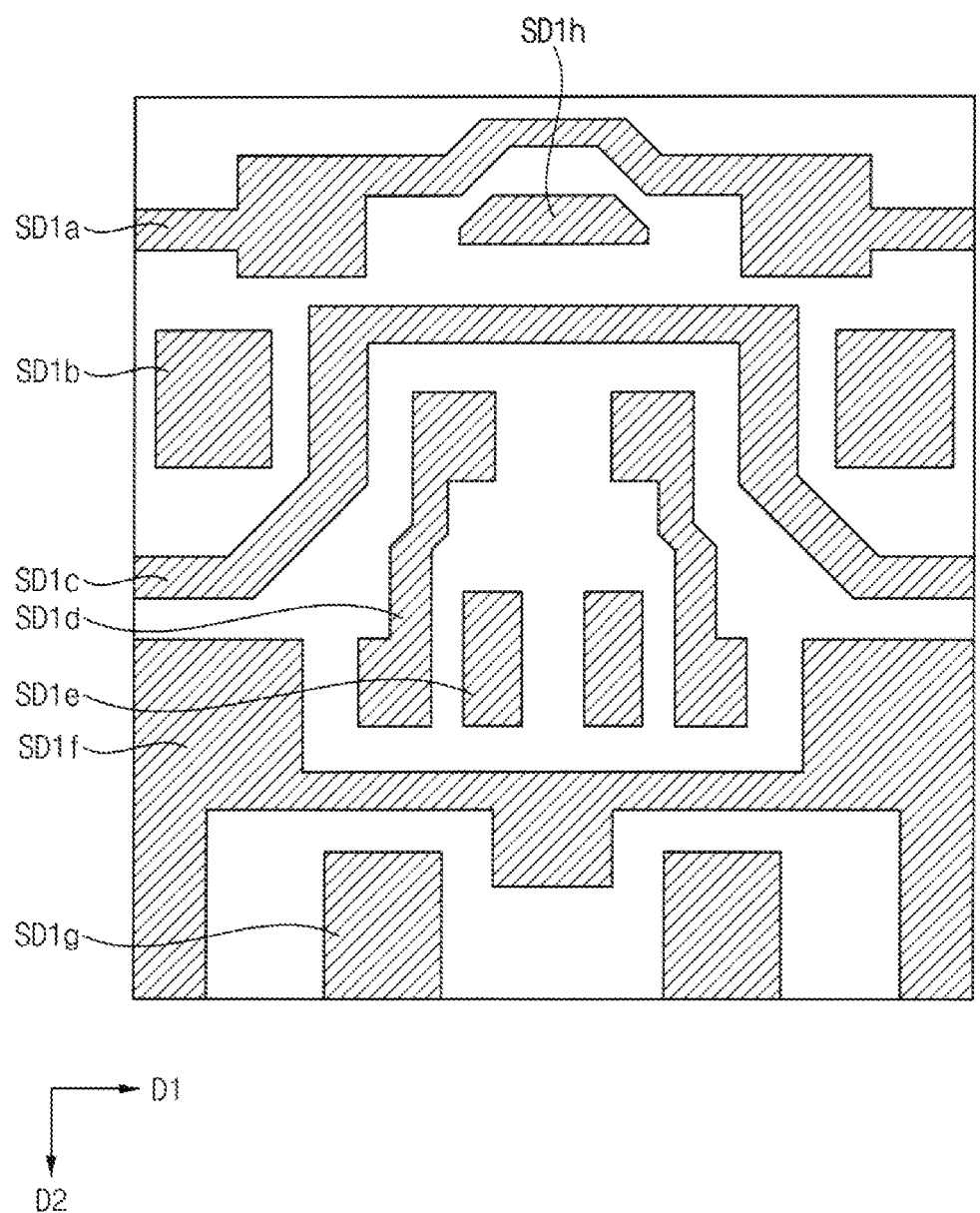
Figure 50:
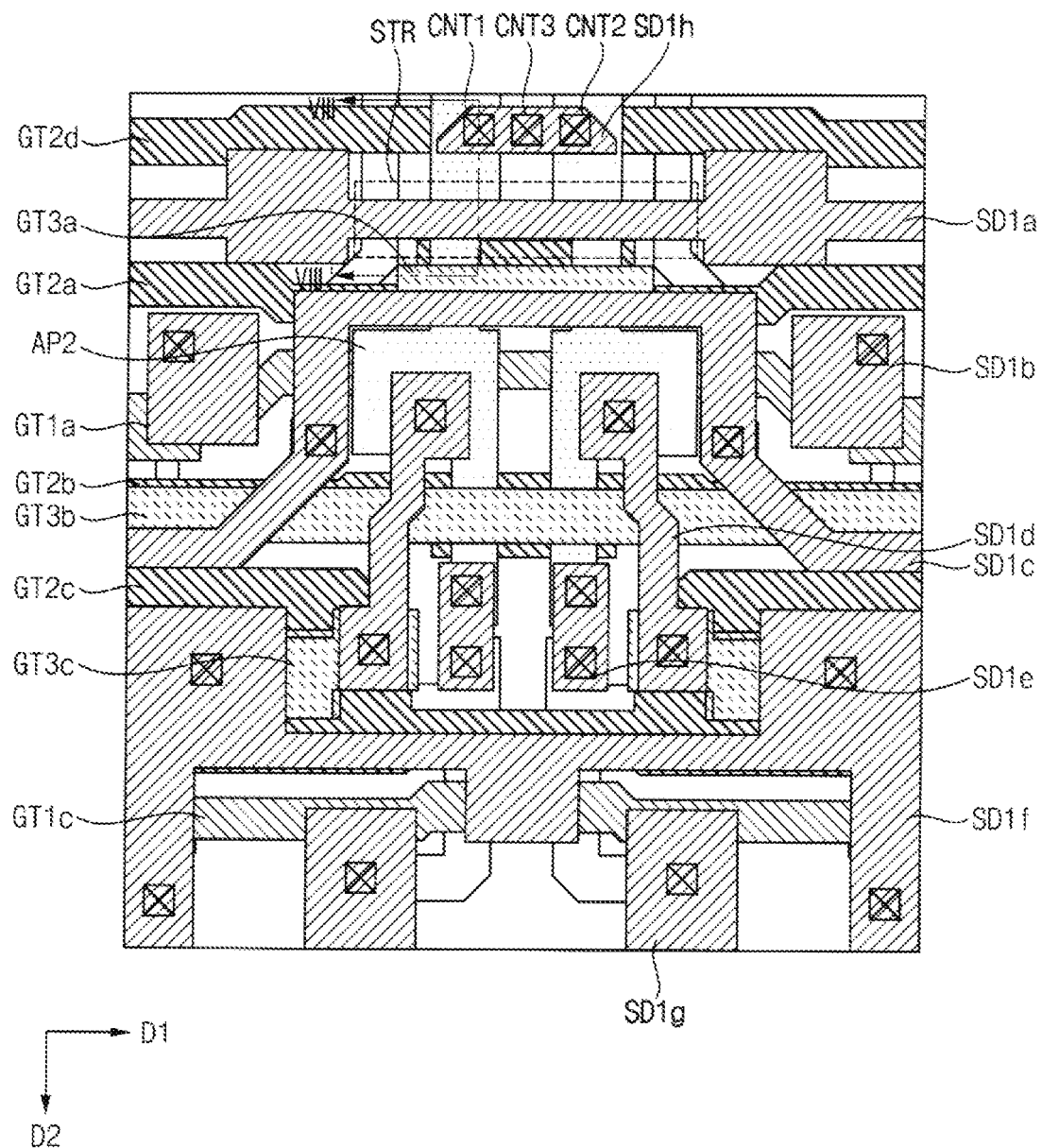

Unlike the horizontal transmission line SD1a of FIG. 12, the horizontal transmission line SD1a of FIG. 50 may include a straight line part STR. Since the horizontal transmission line SD1a of FIG. 50 includes the straight line part STR, a manufacturing process of the display device 14 may be easily performed. The straight line part STR of the horizontal transmission line SD1a may be spaced apart from the connection pattern SD1h in the second direction D2.

A first via insulating layer may be disposed on the second interlayer insulating layer to cover the fourth conductive pattern.

Figure 51:
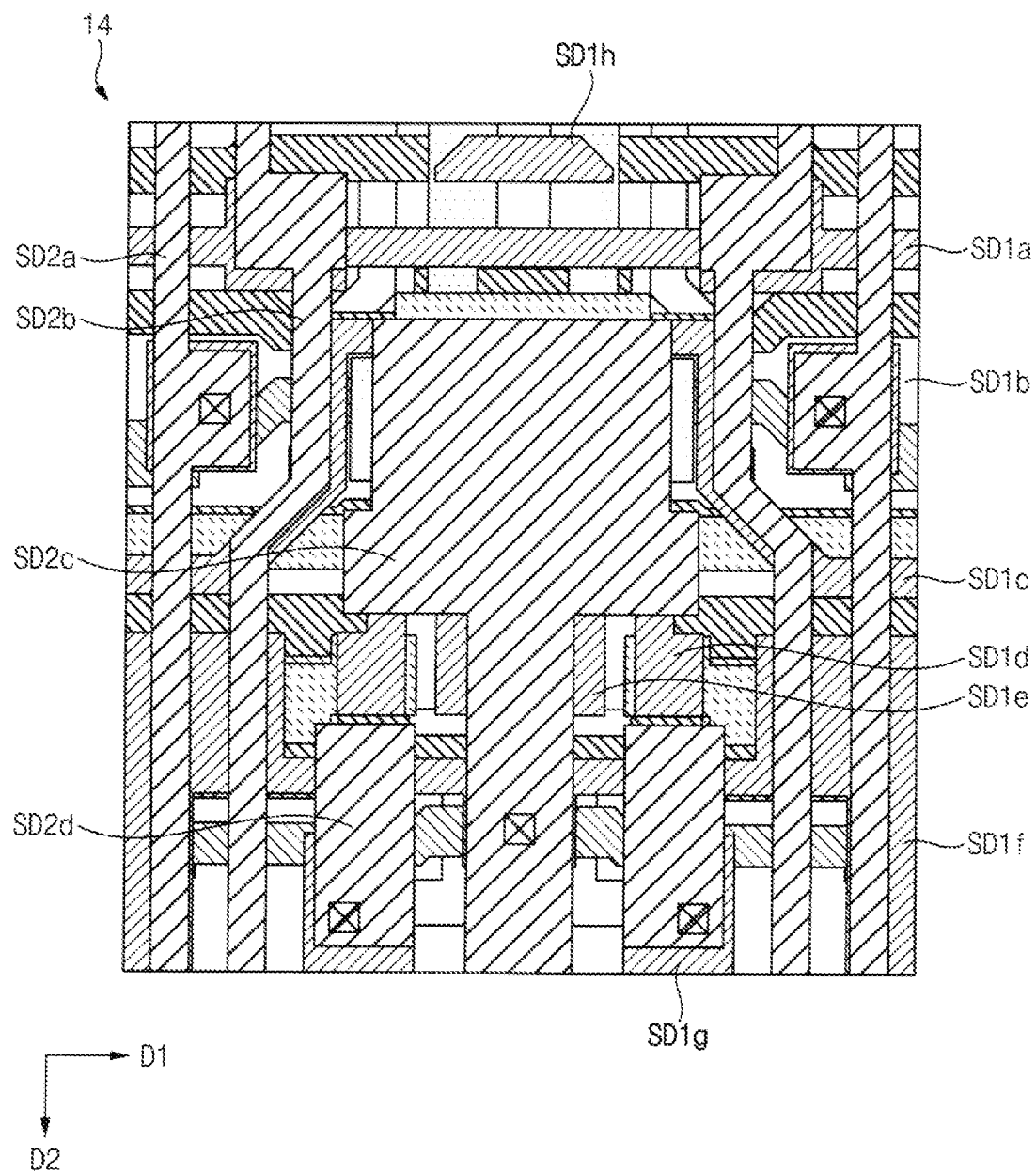

Referring to FIGS. 1, 4, and 51, a fifth conductive pattern may be disposed on the first via insulating layer. The fifth conductive pattern may include a data line SD2a, a vertical transmission line SD2b, a high power supply voltage line SD2c, and a seventh transmission pattern SD2d.

Figure 52:
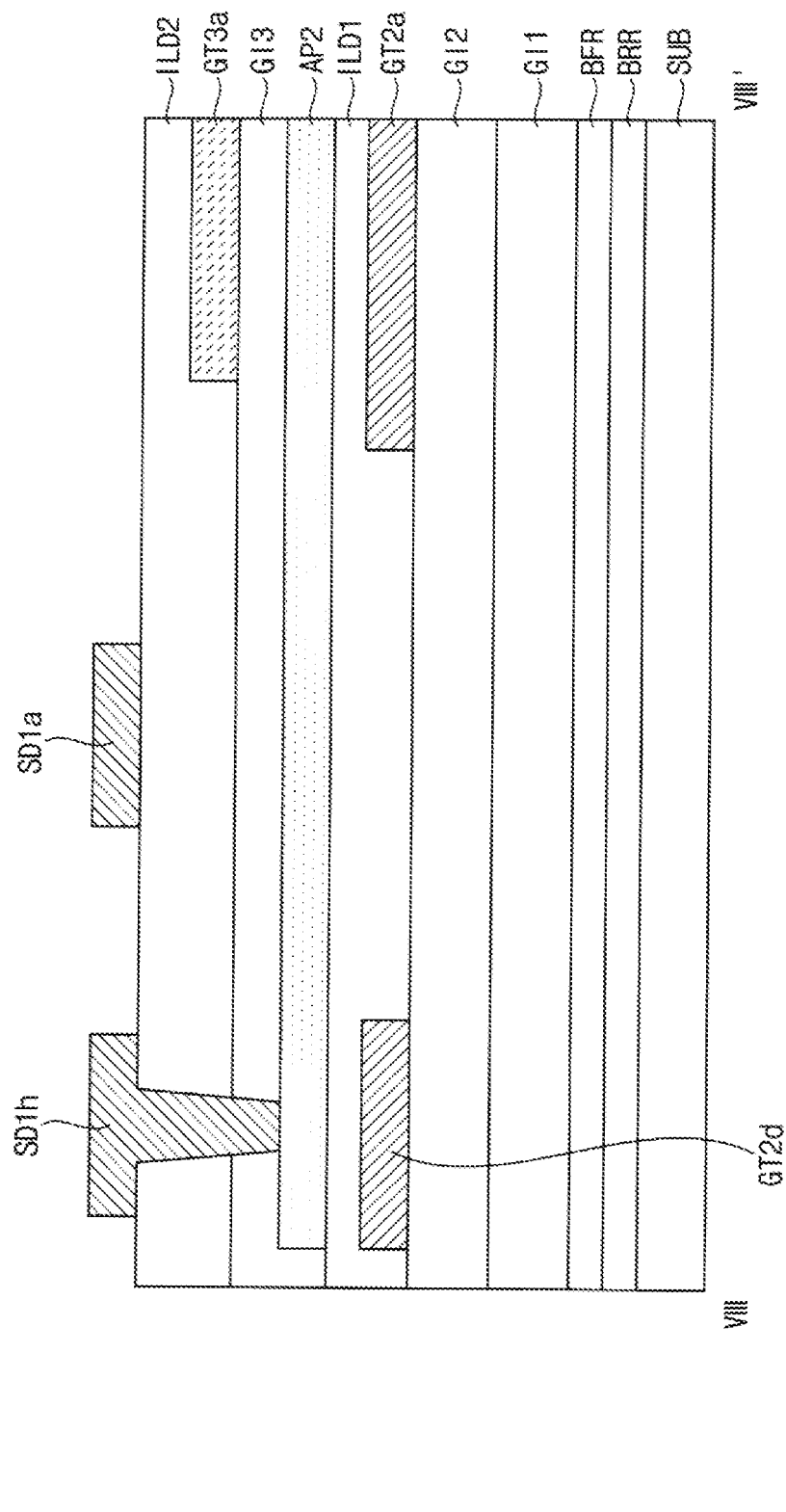
FIG. 52 is a sectional view taken along line VIII-VIII' of FIG. 50.

FIG. 52 is a sectional view taken along line VIII-VIII' of FIG. 50.

Referring to FIGS. 50 and 52, the connection pattern SD1h may overlap the is voltage line GT2d when viewed in a plan view. The connection pattern SD1h may be spaced apart from the horizontal transmission line SD1a in a third direction D3 that is opposite to the second direction D2.

In an embodiment, the connection pattern SD1h may include a first contact CNT1 and a second contact CNT2. The connection pattern SD1h may make contact with the second active pattern AP2 through each of the first contact CNT1 and the second contact CNT2. In an embodiment, the connection pattern SD1h may further include a third contact CNT3. The connection pattern SD1h may make contact with the voltage line GT2d through the third contact CNT3 (see FIG. 18).

In an embodiment, the connection pattern SD1h may be spaced apart from the horizontal transmission line SD1a, and may be electrically connected to the voltage line GT2d and the second active pattern AP2. The initialization voltage VINT may be provided sequentially through the voltage line GT2d, the connection pattern SD1h, and the second active pattern AP2. Therefore, the distribution of the contact resistance values may be reduced.

In an embodiment, since the horizontal transmission line SD1a includes the straight line part STR, a design resolution of the display device 14 may not be restricted.

The display device according to the embodiments may be applied to a display device included in a computer, a notebook, a mobile phone, a smartphone, a smart pad, a PMP, a PDA, an MP3 player, or the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be is apparent to a person of ordinary skill in the art.

What is claimed is:

1. A display device comprising:
   a first active pattern disposed on a substrate and including a first material;
   a second active pattern including a second material that is different from the first material of the first active pattern;
   a voltage line disposed under the second active pattern;
   a horizontal transmission line transmitting a data voltage disposed on the second active pattern, and extending in a first direction; and
   a connection pattern spaced apart from the horizontal transmission line, disposed on a same layer as the horizontal transmission line, and making electrical contact with the second active pattern and the voltage line,
   wherein the connection pattern is disposed above voltage line, and the connection pattern overlaps the voltage line with respect to a plan view of the display device.

2. The display device of claim 1, wherein the connection pattern makes contact with the second active pattern through each of a first contact and a second contact, and makes contact with the voltage line through a third contact, in which the third contact is disposed directly between the first contact and the second contact such that the first contact, the second contact, and the third contact form a straight line with respect to their respective positions on the substrate, with respect to a plan view of the display device.

3. The display device of claim 1, wherein the voltage line is configured to provide an initialization voltage to the second active pattern through the connection pattern.

4. The display device of claim 1, further comprising a gate line configured to transmit a gate signal,
   wherein the gate line and the connection pattern extend along a same horizontal direction with an entirety of the connection pattern closer to an entirety of the gate line than one side surface of the substrate, with respect to a plan view of the display device.

5. The display device of claim 4, wherein the connection pattern is spaced apart from the horizontal transmission line and the gate line when viewed in a plan view, and disposed between the horizontal transmission line and the gate line.

6. The display device of claim 4, further comprising:
a first conductive pattern disposed under the second active pattern;
a second conductive pattern disposed under the second active pattern and disposed on the first conductive pattern; and
a third conductive pattern disposed on the second active pattern.

7. The display device of claim 6, wherein the third conductive pattern includes a gate electrode overlapping the second active pattern,
wherein the second conductive pattern includes the gate line, and
wherein the gate line is electrically connected to the gate electrode, and extends in the first direction.

8. The display device of claim 6, wherein the second conductive pattern includes a gate electrode overlapping the second active pattern,
wherein the third conductive pattern includes the gate line, and
wherein the gate line is electrically connected to the gate electrode, and extends in the first direction.

9. The display device of claim 1, wherein the first active pattern includes a silicon semiconductor, and
wherein the second active pattern includes an oxide semiconductor.

10. A display device, comprising:
a first active pattern disposed on a substrate and including a first material;
a second active pattern including a second material that is different from the first material of the first active pattern;
a voltage line disposed under the second active pattern;
a horizontal transmission line disposed on the second active pattern, and extending in a first direction;
a connection pattern spaced apart from the horizontal transmission line, disposed on a same layer as the horizontal transmission line, and making electrical contact with the second active pattern and the voltage line;
a data line disposed on the horizontal transmission line, extending in a second direction different from the first direction, and configured to provide a data voltage to the first active pattern; and
a vertical transmission line disposed on a same layer as the data line, extending in the second direction, and configured to provide a data voltage to the horizontal transmission line,
wherein an entirety of the connection pattern is disposed above voltage line, with respect to a plan view of the display device.

11. The display device of claim 1, wherein the second active pattern further includes a first extension part and a second extension part extending in the first direction, in which the first extension part and the second extension part overlap the voltage line and the horizontal transmission line, and
the display device further comprises:
a first conductive pattern disposed under the second active pattern;
a second conductive pattern disposed under the second active pattern and disposed on the first conductive pattern; and
a third conductive pattern disposed on the second active pattern.

12. The display device of claim 11, wherein the third conductive pattern includes a gate electrode overlapping the second active pattern,
wherein the second conductive pattern includes a gate line configured to transmit a gate signal, and
wherein the gate line is electrically connected to the gate electrode, and extends in the first direction.

13. The display device of claim 11, wherein the second conductive pattern includes a gate electrode overlapping the second active pattern,
wherein the third conductive pattern includes a gate line configured to transmit a gate signal, and
wherein the gate line is electrically connected to the gate electrode, and extends in the first direction.

14. The display device of claim 11, wherein the first conductive pattern includes a gate electrode overlapping the second active pattern,
wherein the third conductive pattern includes a gate line configured to transmit a gate signal, and
wherein the gate line is electrically connected to the gate electrode, and extends in the first direction.

15. A display device comprising:
a first active pattern disposed on a substrate and including a first material;
a second active pattern including a second material that is different from the first material of the first active pattern;
a voltage line disposed under the second active pattern;
a connection pattern disposed on the second active pattern, and making electrical contact with the second active pattern and the voltage line; and
a horizontal transmission line transmitting a data voltage, and extending in a first direction, disposed on a same layer as the connection pattern, overlapping the second active pattern, and configured to transmit a data signal,
wherein the connection pattern is disposed above voltage line, and the connection pattern overlaps the voltage line with respect to a plan view of the display device.

16. The display device of claim 15, wherein the connection pattern makes contact with the second active pattern through each of a first contact and a second contact, and makes contact with the voltage line through a third contact, in which the third contact is disposed directly between the first contact and the second contact such that the first contact, the second contact, and the third contact form a straight line with respect to their respective positions on the substrate, with respect to a plan view of the display device.

17. The display device of claim 15, wherein the voltage line is configured to provide an initialization voltage to the second active pattern through the connection pattern.

18. The display device of claim 15, further comprising a gate line configured to transmit a gate signal,
wherein the gate line and the connection pattern extend along a same horizontal direction with an entirety of the connection pattern closer to an entirety of the gate line than one side surface of the substrate, with respect to a plan view of the display device.

19. The display device of claim 18, wherein the connection pattern is spaced apart from the horizontal transmission line and the gate line when viewed in a plan view, and
wherein the horizontal transmission line is disposed between the connection pattern and the gate line.

20. The display device of claim 15, wherein the first active pattern includes a silicon semiconductor, and
wherein the second active pattern includes an oxide semiconductor.

* * * * *